United States Patent
Cheng et al.

(10) Patent No.: US 10,777,692 B2
(45) Date of Patent: Sep. 15, 2020

(54) PHOTO-DETECTING APPARATUS AND PHOTO-DETECTING METHOD THEREOF

(71) Applicant: Artilux, Inc., Menlo Park, CA (US)

(72) Inventors: Szu-Lin Cheng, Hsinchu (TW); Chien-Yu Chen, Zhubei (TW); Shu-Lu Chen, Zhubei (TW); Yun-Chung Na, Hsinchu (TW); Ming-Jay Yang, Zhubei (TW); Han-Din Liu, Sunnyvale, CA (US); Che-Fu Liang, Zhubei (TW)

(73) Assignee: Artilux, Inc., Menlo Park, CA (US)

( * ) Notice: Subject to any disclaimer, the term of this patent is extended or adjusted under 35 U.S.C. 154(b) by 0 days.

(21) Appl. No.: 16/282,881

(22) Filed: Feb. 22, 2019

(65) Prior Publication Data
US 2019/0267498 A1    Aug. 29, 2019

Related U.S. Application Data

(60) Provisional application No. 62/776,995, filed on Dec. 7, 2018, provisional application No. 62/770,196, filed
(Continued)

(51) Int. Cl.
*H01L 31/02* (2006.01)
*H01L 31/0352* (2006.01)
(Continued)

(52) U.S. Cl.
CPC .... *H01L 31/02024* (2013.01); *H01L 31/0284* (2013.01); *H01L 31/035254* (2013.01);
(Continued)

(58) Field of Classification Search
CPC ......... H01L 31/0284; H01L 31/035254; H01L 27/15; H01L 31/103; H01L 31/108;
(Continued)

(56) References Cited

U.S. PATENT DOCUMENTS 3,621,466 A    11/1971  Toshio
4,341,918 A    7/1982   Evans, Jr. et al.
(Continued)

FOREIGN PATENT DOCUMENTS

EP    2224319    9/2010
EP    2330637    6/2011
(Continued)

OTHER PUBLICATIONS

PCT International Preliminary Report on Patentability in International Appln. No. PCT/US2018/020262, dated Sep. 3, 2019, 11 pages.
(Continued)

*Primary Examiner* — Fernando L Toledo
*Assistant Examiner* — Adam S Bowen
(74) *Attorney, Agent, or Firm* — Fish & Richardson P.C.

(57) ABSTRACT

A photo-detecting apparatus includes a semiconductor substrate. A first germanium-based light absorption material is supported by the semiconductor substrate and configured to absorb a first optical signal having a first wavelength greater than 800 nm. A first metal line is electrically coupled to a first region of the first germanium-based light absorption material. A second metal line is electrically coupled to a second region of the first germanium-based light absorption material. The first region is un-doped or doped with a first type of dopants. The second region is doped with a second type of dopants. The first metal line is configured to control an amount of a first type of photo-generated carriers generated inside the first germanium-based light absorption material to be collected by the second region.

19 Claims, 57 Drawing Sheets

Related U.S. Application Data on Nov. 21, 2018, provisional application No. 62/755,581, filed on Nov. 5, 2018, provisional application No. 62/752,285, filed on Oct. 29, 2018, provisional application No. 62/717,908, filed on Aug. 13, 2018, provisional application No. 62/698,263, filed on Jul. 15, 2018, provisional application No. 62/695,060, filed on Jul. 8, 2018, provisional application No. 62/695,058, filed on Jul. 8, 2018, provisional application No. 62/686,697, filed on Jun. 19, 2018, provisional application No. 62/682,254, filed on Jun. 8, 2018, provisional application No. 62/660,252, filed on Apr. 20, 2018, provisional application No. 62/654,454, filed on Apr. 8, 2018, provisional application No. 62/634,741, filed on Feb. 23, 2018.

(51) Int. Cl.
*H01L 31/028* (2006.01)
*H01L 31/18* (2006.01)
*H01L 31/107* (2006.01)
*H01L 31/0745* (2012.01)
*H01L 27/15* (2006.01)

(52) U.S. Cl.
CPC ...... *H01L 31/0745* (2013.01); *H01L 31/1075* (2013.01); *H01L 31/1812* (2013.01); *H01L 27/15* (2013.01)

(58) Field of Classification Search
CPC ....... H01L 31/035272; H01L 31/02024; H01L 31/0745; H01L 31/1075; H01L 31/1812
USPC ........................................................ 257/461
See application file for complete search history.

(56) References Cited

U.S. PATENT DOCUMENTS

| | | | |
|---|---|---|---|
| 4,604,527 A | 8/1986 | Chenevas-Paula et al. |
| 4,607,168 A | 8/1986 | Oritsuki et al. |
| 4,767,936 A | 8/1988 | Muakami et al. |
| 4,782,376 A | 11/1988 | Catalano |
| 4,926,231 A | 5/1990 | Hwang et al. |
| 5,453,611 A | 9/1995 | Oozu |
| 5,673,284 A | 9/1997 | Congdon et al. |
| 5,965,875 A | 10/1999 | Merrill |
| 6,384,462 B1 | 5/2002 | Pauchard et al. |
| 6,483,130 B1 | 11/2002 | Yang et al. |
| 6,894,267 B2 | 5/2005 | Kakinuma |
| 6,958,194 B1 | 10/2005 | Hopper |
| 7,090,133 B2 | 8/2006 | Zhu |
| 7,411,265 B2 | 8/2008 | Sekiguchi |
| 7,456,874 B1 | 11/2008 | Ono |
| 7,557,368 B2 | 7/2009 | Hegarty et al. |
| 7,629,661 B2 | 12/2009 | Rafferty et al. |
| 7,750,958 B1 | 7/2010 | Dierickx |
| 7,826,058 B1 | 11/2010 | Ulrich et al. |
| 7,884,310 B2 | 2/2011 | Buettgen |
| 7,961,301 B2 | 7/2011 | Earhart et al. |
| 7,972,885 B1 | 7/2011 | Dutta et al. |
| 8,129,813 B2 | 3/2012 | Herz |
| 8,183,510 B2 | 5/2012 | Venezia et al. |
| 8,405,823 B2 | 3/2013 | Pfaff |
| 8,824,779 B1 | 9/2014 | Smyth |
| 8,860,083 B1 | 10/2014 | Trezza |
| 8,975,668 B2 | 3/2015 | Costello et al. |
| 9,236,520 B2 | 1/2016 | Okhonin |
| 9,239,626 B1 | 1/2016 | Wu et al. |
| 9,472,588 B1 | 10/2016 | Liu et al. |
| 9,635,351 B2 | 4/2017 | Dielacher et al. |
| 9,748,429 B1 | 8/2017 | Davids et al. |
| 9,786,715 B2 | 10/2017 | Na et al. |
| 9,893,112 B2 | 2/2018 | Na et al. |
| 10,418,407 B2 | 9/2019 | Na et al. |
| 10,564,718 B2 | 2/2020 | Na et al. |
| 2003/0042500 A1 | 3/2003 | Rhodes et al. |
| 2003/0189159 A1 | 10/2003 | Lnoue |
| 2004/0121507 A1 | 6/2004 | Bude et al. |
| 2005/0077588 A1 | 4/2005 | Kasuga |
| 2005/0167709 A1 | 8/2005 | Augusto |
| 2005/0186759 A1 | 8/2005 | So |
| 2005/0233495 A1 | 10/2005 | Yang et al. |
| 2006/0110844 A1 | 5/2006 | Lee et al. |
| 2006/0289957 A1 | 12/2006 | Morse et al. |
| 2007/0164767 A1 | 7/2007 | Herz |
| 2007/0187796 A1 | 8/2007 | Rafferty et al. |
| 2007/0218578 A1 | 9/2007 | Lee et al. |
| 2007/0218580 A1 | 9/2007 | Hsu et al. |
| 2008/0121866 A1 | 5/2008 | Yuan et al. |
| 2008/0157254 A1 | 7/2008 | Kang |
| 2008/0181452 A1 | 7/2008 | Kwon et al. |
| 2008/0303058 A1 | 12/2008 | Mori et al. |
| 2009/0242935 A1 | 1/2009 | Fitzgerald |
| 2009/0050891 A1 | 2/2009 | Katoh |
| 2009/0152604 A1 | 6/2009 | Zhu et al. |
| 2009/0166684 A1 | 7/2009 | Yahav et al. |
| 2009/0200589 A1 | 8/2009 | Qian et al. |
| 2009/0237770 A1 | 9/2009 | Kim et al. |
| 2010/0078680 A1 | 4/2010 | Cheng et al. |
| 2010/0102409 A1 | 4/2010 | Hansson |
| 2010/0184246 A1 | 7/2010 | Sakai |
| 2011/0031578 A1 | 2/2011 | Miura et al. |
| 2011/0102553 A1 | 5/2011 | Corcoran et al. |
| 2011/0109880 A1 | 5/2011 | Nummela |
| 2011/0128430 A1 | 6/2011 | Fossum |
| 2011/0155893 A1 | 6/2011 | Endo et al. |
| 2011/0181591 A1 | 7/2011 | Benitez |
| 2011/0188780 A1 | 8/2011 | Wang et al. |
| 2011/0255071 A1 | 10/2011 | Van Der Tempel |
| 2011/0304696 A1 | 12/2011 | Centen et al. |
| 2012/0080726 A1 | 4/2012 | Sakano |
| 2012/0133922 A1* | 5/2012 | Pfaff ................... G01R 15/241 356/51 |
| 2012/0241769 A1 | 9/2012 | Katoh |
| 2012/0248514 A1 | 10/2012 | Korekado et al. |
| 2012/0287085 A1 | 11/2012 | Yuki et al. |
| 2012/0307232 A1 | 12/2012 | Mase |
| 2013/0026548 A1 | 1/2013 | McCarten |
| 2013/0062506 A1 | 3/2013 | Hu |
| 2013/0062522 A1 | 3/2013 | Jiang et al. |
| 2013/0062663 A1 | 3/2013 | Yuan et al. |
| 2013/0075607 A1 | 3/2013 | Bikumandla et al. |
| 2013/0119234 A1 | 5/2013 | Lee et al. |
| 2013/0128070 A1 | 5/2013 | Ishikawa |
| 2013/0154918 A1 | 6/2013 | Vaught et al. |
| 2013/0248865 A1 | 9/2013 | Toriyama et al. |
| 2013/0278631 A1 | 10/2013 | Border et al. |
| 2013/0280879 A1 | 10/2013 | Stecher et al. |
| 2013/0283213 A1 | 10/2013 | Guendelman et al. |
| 2013/0321271 A1 | 12/2013 | Bychkov |
| 2014/0002700 A1 | 1/2014 | Oishi |
| 2014/0043227 A1 | 2/2014 | Skogo et al. |
| 2014/0054444 A1 | 2/2014 | Sasaki |
| 2014/0054736 A1 | 2/2014 | Meade et al. |
| 2014/0111664 A1 | 4/2014 | Kumano |
| 2014/0117428 A1 | 5/2014 | Lee et al. |
| 2014/0159129 A1 | 6/2014 | Wang |
| 2014/0183549 A1 | 7/2014 | Park et al. |
| 2014/0184496 A1 | 7/2014 | Gribetz et al. |
| 2014/0206443 A1 | 7/2014 | Sharp et al. |
| 2014/0252437 A1 | 9/2014 | Ho et al. |
| 2014/0285404 A1 | 9/2014 | Takano et al. |
| 2014/0285420 A1 | 9/2014 | Kamimura et al. |
| 2014/0285641 A1 | 9/2014 | Kato et al. |
| 2014/0312206 A1 | 10/2014 | Okhonin et al. |
| 2014/0367740 A1 | 12/2014 | Morse et al. |
| 2014/0368613 A1 | 12/2014 | Krupka |
| 2015/0001664 A1 | 1/2015 | Van Der Tempel |
| 2015/0014661 A1 | 1/2015 | Joo et al. |
| 2015/0022435 A1 | 1/2015 | Luebke |
| 2015/0041761 A1 | 2/2015 | Cheng et al. |
| 2015/0043826 A1 | 2/2015 | Ishimitus |
| 2015/0092983 A1 | 4/2015 | Nguyen et al. |

(56) References Cited

U.S. PATENT DOCUMENTS

| | | | |
|---|---|---|---|
| 2015/0171146 A1 | 6/2015 | Ooki et al. | |
| 2015/0193938 A1 | 7/2015 | Freedman et al. | |
| 2015/0281618 A1 | 10/2015 | Saito | |
| 2015/0286340 A1 | 10/2015 | Send et al. | |
| 2015/0331508 A1 | 11/2015 | Nho et al. | |
| 2016/0027837 A1 | 1/2016 | Webster et al. | |
| 2016/0049476 A1 | 2/2016 | Rachmady et al. | |
| 2016/0141329 A1 | 5/2016 | Cheng et al. | |
| 2016/0150174 A1 | 5/2016 | Hynecek | |
| 2016/0155883 A1* | 6/2016 | Shi | H01L 31/024 257/186 |
| 2016/0161599 A1 | 6/2016 | Seliuchenko et al. | |
| 2016/0172393 A1 | 6/2016 | Kim et al. | |
| 2016/0187976 A1 | 6/2016 | Levesque et al. | |
| 2016/0190304 A1 | 6/2016 | Morin et al. | |
| 2016/0225922 A1 | 8/2016 | Akkaya et al. | |
| 2016/0239974 A1 | 8/2016 | Wang | |
| 2016/0284750 A1 | 9/2016 | Ionescu et al. | |
| 2016/0316159 A1 | 10/2016 | Yoneda | |
| 2016/0335475 A1 | 11/2016 | Krenzer et al. | |
| 2016/0372502 A1 | 12/2016 | Li et al. | |
| 2016/0381789 A1 | 12/2016 | Rogers et al. | |
| 2017/0040361 A1 | 2/2017 | Ikeda et al. | |
| 2017/0040362 A1 | 2/2017 | Na et al. | |
| 2017/0062508 A1* | 3/2017 | Na | H01L 27/1443 |
| 2017/0068319 A1 | 3/2017 | Viswanathan | |
| 2017/0075421 A1 | 3/2017 | Na et al. | |
| 2017/0084648 A1 | 3/2017 | Liu et al. | |
| 2017/0123233 A1 | 5/2017 | Sabovic | |
| 2017/0131389 A1 | 5/2017 | Na et al. | |
| 2017/0142362 A1 | 5/2017 | Liu | |
| 2017/0177075 A1 | 6/2017 | Zhang | |
| 2017/0196451 A1 | 7/2017 | Tian | |
| 2017/0221212 A1 | 8/2017 | Adam et al. | |
| 2017/0223339 A1 | 8/2017 | Kondo et al. | |
| 2017/0237911 A1 | 8/2017 | Won | |
| 2017/0244949 A1 | 8/2017 | Peterson | |
| 2018/0006081 A1 | 1/2018 | Na et al. | |
| 2018/0007255 A1 | 1/2018 | Tang | |
| 2018/0012916 A1 | 1/2018 | Na et al. | |
| 2018/0012917 A1 | 1/2018 | Na et al. | |
| 2018/0012918 A1 | 1/2018 | Na et al. | |
| 2018/0061883 A1 | 3/2018 | Na et al. | |
| 2018/0137610 A1 | 5/2018 | Aflaki | |
| 2018/0151732 A1 | 5/2018 | Mehandru | |
| 2018/0175084 A1 | 6/2018 | Na et al. | |
| 2018/0175095 A1 | 6/2018 | Sallin | |
| 2018/0188356 A1 | 7/2018 | Na et al. | |
| 2018/0190698 A1 | 7/2018 | Na et al. | |
| 2018/0190702 A1 | 7/2018 | Na et al. | |
| 2018/0233521 A1 | 8/2018 | Na et al. | |
| 2018/0233528 A1 | 8/2018 | Na et al. | |
| 2018/0247968 A1 | 8/2018 | Na et al. | |
| 2018/0261645 A1 | 9/2018 | Na et al. | |
| 2018/0269239 A1 | 9/2018 | Na et al. | |
| 2019/0011984 A1 | 1/2019 | Na et al. | |
| 2019/0033432 A1 | 1/2019 | Na et al. | |
| 2019/0049564 A1 | 2/2019 | Na et al. | |
| 2019/0103435 A1 | 4/2019 | Na et al. | |
| 2019/0081095 A1 | 5/2019 | Hanzawa et al. | |

FOREIGN PATENT DOCUMENTS

| | | |
|---|---|---|
| JP | H0548139 | 2/1993 |
| JP | 2000-133791 | 5/2000 |
| JP | 2003-225207 | 8/2003 |
| JP | 2004-103964 | 4/2004 |
| JP | 2004-309701 | 11/2004 |
| JP | 2005-123674 | 5/2005 |
| JP | 2009-025225 | 2/2009 |
| JP | 2009-047658 | 3/2009 |
| JP | 2011-66097 | 3/2011 |
| JP | 2011-128024 | 6/2011 |
| JP | 2012-146920 | 8/2012 |
| JP | 2015-194838 | 11/2015 |
| WO | WO 2005/036647 | 4/2005 |
| WO | WO 2013/104718 | 7/2013 |
| WO | WO 2014/085789 | 6/2014 |
| WO | WO 2014/197226 | 12/2014 |
| WO | WO 2015/104307 | 7/2015 |
| WO | WO 2016/038416 | 3/2016 |
| WO | WO 2016/077791 | 5/2016 |
| WO | WO2016/187566 | 11/2016 |
| WO | WO 2016/208215 | 12/2016 |
| WO | WO 2017/015580 | 1/2017 |
| WO | WO 2017/018477 | 2/2017 |
| WO | WO 2017/024121 | 2/2017 |
| WO | WO 2017/035447 | 3/2017 |

OTHER PUBLICATIONS

EP Search Report in European Application No. EP18189000, dated Jan. 9, 2019, 17 pages.

Extended European Search Report in European Application No. 16828622, dated Sep. 7, 2018, 6 pages.

Extended European Search Report in European Application No. 16833863, dated Jul. 18, 2018, 6 pages.

Extended European Search Report in European Application No. 168630325, dated Aug. 23, 2018, 5 pages.

Extended European Search Report in European Application No. 181602004, dated Jul. 18, 2018, 6 pages.

Extended European Search Report in European Application No. 181602053, dated Jul. 18, 2018, 6 pages.

Extended European Search Report in European Application No. 181760315, dated Aug. 27, 2018, 6 pages.

International Preliminary Report on Patentability in International Application No. PCT/US2016/043609, dated Jan. 23, 2018, 12 pages.

International Preliminary Report on Patentability in International Application No. PCT/US2016/045526, dated Feb. 6, 2018, 10 pages.

International Preliminary Report on Patentability in International Application No. PCT/US2016/048915, dated Feb. 27, 2018, 8 pages.

International Preliminary Report on Patentability in International Application No. PCT/US2016/060493, dated May 8, 2018, 11 pages.

International Preliminary Report on Patentability in International Application No. PCT/US2016/066073, dated Jul. 12, 2018, 7 pages.

International Search Report and Written Opinion in International Application No. PCT/US2016/043609, dated Nov. 1, 2016, 21 pages.

International Search Report and Written Opinion in International Application No. PCT/US2016/045526, dated Nov. 22, 2016, 15 pages.

International Search Report and Written Opinion in International Application No. PCT/US2016/048915, dated Nov. 22, 2016, 17 pages.

International Search Report and Written Opinion in International Application No. PCT/US2016/060493, dated Jan. 10, 2017, 20 pages.

International Search Report and Written Opinion in International Application No. PCT/US2016/066073, dated May 6, 2018, 16 pages.

International Search Report and Written Opinion in International Application No. PCT/US2018/020262, dated Jun. 6, 2018, 14 pages.

International Search Report and Written Opinion in International Application No. PCT/US2018/025949, dated Jul. 10, 2018, 14 pages.

International Search Report and Written Opinion in International Application No. PCT/US2018/027369, dated Jul. 31, 2018, 14 pages.

Alsam et al: "What the Eye Did Not See—A Fusion Approach to Image Coding", Advances in Visual Computing, dated Jan. 1, 2012, pp. 199-208 (with partial english translation).

(56) References Cited

OTHER PUBLICATIONS

Bamji et al., "A 0.13 µm CMOS System-on-Chip for a 512×424 Time-of-Flight Image Sensor With Multi-Frequency Photo-Demodulation up to 130 MHz and 2 GS/s ADC," IEEE J. Solid-State Circuits, Jan. 2015, 50(1):303-319.

Bianco et al., "A Comparative Analysis between Active and Passive Techniques for Underwater 3D Reconstruction of Close-Range Objects," Sensors, Aug. 20, 2013, 13(8):11007-11031.

Chen et al., "Self-Aligned Microbonded Germanium Metal-Semiconductor-Metal Photodetectors Butt-Coupled to Si Waveguides," IEEE J. Sel. Top. Quant. Electron. Nov. 2014, 20(6):3800605, 5 pages.

Dalla Betta et al., "Design and Characterization of Current-Assisted Photonic Demodulators in 0.18-µm CMOS Technology," IEEE Trans. Electron. Dev., Jun. 2011, 58(6):1702-1709.

Fang et al., "An Integration PIN/MISS OEIC for High Current Photoreceiver Applications," IEEE Transactions on Electron Devices, Jan. 1997, 44(1):34-38.

Feng et al., "Vertical p-i-n germanium photodetector with high external responsivity integrated with large core Si waveguides," Optics Express, Jan. 4, 2010, 18(1):96-101.

Foix et al., "Lock-in Time-of-Flight (ToF) Cameras: A Survey," IEEE Sensors J., Sep. 2011, 11(9):1917-1926.

Fossum et al., "A Review of the Pinned Photodiode for CCD and CMOS Image Sensors," IEEE J. Electron Devices Soc. May 1, 2014, 2(3):33-43.

Hutchinson et al., "High-Resolution Aliasing-Free Optical Beam Steering," Optica, vol. 3, No. 8, dated Aug. 5, 2016, 4 pages.

Geng, "Structured-light 3D surface imaging: a tutorial," Advances in Optics and Photonics, Jun. 30, 2011, 3(2):128-160.

Gulden et al., "Novel optical distance sensor based on MSM technology." IEEE Sensors Journal. Oct. 2004, 4(5):612-8.

Joo et al., "High-sensitivity 10 Gbps Ge-on-Si photoreceiver operating at λ~1.55 µm," Optics Express, Aug. 2, 2010, 18(16):16474-16479.

Kato et al., "320×240 Back-Illuminated 10-µm CAPD Pixels for High-Speed Modulation Time-of-Flight CMOS Image Sensor," IEEE J. Solid-State Circuits Apr. 2018, 53(4):1071-1078.

Kawahito et al., "A CMOS Time-of-Flight Range Image Sensor With Gates-on-Field-Oxide Structure," IEEE Sensors J. Dec. 2007, 7(12):1578-1586.

Kim et al., "A Three-Dimensional Time-of-Flight CMOS Image Sensor With Pinned-Photodiode Pixel Structure," IEEE Electron. Dev. Lett., Nov. 2010, 31(11):1272-1274.

Koester et al., "Ge-on-SOI-Detector/Si-CMOS-Amplifier Receivers for High-Performance Optical-Communication Applications," J. Lightw. Technol., Jan. 2001, 25(1):46-57.

Lange et al., "Solid-State Time-of-Flight Range Camera," IEEE J. Quant. Electron. Mar. 2001, 37(3):390-397.

Li et al., "High-Bandwidth and High-Responsivity Top-Illuminated Germanium Photodiodes for Optical Interconnection," IEEE Trans. Electron Dev., Mar. 2013, 60(3):1183-1187.

Lischke et al., "High bandwidth, high responsivity waveguide-coupled germanium p-i-n photodiode," Optics Express, Oct. 19, 2015, 23(21):27213-27220.

Liu et al., "Backside-incidence critically coupled Ge on SOI photodetector," Proc. SPIE 10100, Optical Components and Materials, Feb. 16, 2017, XIV, 101001X, 6 pages.

Michel et al., "High-performance Ge-on-Si photodetectors," Nature Photon. Jul. 30, 2010, 4:527-534.

Morse et al., "Performance of Ge-on-Si p-i-n Photodetectors for Standard Receiver Modules," IEEE Photon. Technol. Lett., Dec. 1, 2006, 18(23):2442-2444.

Perenzoni et al., "Compact SPAD-Based Pixel Architectures for Time-Resolved Image Sensors," Sensors, May 23, 2016, 16(5):745, 12 pages.

Place et al., "Rad tolerant CMOS image sensor based on hole collection 4T pixel pinned photodiode." IEEE Transactions on Nuclear Science. Dec. 6, 2012, 59(6):2888-93.

Rafferty et a., "Monolithic germanium SWIR imaging array," 2008 IEEE Conference on Technologies for Homeland Security, Waltham, MA, May 12, 2008, p. 577-582.

Ringbeck et al., "Multidimensional measurement by using 3-D PMD sensors," Adv. Radio Sci., Jan. 1, 2007, 5:135-146.

Tseng et al., "High-performance silicon-on-insulator grating coupler with completely vertical emission," Sep. 21, 2015, 23(19):24433-9.

Tseng et al., "A self-assembled microbonded germanium/silicon heterojunction photodiode for 25 Gb/s high-speed optical interconnects," Sci. Rep. Nov. 15, 2013, 3:3225, 6 pages.

Van Der Tempel et al., "Lock-in Pixel Using a Current-Assisted Photonic Demodulator Implemented in 0.6 µm Standard Complementary Metal-Oxide-Semiconductor," Jpn. J. Appl. Phys., Apr. 24, 2017 46(4B):2377-2380.

Van Nieuwenhove et al., "Photonic Demodulator With Sensitivity Control," IEEE Sensors J. Mar. 2007, 7(3):317-318.

Wu et al., "A critically coupled Germanium photodetector under vertical illumination," Opt. Express, Dec. 31, 2012, 20(28):29338-29346.

Yin et al., "31GHz Ge n-i-p waveguide photodetectors on Silicon-on-Insulator substrate," Optics Express Oct. 17, 2007, 15(21):13965-13971.

Yokogawa et al., "IR sensitivity enhancement of CMOS Image Sensor with diffractive light trapping pixels," Sci. Rep. Jun. 19, 2017, 7(1):3832, 9 pages.

Zanuttigh et al: "ToF Depth Camera Components", Time-of-Flight and Structured Light Depth Cameras: Technology and Applications, dated May 24, 2016, pp. 31-33.

Extended European Search Report in European Application No. 16840192.5, dated Mar. 19, 2019, 7 pages.

Extended European Search Report in European Application No. 18189000.5. dated Apr. 2, 2019, 14 pages.

PCT International Search Report and Written Opinion in International Appln. PCT/US19/19167, dated May 14, 2019, 15 pages.

Ramirez et al. "Recent progress on the quantum-dot avalanche photodiode," 22nd Annual Meeting of the IEEE Lasers and Electro-optics Society, Oct. 4, 2009, 2 pages.

\* cited by examiner

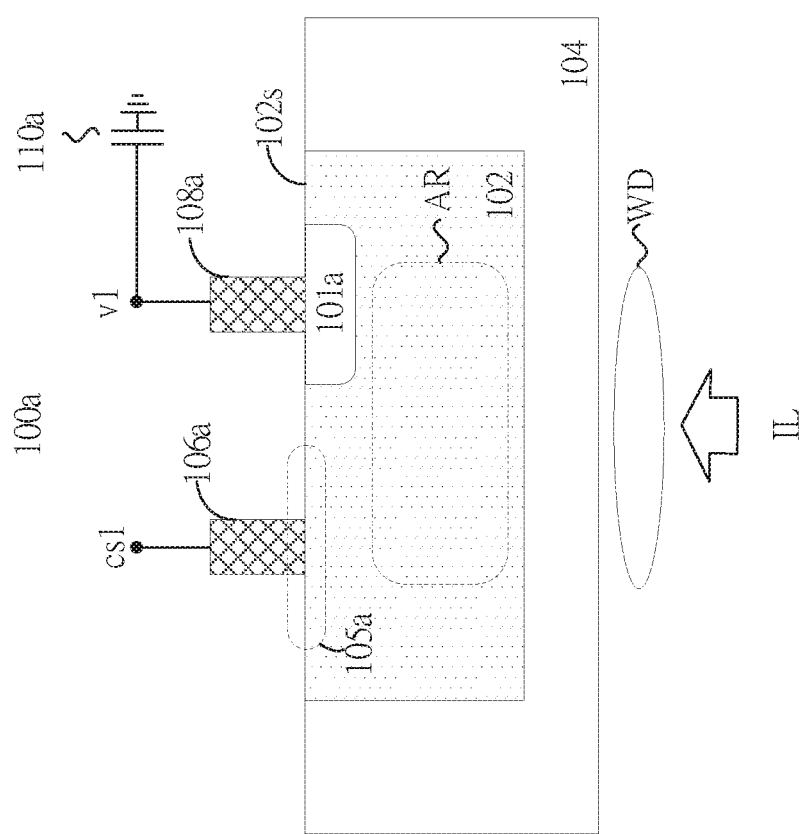

and PHOTO-DETECTING APPARATUS AND
PHOTO-DETECTING METHOD THEREOF

CROSS-REFERENCE TO RELATED APPLICATIONS

This patent application claims the benefit of U.S. Provisional Patent Application No. 62/634,741, filed Feb. 23, 2018, U.S. Provisional Patent Application No. 62/654,454, filed Apr. 8, 2018, U.S. Provisional Patent Application No. 62/660,252, filed Apr. 20, 2018, U.S. Provisional Patent Application No. 62/698,263, filed Jul. 15, 2018, U.S. Provisional Patent Application No. 62/682,254, filed Jun. 8, 2018, U.S. Provisional Patent Application No. 62/686,697, filed Jun. 19, 2018, U.S. Provisional Patent Application No. 62/695,060, filed Jul. 8, 2018, U.S. Provisional Patent Application No. 62/695,058, filed Jul. 8, 2018, U.S. Provisional Patent Application No. 62/752,285, filed Oct. 29, 2018, U.S. Provisional Patent Application No. 62/717,908, filed Aug. 13, 2018, U.S. Provisional Patent Application No. 62/755,581, filed Nov. 5, 2018, U.S. Provisional Patent Application No. 62/770,196, filed Nov. 21, 2018, and U.S. Provisional Patent Application No. 62/776,995, filed Dec. 7, 2018, which are incorporated by reference herein.

BACKGROUND

Photodetectors may be used to detect optical signals and convert the optical signals to electrical signals that may be further processed by another circuitry. Photodetectors may be used in consumer electronics products, image sensors, data communications, time-of-flight (TOF) ranging or imaging sensors, medical devices, and many other suitable applications. However, when photodetectors are applied to these applications in a single or array configuration, the leakage current, dark current, electrical/optical cross-talk, and power consumption can degrade performance.

SUMMARY

According to an embodiment of the present disclosure, a photo-detecting apparatus is provided. The photo-detecting apparatus includes a semiconductor substrate. A first germanium-based light absorption material is supported by the semiconductor substrate and configured to absorb a first optical signal having a first wavelength greater than 800 nm. A first metal line is electrically coupled to a first region of the first germanium-based light absorption material. A second metal line is electrically coupled to a second region of the first germanium-based light absorption material. The first region is un-doped or doped with a first type of dopants. The second region is doped with a second type of dopants. The first metal line is configured to control an amount of a first type of photo-generated carriers generated inside the first germanium-based light absorption material to be collected by the second region.

According to an embodiment of the present disclosure, a photo-detecting method is provided. The photo-detecting method includes transmitting an optical signal modulated by a first modulation signal, wherein the optical signal is modulated by the first modulation signal with one or multiple predetermined phase(s) for multiple time frames. The reflected optical signal is received by a photodetector. The reflected optical signal is demodulated by one or multiple demodulation signal(s), wherein the one or multiple demodulation signal(s) is/are the signal(s) with one or multiple predetermined phase(s) for multiple time frames. At least one voltage signal is output on a capacitor.

Among other advantages and benefits of the embodiments disclosed herein, the embodiments provide a photo-detecting apparatus capable of absorbing a least but limited to a near-infrared (NIR) light or a short-wave infrared (SWIR) light efficiently. In some embodiments, a photo-detecting apparatus provides a high demodulation contrast, low leakage current, low dark current, low power consumption, low electrical/optical cross-talk and/or architecture for chip size miniaturization. In some embodiments, a photo-detecting apparatus is capable of processing the incident optical signal with multiple wavelengths, including different modulation schemes and/or time-division functions. Moreover, the photo-detecting apparatus can be used in time-of-flight (ToF) applications, which may operate at longer wavelengths compared to visible wavelengths (e.g., NIR and SWIR ranges) compared to visible wavelengths. A device/material implementer can design/fabricate a 100% germanium or an alloy (e.g., GeSi) with a predetermined percentage (e.g., more than 80% Ge) of germanium, either intrinsic or extrinsic, as a light absorption material to absorb the light at the aforementioned wavelengths.

These and other objectives of the present disclosure will become obvious to those of ordinary skill in the art after reading the following detailed description of the alternative embodiments that are illustrated in the various figures and drawings.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein:

FIGS. 1A-1F illustrate cross-sectional views of a photo-detecting apparatus, according to some embodiments.

DETAILED DESCRIPTION

Figure 1B:
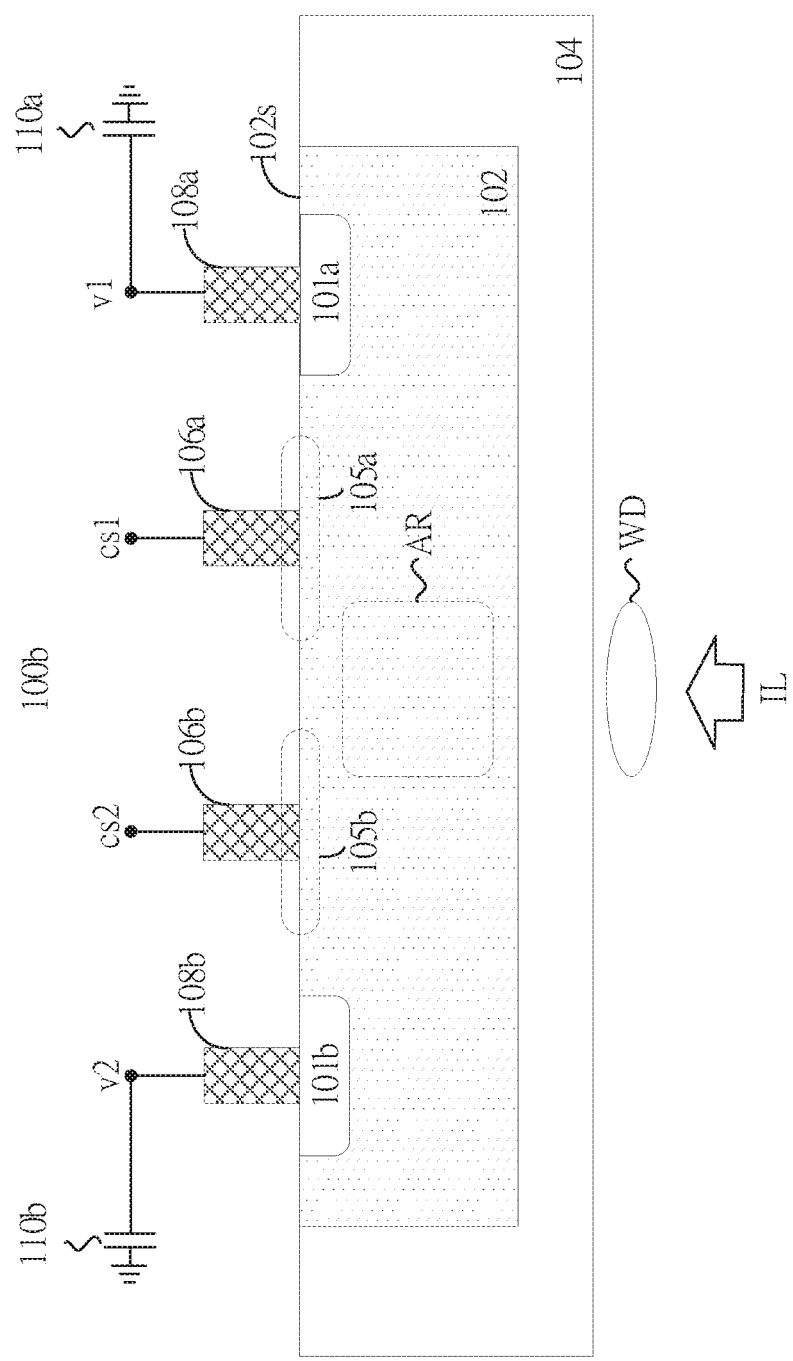

FIG. 1A illustrates a cross-sectional view of a photo-detecting apparatus, according to some embodiments. The photo-detecting apparatus 100a includes a germanium-based light absorption material 102 supported by the semiconductor substrate 104. In one implementation, the semiconductor substrate 104 is made by silicon or silicon-germanium or germanium or III-V compounds. The germanium-based light absorption material 102 herein refers to intrinsic germanium (100% germanium) or an alloy of elements including germanium, e.g., silicon-germanium alloy, ranging from 1% to 99% Ge concentration. In some implementations, the germanium-based light absorption material 102 may be grown using a blanket epitaxy, a selective epitaxy, or other applicable techniques. The germanium-based light absorption material 102 is embedded in the semiconductor substrate 104 in FIG. 1A, and in alternative embodiments the germanium-based light absorption material 102 may be partially embedded in or may be standing on the semiconductor substrate 104.

The photo-detecting apparatus 100a includes a control metal line 106a and a readout metal line 108a. The control metal line 106a and the readout metal line 108a are both electrically coupled to the surface 102s of the germanium-based light absorption material 102. In this embodiment, the control metal line 106a is electrically coupled to an un-doped region 105a on the surface 102s, where the un-doped region 105a has no dopants. The readout metal line 108a is electrically coupled to a doped region 101a on the surface 102s, where the doped region 101a has dopants.

It is noted that the germanium-based light absorption material 102 can be formed as intrinsic or extrinsic (e.g., lightly P-type or lightly N-type). Due to the defect characteristics of the germanium material, even if there is no additional doping process introduced, the germanium-based light absorption material 102 may still be lightly P-type. Thus, the un-doped region 105a may also be lightly P-type. The doped region 101a may be doped with P-type dopants or N-type dopants, depending on the type of photo-carries (i.e. holes or electrons) to be collected. In some implementations, the doped region 101a could be doped by thermal-diffusion, ion-implantation, or any other doping process.

The control metal line 106a is controlled by a control signal cs1 for controlling the moving direction of the electrons or holes generated by the absorbed photons. Assume that the doped region 101a is N-type and the control signal cs1 is at logic 1. An electric field is generated from the control metal line 106a to the germanium-based light absorption material 102. The electrons will move toward the control metal line 106a and be collected by the doped region 101a. On the contrary, if the doped region 101a is P-type, the holes will be collected instead. Alternatively, assume that the doped region 101a is N-type when the control signal cs1 is at logic 0, a different electric field is generated from the control metal line 106a to the germanium-based light absorption material 102. The electrons will not move toward the control metal line 106a and so cannot be collected by the doped region 101a. On the contrary, if the doped region 101a is P-type, the holes will not be collected instead.

Using the structure illustrated in FIG. 1A, the optical signal IL reflected by a target object (not shown in FIG. 1A) and incoming through the optical window WD can be absorbed by the germanium-based light absorption material 102, and generate electron-hole pairs such that the electrons or the holes (depending on whether the doped region 101a is N-type and P-type) are moving toward and being stored in the capacitor 110a according to the assertion of control signal cs1. The absorbed region AR is a virtual area receiving the optical signal IL incoming through the optical window WD. Due to a distance existing between the photo-detecting apparatus 100a and the target object (not shown in FIG. 1A), the optical signal IL has a phase delay with respect to the transmitted light transmitted by a transmitter (not shown in FIG. 1A). When the transmitted light is modulated by a modulation signal and the electron-hole pairs are demodulated through the control metal line 106a by a demodulation signal, the electrons or the holes stored in the capacitor 110a will be varied according to the distance. Therefore, the photo-detecting apparatus 100a can obtain the distance information based on the voltage v1 on the capacitor 110a.

The embodiments of FIG. 1A are a one-tap structure because they only use one control metal line 106a and one readout metal line 108a to obtain the distance information. The disclosed embodiments may also use two or more control lines or readout lines, and varieties of implantations to obtain the distance information, which will be described in detail hereinafter.

FIG. 1B illustrates a cross-sectional view of a photo-detecting apparatus, according to some embodiments. Compared to the embodiment of FIG. 1A, the photo-detecting apparatus 100b in FIG. 1B uses two control metal lines 106a, 106b to control the movement of the electrons or holes generated by the absorbed photons in the germanium-based light absorption material 102. Such a structure is referred as a two-tap structure. The photo-detecting apparatus 100b includes control metal lines 106a, 106b and readout metal lines 108a, 108b. The control metal lines 106a, 106b and the readout metal lines 108a, 108b are electrically coupled to the surface 102s of the germanium-based light absorption material 102. In this embodiment, the control metal lines 106a, 106b are respectively electrically coupled to the un-doped regions 105a, 105b on the surface 102s, where the un-doped regions 105a, 105c are the areas without dopants; and the readout metal line 108a, 108b are respectively electrically coupled to doped regions 101a, 101b on the surface 102s, where the doped regions 101a, 101b are the areas with dopant. The doped regions 101a, 101b may be doped with P-type dopants or N-type dopants.

The control metal lines 106a, 106b are respectively controlled by the control signals cs1, cs2 for controlling the moving direction of the electrons or holes generated by the absorbed photons. In some implementations, the control signals cs1 and cs2 are differential voltage signals. In some implementations, one of the control signals cs1 and cs2 is a constant voltage signal (e.g., 0.5 v) and the other control signal is a time-varying voltage signal (e.g., sinusoid signal, clock signal or pulse signal operated between 0V and 1V).

Assume that the doped regions 101a, 101b are N-type and the control signals cs1, cs2 are clock signals with 180-degree phase different to each other. When the control signal cs1 is at logic 1 and the control signal cs2 is at logic 0, the photo-detecting apparatus 100b generates an electric field from the control metal line 106a to the germanium-based light absorption material 102, and the electrons will move toward the control metal line 106a and then be collected by the doped regions 101a. Similarly, when the control signal cs1 is at logic 0 and the control signal cs2 is at logic 1, the photo-detecting apparatus 100b generates an electric field from the control metal line 106b to the germanium-based light absorption material 102, and the electrons will move toward the control metal line 106b and then be collected by the doped region 101b. On the contrary, if the doped regions 101a and 101b are P-type, the holes will be collected instead.

In accordance with this two-tap structure, the optical signal IL reflected from a target object (not shown in FIG. 1B) can be absorbed by the germanium-based light absorption material 102 and generates electron-hole pairs such that the electrons or the holes (depending on the doped region 101a is N-type and P-type) move towards and are stored in the capacitor 110a or capacitor 110b, according to the assertions of control signal cs1 and control signal cs2. Due to a distance existing between the photo-detecting apparatus 100b and the target object (not shown in FIG. 1B), the optical signal IL has a phase delay with respect to the transmitted light transmitted by a transmitter (not shown in FIG. 1B). When the transmitted light is modulated by a modulation signal and the electron-hole pairs are demodulated through the control metal lines 106a and 106b by the demodulation signals, the electrons or the holes stored in the capacitor 110a and capacitor 110b will be varied according to the distance. Therefore, the photo-detecting apparatus 100b can obtain the distance information based on the voltage v1 on the capacitor 110a and the voltage v2 on the capacitor 110b. According to one embodiment, the distance information can be derived based on calculations with voltage v1 and voltage v2 as input variables. For one example, in a pulse time-of-flight configuration, voltage ratios related to voltage v1 and voltage v2 are used as input variables. In another example, in a continues-wave time-of-flight configuration, in-phase and quadrature voltages related voltage v1 and voltage v2 are used as input variables.

The control metal line 106a in FIG. 1A and control metal lines 106a, 106b in FIG. 1B are electrically coupled to the un-doped regions of the germanium-based light absorption material 102. In other embodiments, as described below, certain structures and the control metal lines 106a, 106b are electrically coupled to doped regions.

Figure 1C:
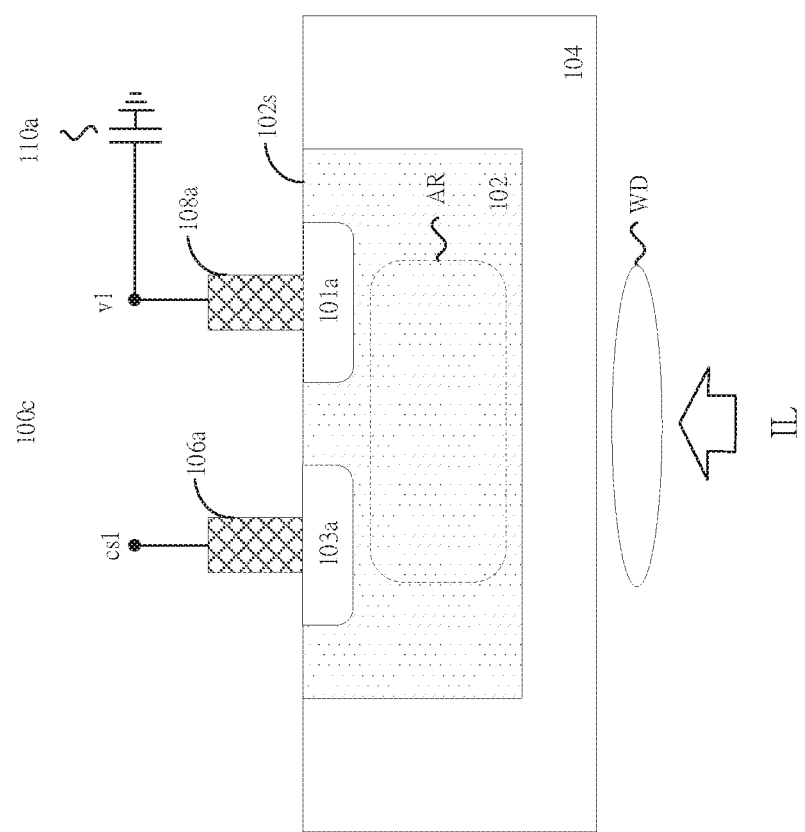

FIG. 1C illustrates a cross-sectional view of a photo-detecting apparatus, according to some embodiments. Similar to FIG. 1A, the photo-detecting apparatus 100c includes a control metal line 106a and a readout metal line 108a. The control metal line 106a and the readout metal line 108a are both electrically coupled to the surface 102s of the germanium-based light absorption material 102. In this embodiment, the control metal line 106a is electrically coupled to a doped region 103a on the surface 102s, where the doped region 103a is an area with dopants; and the readout metal line 108 is electrically coupled to a doped region 101a on the surface 102s, where the doped region 101a is also an area with dopants. In this embodiment, the region 101a and region 103a are doped with dopants of different types. For example, if the doped region 101a is doped with N-type dopants, the region 103a will be doped with P-type dopants, and vice versa.

The operation of photo-detecting apparatus 100c is similar to the embodiment of FIG. 1A. The control metal line 106a is used to control the moving direction of the electrons or holes generated by the absorbed photons according to the control signal cs1 to make the electrons or holes being collected by doped region 110a. By controlling the control signal cs1 and reading the voltage v1 on the capacitor 110a, the photo-detecting apparatus 100c can obtain a distance information between the photo-detecting apparatus 100c and the target object (not shown in FIG. 1C).

Figure 1D:
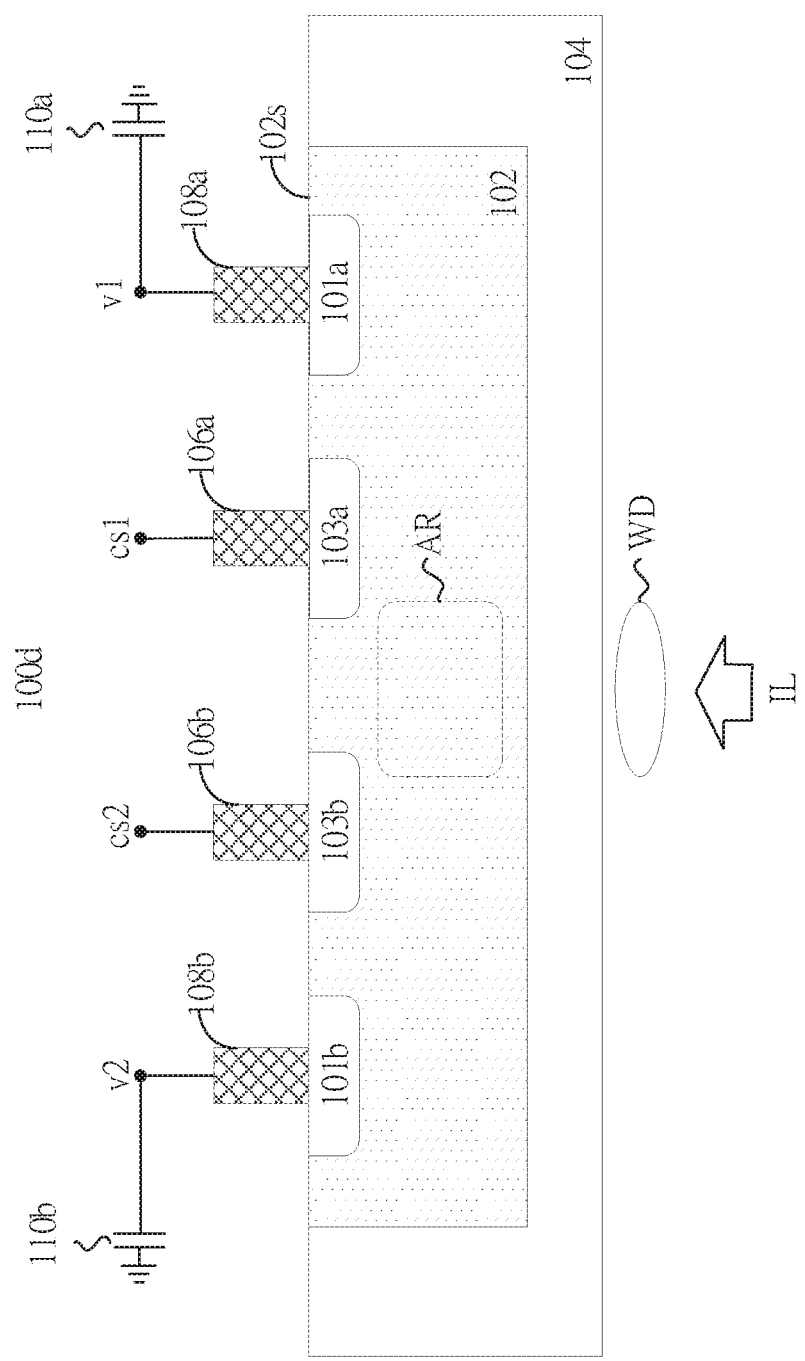

FIG. 1D illustrates a cross-sectional view of a photo-detecting apparatus, according to some embodiments. The photo-detecting apparatus 100b includes control metal lines 106a, 106b and readout metal lines 108a, 108b. The control metal lines 106a, 106b and the readout metal lines 108a, 108b are electrically coupled to the surface 102s of the germanium-based light absorption material 102. In this embodiment, the control metal lines 106a, 106b are respectively electrically coupled to the doped regions 103a, 103b on the surface 102s, where the doped regions 103a, 103b are areas with dopants. The readout metal line 108a, 108b are respectively electrically coupled to the doped regions 101a, 101b on the surface 102s, where the doped regions 101a, 101b are also areas with dopants. The regions 101a, 101b, 103a, 103b may be doped with P-type dopants or N-type dopants. In this embodiment, the doped regions 101a, 101b are doped with a dopant of the same type; and the doped regions 103a, 103b are doped with a dopant of the same type. However, the type of doped regions 101a, 101b is different from the type of the doped regions 103a, 103b. For example, if the doped regions 101a, 101b are doped as N-type, the doped regions 103a, 103b will be doped as P-type, and vice versa.

The operation of photo-detecting apparatus 100d is similar to the embodiment of FIG. 1B. The control metal lines 106a, 106b are used to control the moving direction of the electrons or holes generated by the absorbed photons according to the control signals cs1, cs2 to make the electrons or holes being stored in capacitor 110a or capacitor 110b. By controlling the control signals cs1, cs2 and reading the voltages v1, v2 on the capacitor 110a, 110b, the photo-detecting apparatus 100d can obtain a distance information between the photo-detecting apparatus 100d and the target object (not shown in FIG. 1D).

Figure 1E:
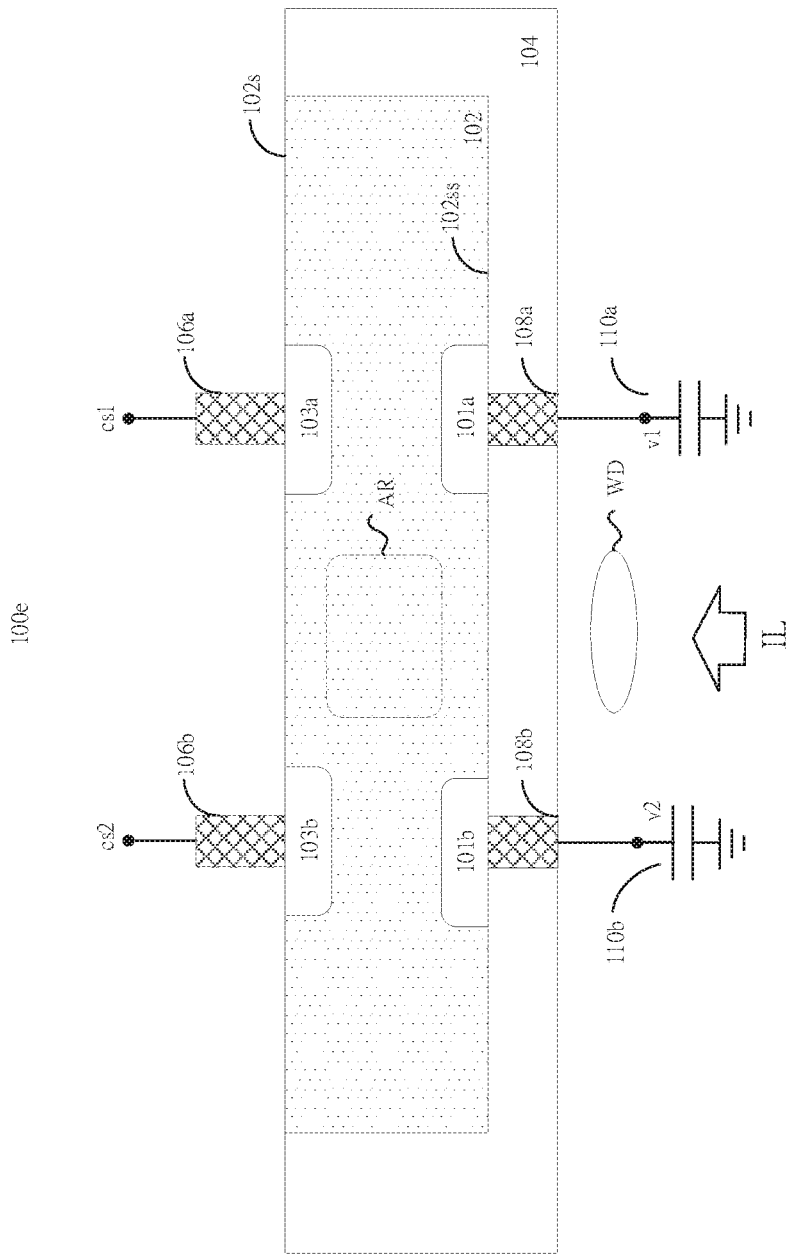

FIG. 1E illustrates a cross-sectional view of a photo-detecting apparatus, according to some embodiments. The operation of the apparatus is similar to FIG. 1D, in which the apparatus is able to obtain to the distance information between the photo-detecting apparatus 100d and the target object (not shown in FIG. 1E) by the way of generating the control signals cs1, cs2 and reading the voltages v1, v2 on the capacitor 110a, 110b. The difference from FIG. 1D is that the readout metal lines 108a, 108b and doped regions 101a, 101b are arranged at the surface 102ss opposite to the surface 102s. Because the control metal lines 106a, 106b and readout metal lines 108a, 108b are arranged in a vertical direction, the horizontal area of the photo-detecting apparatus 100e can be reduced accordingly.

Figure 1F:
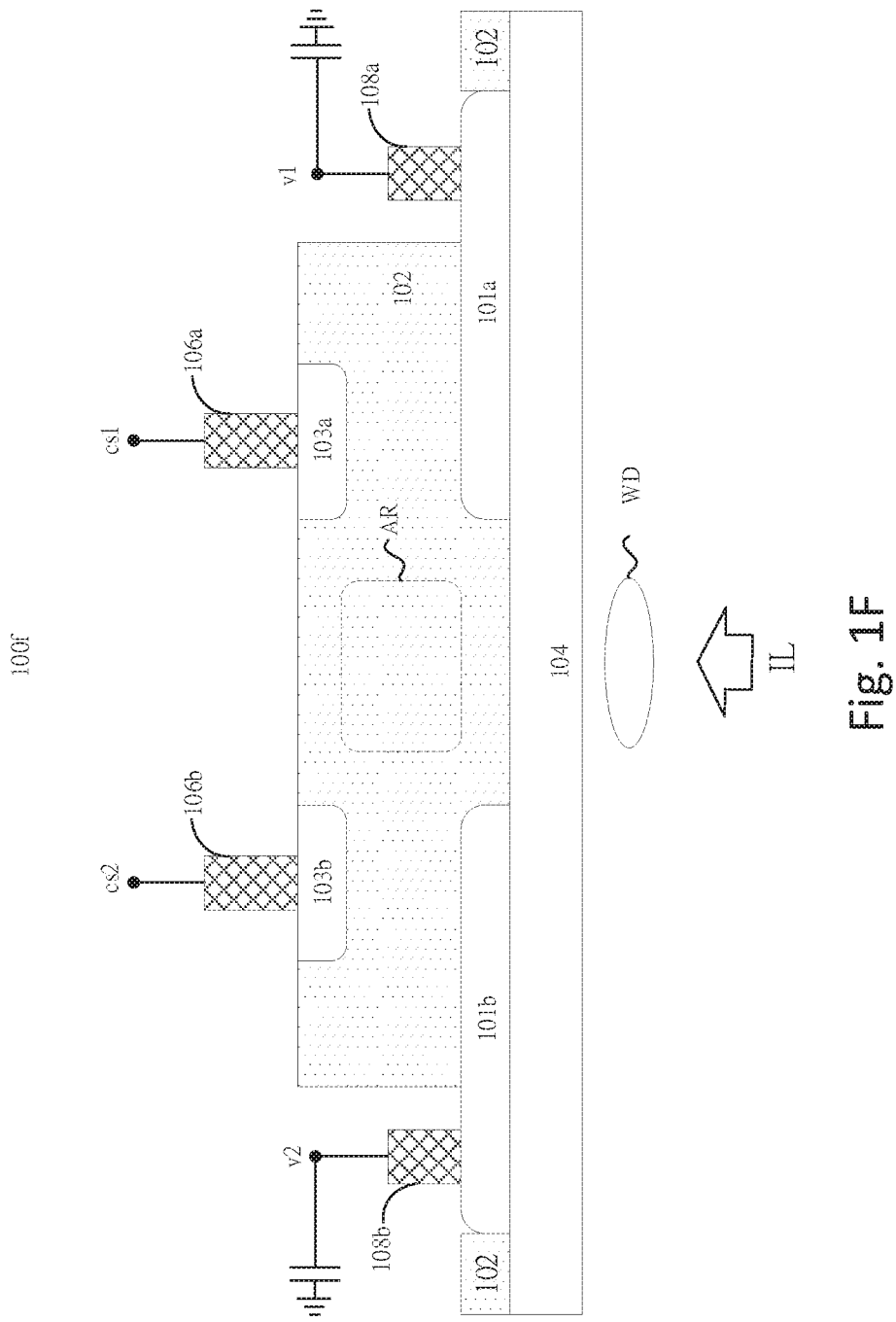

FIG. 1F illustrates a cross-sectional view of a photo-detecting apparatus, according to some embodiments. Compared to FIG. 1E, the embodiment in FIG. 1F also arranges the doped regions 101a, 101b at the surface 102ss opposite to the surface 102s, but the readout metal lines 108a, 108b are extending toward the surface 102s, rather than the semiconductor substrate 104. Such arrangements may simplify the fabrication process.

In some implementations, as the embodiments illustrated in FIG. 1A to FIG. 1F and the embodiments hereinafter, the control metal lines 106a, 106b and the surface 102s can be made as a metal-semiconductor junction (MS junction) with Schottky barrier, or a metal-insulator-semiconductor capacitor (MIS capacitor) by introducing oxide or high-K dielectric materials as the insulator in-between the metal and the semiconductor.

As the embodiments illustrated in FIG. 1A to FIG. 1F and the embodiments hereinafter, the germanium-based light absorption material 102 is made as rectangular from its cross-sectional view, however, in some implementations, the germanium-based light absorption material 102 can be made as inverted trapezoid or other patterns from its cross-sectional view.

The photo-detecting apparatuses illustrated in the present disclosure can be used in time-of-flight (ToF) applications, which may operate at longer wavelengths (e.g., NIR or SWIR range) compared to visible wavelengths. The wavelength could be more than 800 nm, such as 850 nm, 940 nm, 1050 nm, 1064 nm, 1310 nm, 1350 nm, or 1550 nm. On the other hand, the device/material implementer can design/fabricate a 100% germanium or an alloy (e.g., GeSi) with a predetermined percentage (e.g., more than 80% Ge) of germanium, either intrinsic or extrinsic, as a light absorption material to absorb the light at the aforementioned wavelengths.

Although the embodiments herein illustrate that the photo-detecting apparatus absorbs the optical signal IL from a back side, however, in some implementations, the photo-detecting apparatus can be designed to absorb the optical signal IL from a front side, e.g., by creating an optical window WD between the two control metal lines 106a, 106b.

The embodiments illustrated in FIG. 1A to FIG. 1F include a single photodetector, which can serve as a unit and be applied to each pixel of a pixel array. The following descriptions are alternative embodiments based on either one-tap or two-tap structures disclosed in FIG. 1A to FIG. 1F. In the following descriptions, one or two embodiments from FIG. 1A to FIG. 1F may be selected as a representative embodiment. The person skilled in the art can change, modify or combine the structures disclosed herein, such as replace two-tap structure with one-tap structure.

Figure 2A:
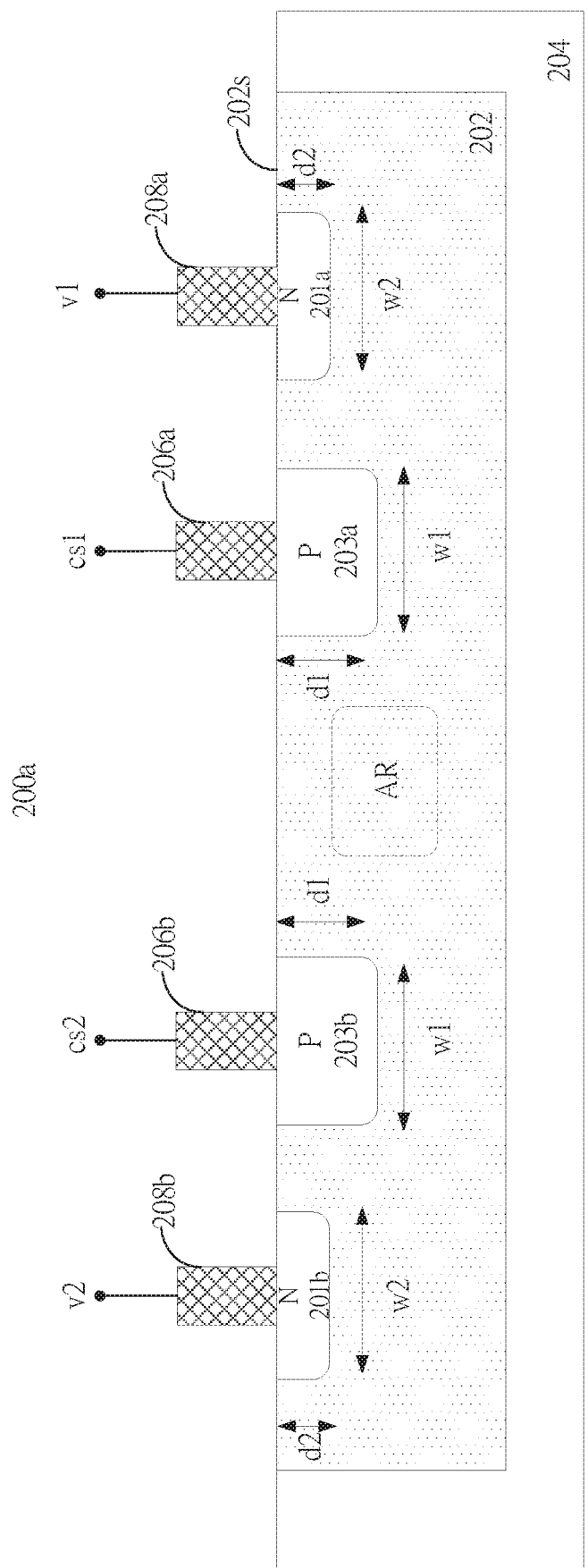
FIGS. 2A-2H illustrate cross-sectional views of a photo-detecting apparatus with body depletion mode, according to some embodiments.

FIG. 2A illustrates a cross-sectional view of a photo-detecting apparatus with body depletion mode, according to some embodiments. The photo-detecting apparatus 200a includes control metal lines 206a, 206b and readout metal lines 208a, 208b. The control metal lines 206a, 206b and the readout metal lines 208a, 208b are electrically coupled to the surface 202s of the germanium-based light absorption material 202. The control metal lines 206a, 206b are respectively electrically coupled to the P-type regions 203a, 203b on the surface 202s, and the readout metal line 208a, 208b are respectively electrically coupled to the N-type regions 201a, 201b on the surface 202s. In some embodiments, the depth d1 of the P-type regions 203a, 203b extending from the surface 202s is deeper than the depth d2 of the N-type regions 201a, 201b, and the germanium-based light absorption material 202 is lightly N-type. With deeper P-type regions 203a, 203b, larger depletion regions are created between the deeper P-type regions 203a, 203b and the N-type germanium-based light absorption material 202, which may allow electrons moving toward the N-type regions 201a, 201b when two different voltages are applied to the control metal lines 206a, 206b and therefore increases the quantum efficiency and the demodulation contrast. In other aspects, the width w1 of P-type regions 203a, 203b, the width w2 of N-type regions 201a, 201b, the doping concentration of P-type regions 203a, 203b, and/or the doping concentration of N-type regions 201a, 201b are also the parameters to adjust the area of the depletion regions.

In some embodiments, to fully deplete the body of the N-type germanium-based light absorption material 202, one can design through the N-type regions 201a, 201b and/or P-type regions 203a, 203b, either through its depths, widths or doping concentrations. Also, the thickness of the germanium-based light absorption material 202 should be designed accordingly.

Figure 2B:
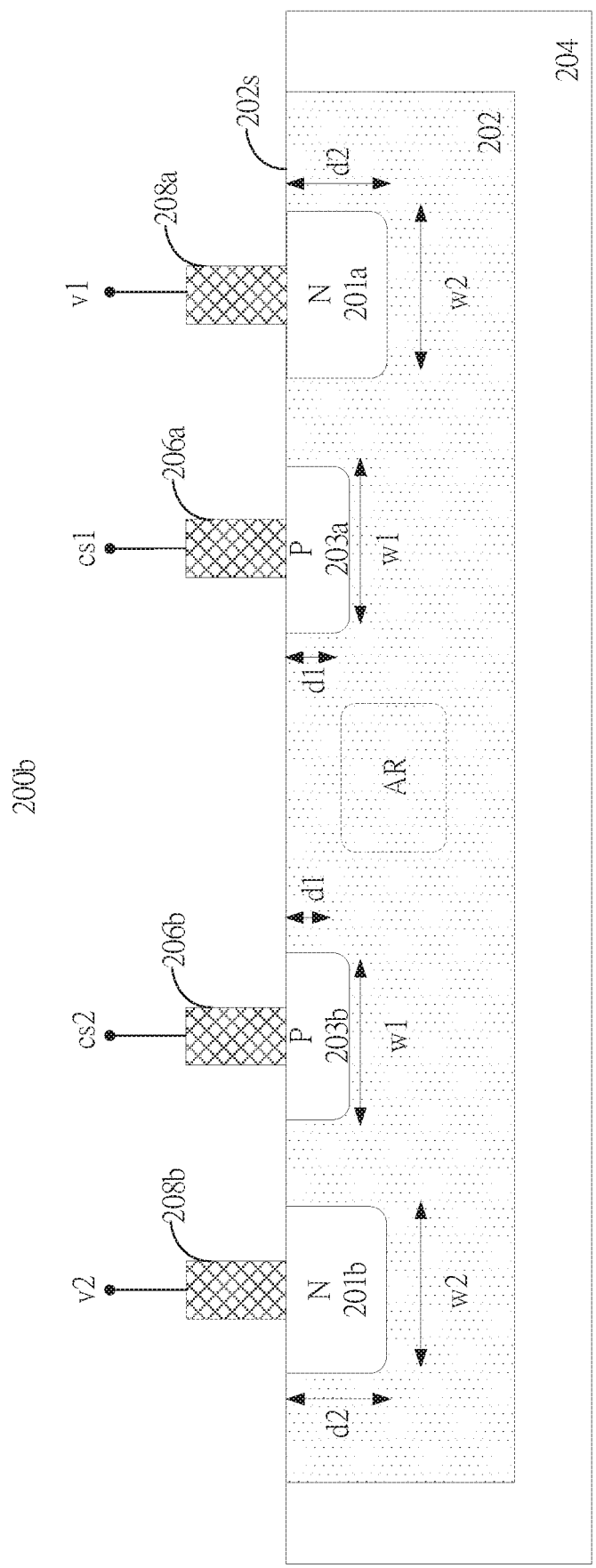

FIG. 2B illustrates a cross-sectional view of a photo-detecting apparatus with body depletion mode, according to some embodiments. The photo-detecting apparatus 200b can be designed with shallower P-type regions 203a, 203b. In other words, the depth d1 of the P-type regions 203a, 203b extending from the surface 202s is shallower than the depth d2 of the N-type regions 201a, 201b. Applying shallower P-type regions 203a, 203b may reduce the leakage between the P-type region 203a and P-type region 203b.

Figure 2C:
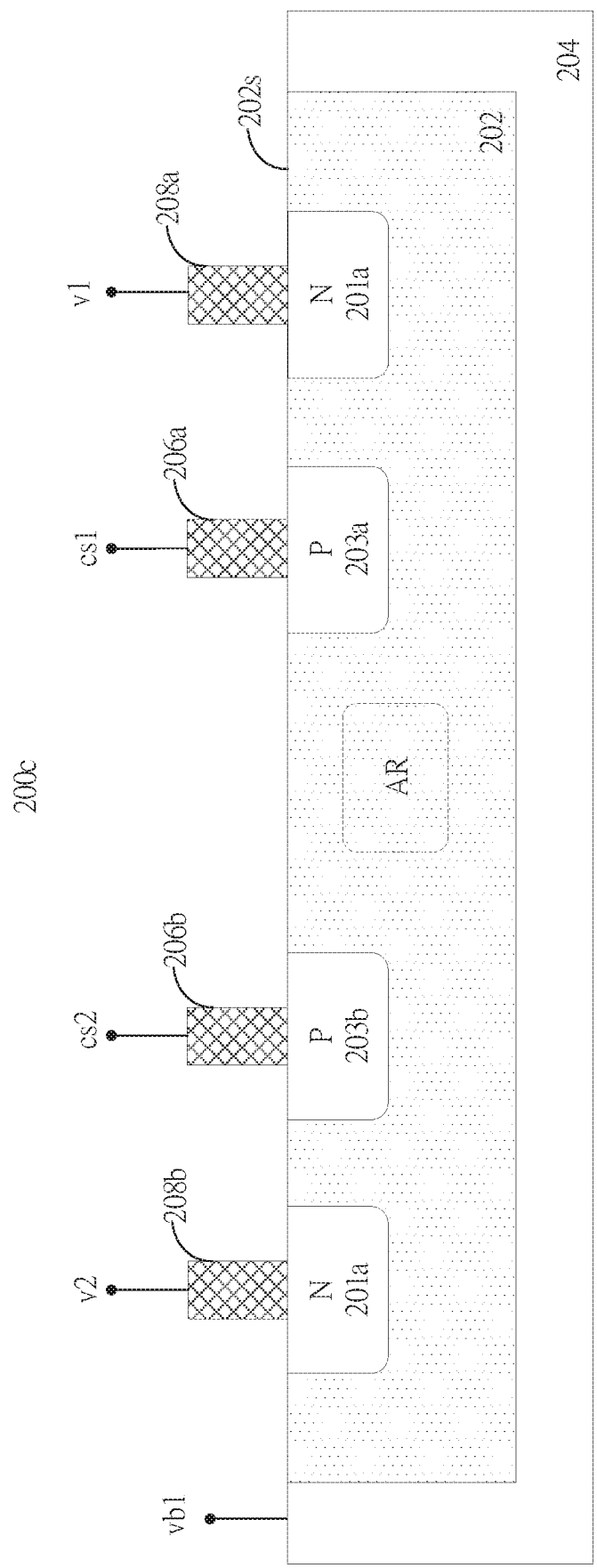

FIG. 2C illustrates a cross-sectional view of a photo-detecting apparatus with body depletion mode, according to some embodiments. The structure of photo-detecting apparatus 200c is similar to the photo-detecting apparatus 200a, 200b. The photo-detecting apparatus 200c applies a bias voltage vb1 on the semiconductor substrate 204. This bias voltage vb1 is applied for creating a reverse bias across the junctions between the N-type germanium-based light absorption material 202 and the P-type regions 203a, 203b. As a result, the depletion region underneath the P-type regions 203a, 203b can be enlarged or even fully depleted. Due to the larger depletion regions generated underneath the P-type regions 203a, 203b, it may make allow electrons moving toward the N-type regions 201a, 201b when two different voltages are applied to the control metal lines 206a, 206b and thus increases the quantum efficiency and the demodulation contrast.

Figure 2D:
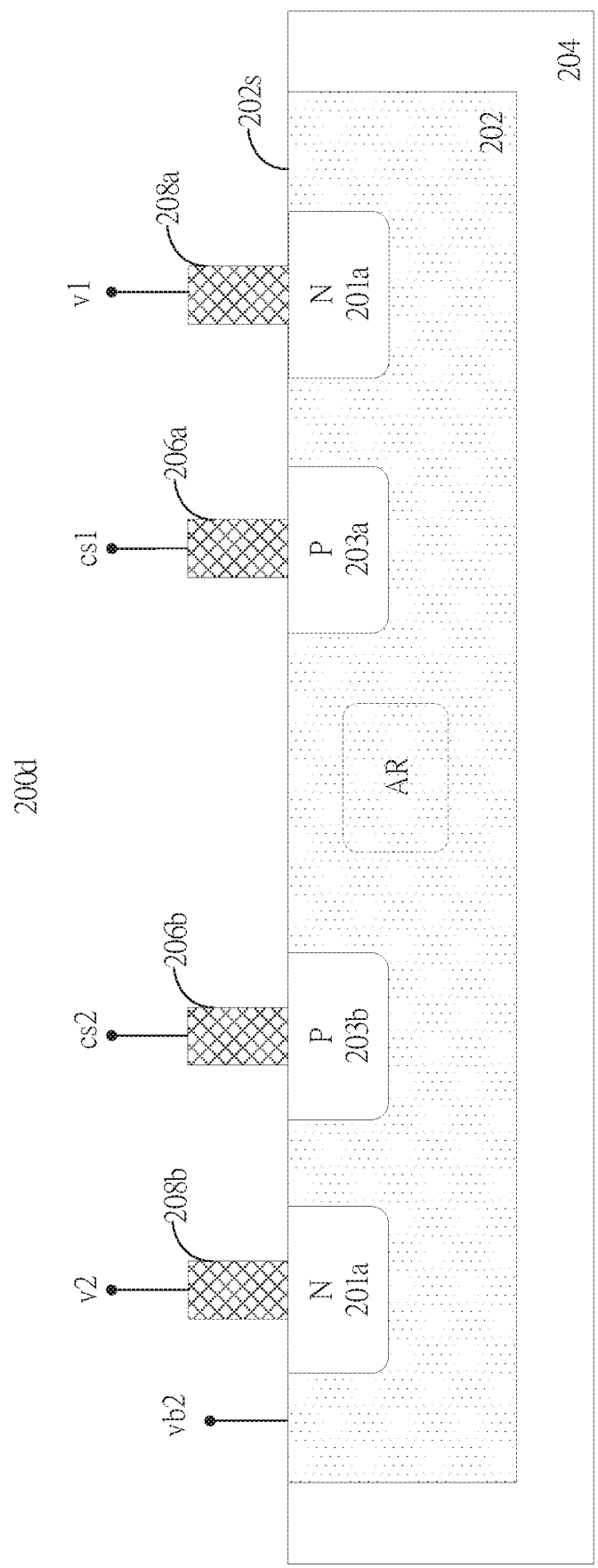

FIG. 2D illustrates a cross-sectional view of a photo-detecting apparatus with body depletion mode, according to some embodiments. Similar to the structure of photo-detecting apparatuses 200a, 200b, this embodiment applies a bias voltage vb2 on the germanium-based light absorption material 202 to control the depletion regions inside the germanium-based light absorption material 202. Specifically, the bias voltage vb2 is a reverse bias to the P-type regions 203a, 203b and the N-type germanium-based light absorption material 202, and so be able to enlarge the depletion regions surrounding the P-type regions 203a, 203b or even being fully depleted.

Figure 2E:
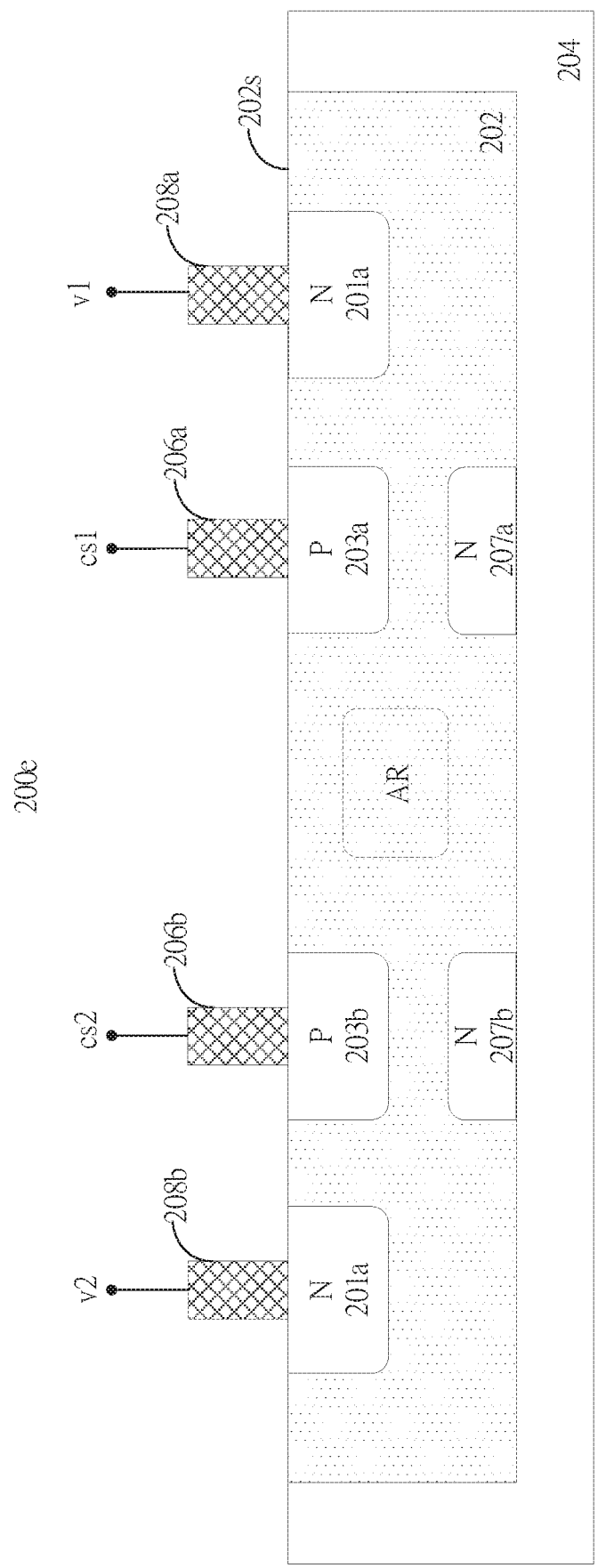

In order to create even larger depletion regions inside the germanium-based light absorption material 202, the embodiment shown in FIG. 2E is disclosed. The photo-detecting apparatus 200e includes N-type regions 207a, 207b on the surface 202ss. The surface 202ss is opposite to the surface 202s. With the N-type regions 207a, 207b, PN junctions are formed in which a depletion region between P-type region 203a and N-type region 207a, and a depletion region between P-type region 203b and N-type region 207b, are generated. Consequently, electric fields are created in the absorption region when two different voltages are applied to the control metal lines 206a, 206b. Therefore, the said depletion regions/electrical fields can be controlled by control signals cs1, cs2 to control the electron moving direction, either toward N-type region 201a or N-type region 201b.

Figure 2F:
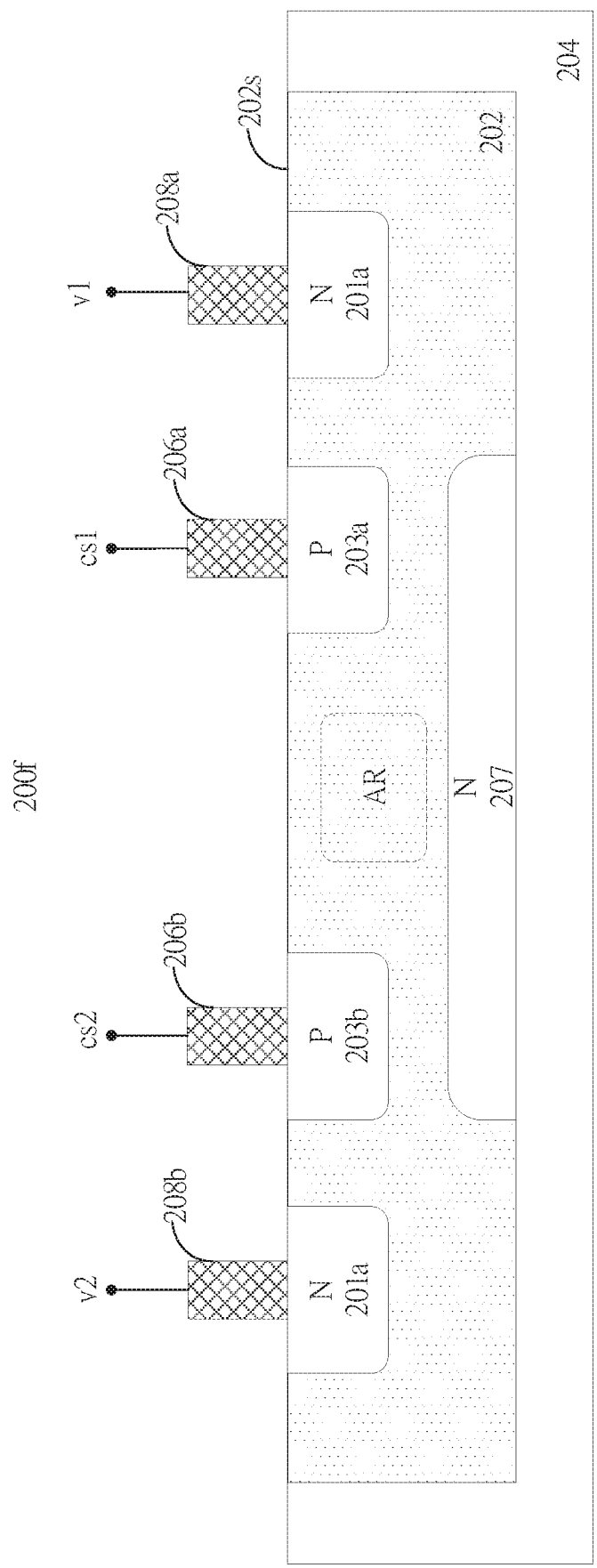

FIG. 2F illustrates a cross-sectional view of a photo-detecting apparatus with body depletion mode, according to some embodiments. The photo-detecting apparatus 200f includes a wider N-type region 207, which is located underneath the P-type regions 203a, 203b. Similarly, the N-type region 207 may enhance the generation of the depletion regions surrounding the P-type regions 203a, 203b and therefore increase the quantum efficiency and the demodulation contrast. It is noted that the width of the N-type region 207 is designable, and the width of the N-type region 207 in FIG. 2F is depicted for a reference.

Figure 2G:
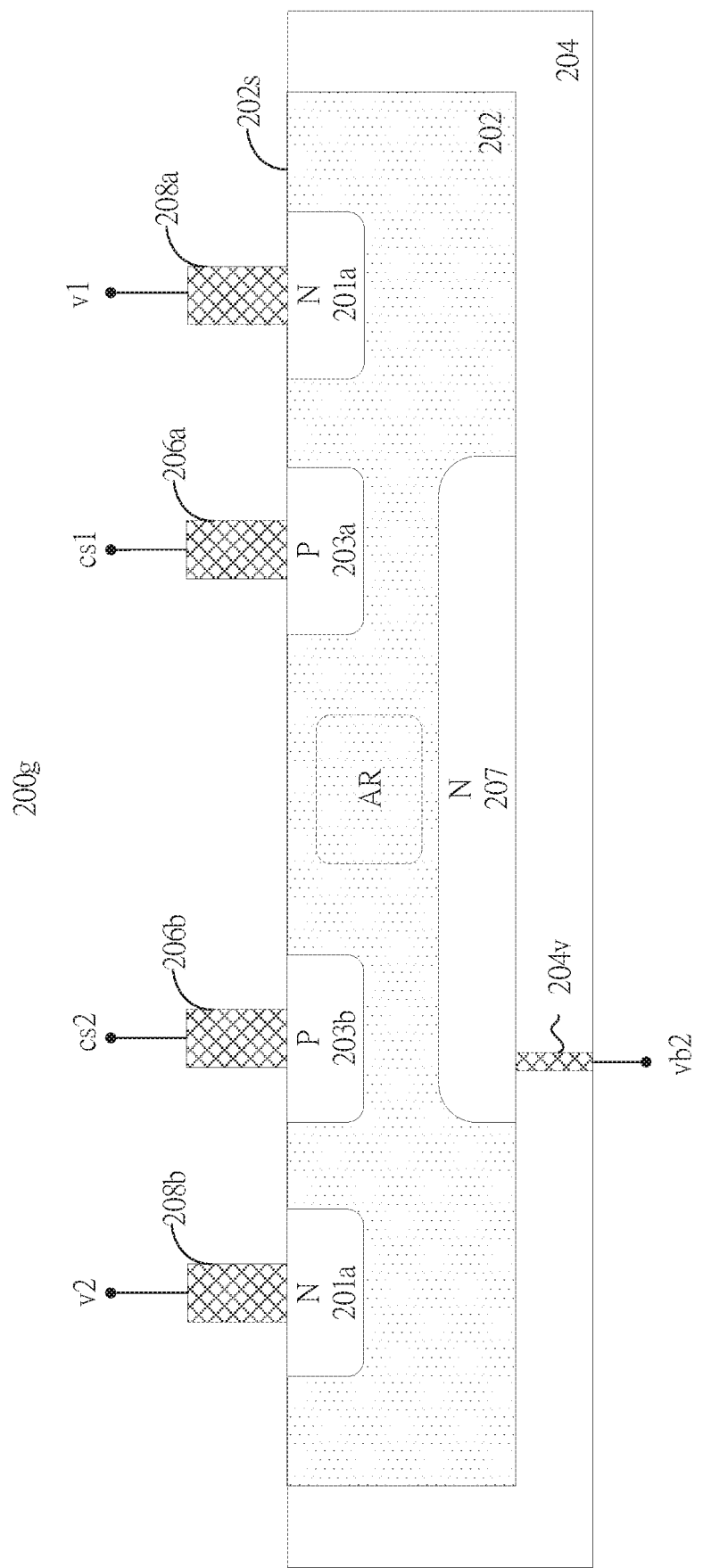
Figure 2H:
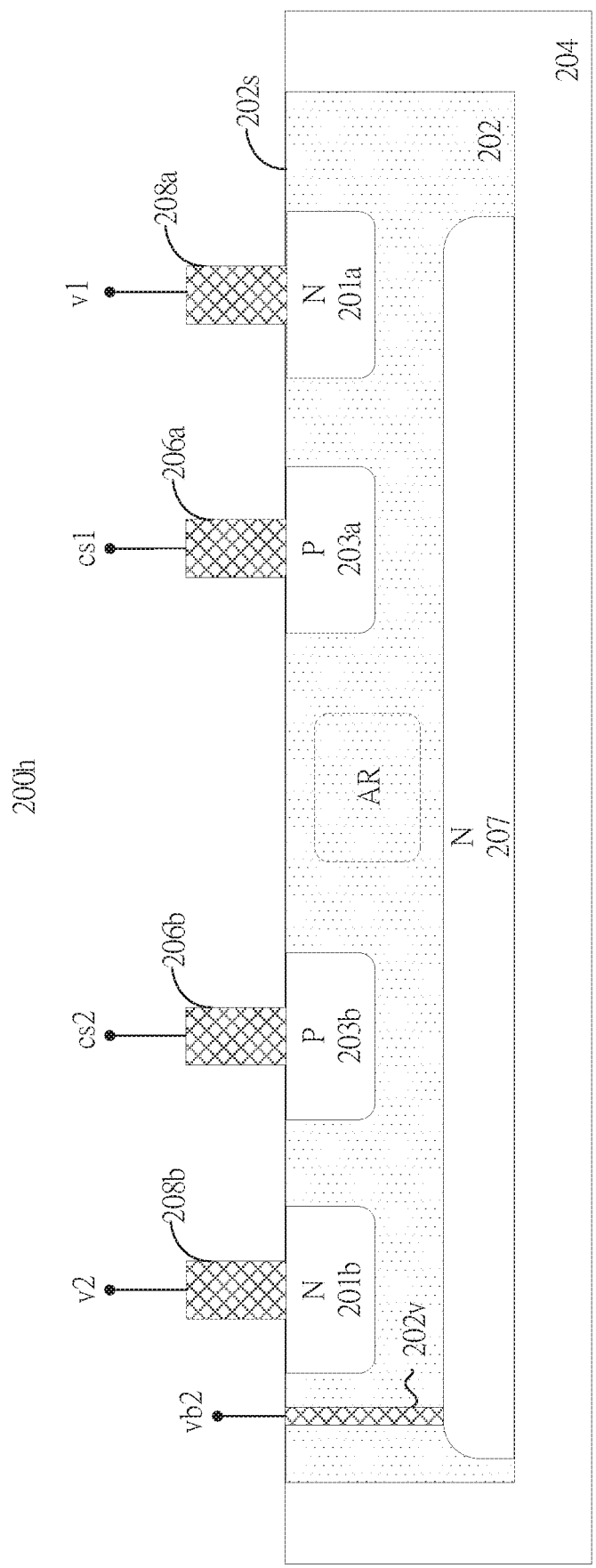

FIG. 2G and FIG. 2H illustrate alternative embodiments showing an approach to bias the N-type region 207. FIG. 2G applies a through-silicon-via (TSV) 204v to bias the N-type region 207, and FIG. 2G applies a through-germanium-via 202v extending from surface 202s to bias N-type region 207.

FIG. 2A to FIG. 2H illustrate a variety of embodiments using body depletion modes, including designing the depth of P-type regions 203a, 203b, applying bias voltages vb1, vb2 on either on semiconductor substrate 204 or germanium-based light absorption material 202, adding N-type regions 207, 207a, 207b inside the germanium-based light absorption material 202, etc. These approaches create the depletion regions underneath or surrounding the P-type regions 203a, 203b to control the moving of the electrons generated from the absorbed photons, either toward N-type region 201a or N-type region 201b.

Figure 3A:
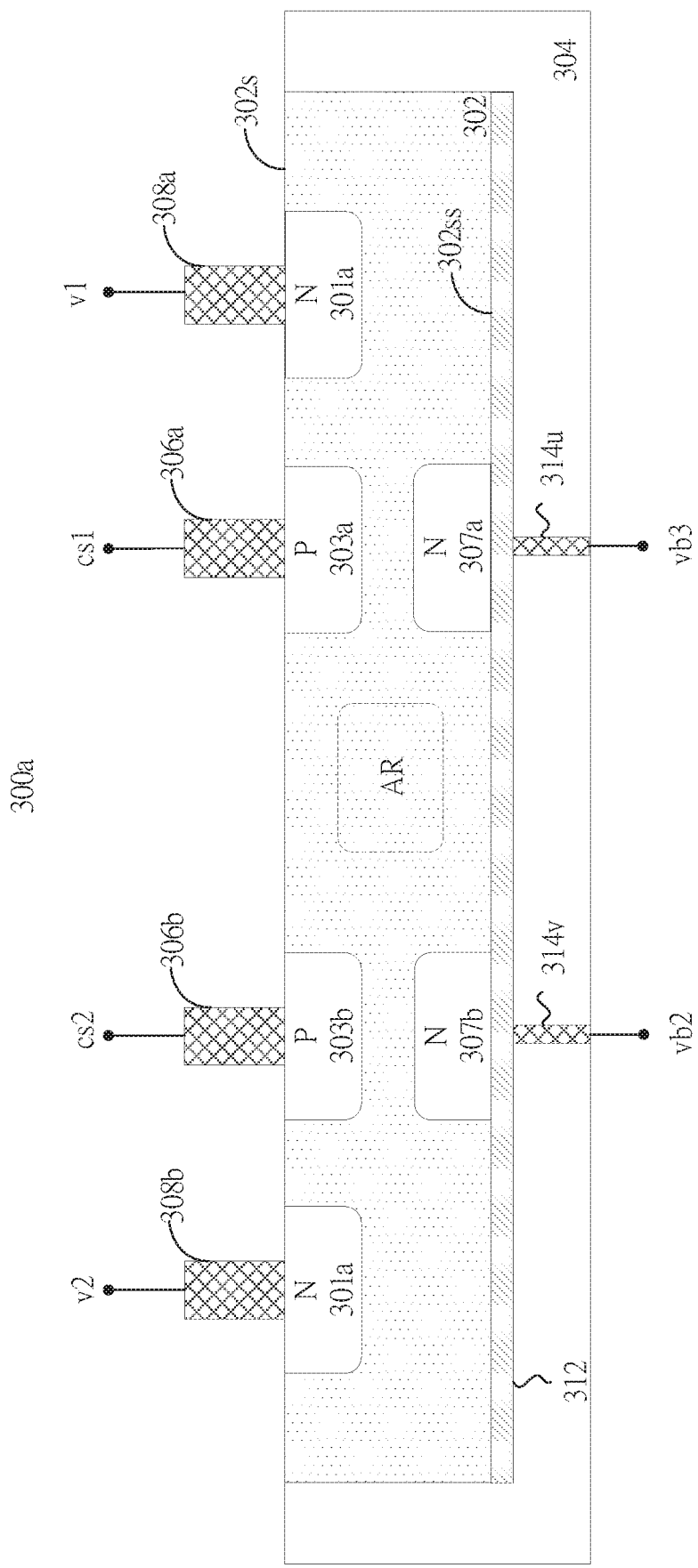
FIGS. 3A-3B illustrate cross-sectional views of a photo-detecting apparatus with gated body depletion mode, according to some embodiments.
Figure 3B:
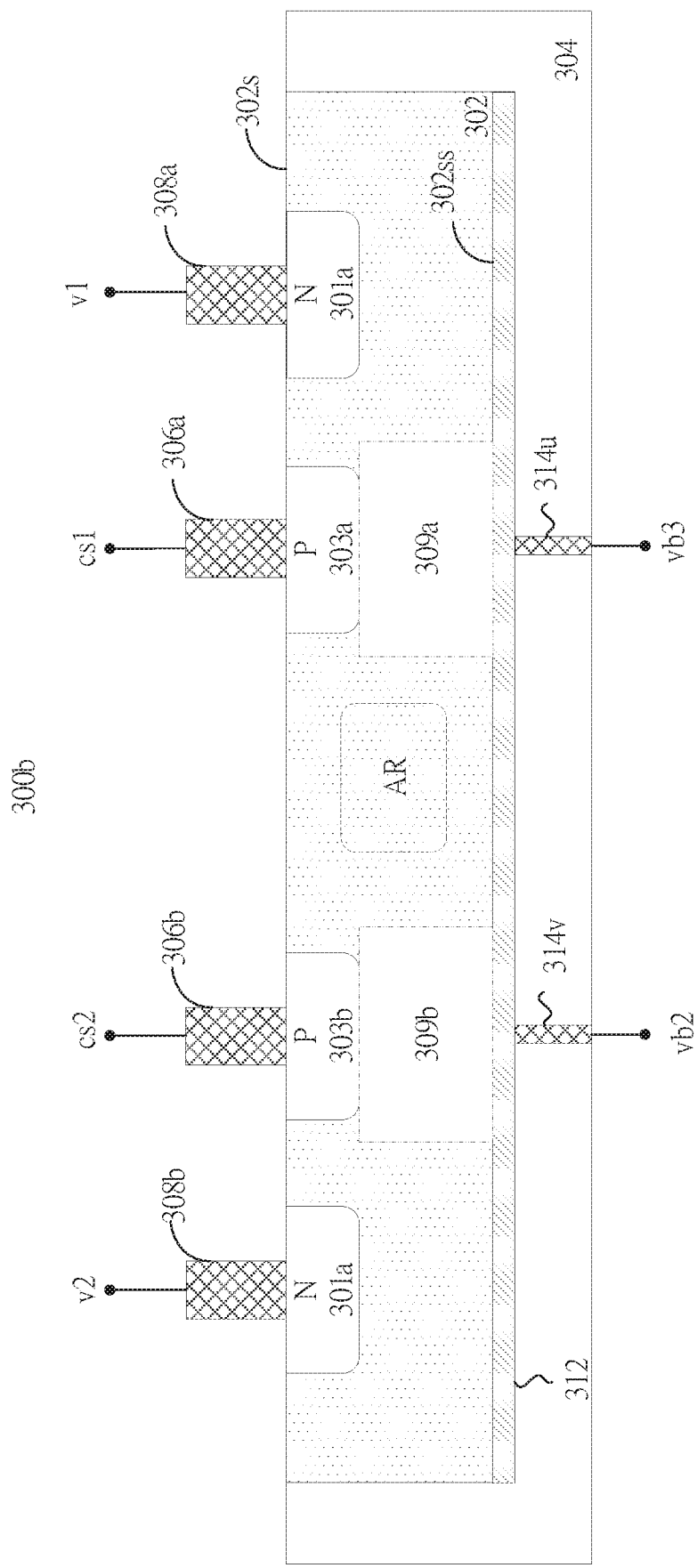

FIGS. 3A-3B illustrate cross-sectional views of a photo-detecting apparatus with gated body depletion mode, according to some embodiments Further to the embodiments illustrated in FIGS. 2A-2H, dielectric-gated body depletion modes are disclosed in FIGS. 3A-3B. The photo-detecting apparatus 300a includes control metal lines 306a, 306b and readout metal lines 308a, 308b. The control metal lines 306a, 306b and the readout metal lines 308a, 308b are electrically coupled to the surface 302s of the germanium-based light absorption material 302. The control metal lines 306a, 306b are respectively electrically coupled to the P-type regions 303a, 303b on the surface 302s, and the readout metal line 308a, 308b are respectively electrically coupled to the N-type regions 301a, 301b on the surface 202s. The germanium-based light absorption material 302 is lightly N-type. Furthermore, the photo-detecting apparatus 300a includes a N-type region 307 on the surface 302ss, and a dielectric layer 312 formed between the germanium-based light absorption material 302 and the semiconductor substrate 304, and a through silicon via (TSV) 314. In some embodiments, a dielectric layer 312 is arranged between a metal (via 314) and semiconductor (germanium-based light absorption material 302), which forms a MOS-like structure. With the dielectric layer 312 formed between the N-type region 307 and via 314, it may reduce or prevent the electrons from flowing into N-type region 307 to leak through via 314.

In some alternative embodiments, the dielectric layer 312 may not necessarily be continuous layer across the whole semiconductor substrate 304 but can be patterned into different regions located underneath N-type region 307. The dielectric layer 312 may be thin or with some predetermined thickness, including multiple kinds or layers of materials or alloy or compounds. For example, SiO2, SiNx, high-K dielectric material or a combination of thereof.

FIG. 3B illustrates a cross-sectional view of a photo-detecting apparatus with gated body depletion mode, according to some embodiments. This embodiment has no N-type region 307 on the surface 302ss, but generates the depletion regions 309a, 309b through the body bias vb2 and vb3. The body bias vb2 and body bias vb3 may be jointly applied or individually applied to control the size of the depletion regions 309a, 309b. The individually applied voltage of the body bias vb2 and the individually applied voltage of body bias vb3 may be the same or different.

Either in FIG. 3A or FIG. 3B, these embodiments insert a dielectric layer 312 between the germanium-based light absorption material 302 and semiconductor substrate 304, and generate the depletion regions (e.g., 309a, 309b in FIG. 3B) underneath the P-type regions 303a, 303b according to the control signals cs1, cs2 and body bias vb2, vb3 so as to control the electron moving direction inside the germanium-based light absorption material 302. Due to the insertion of the dielectric layer 312, it may reduce or prevent the electrons from flowing into the N-type region 307 (FIG. 3A) and the depletion regions 309a, 309b (FIG. 3B) to leak through via 314 (both FIGS. 3A and 3B).

Figure 4A:
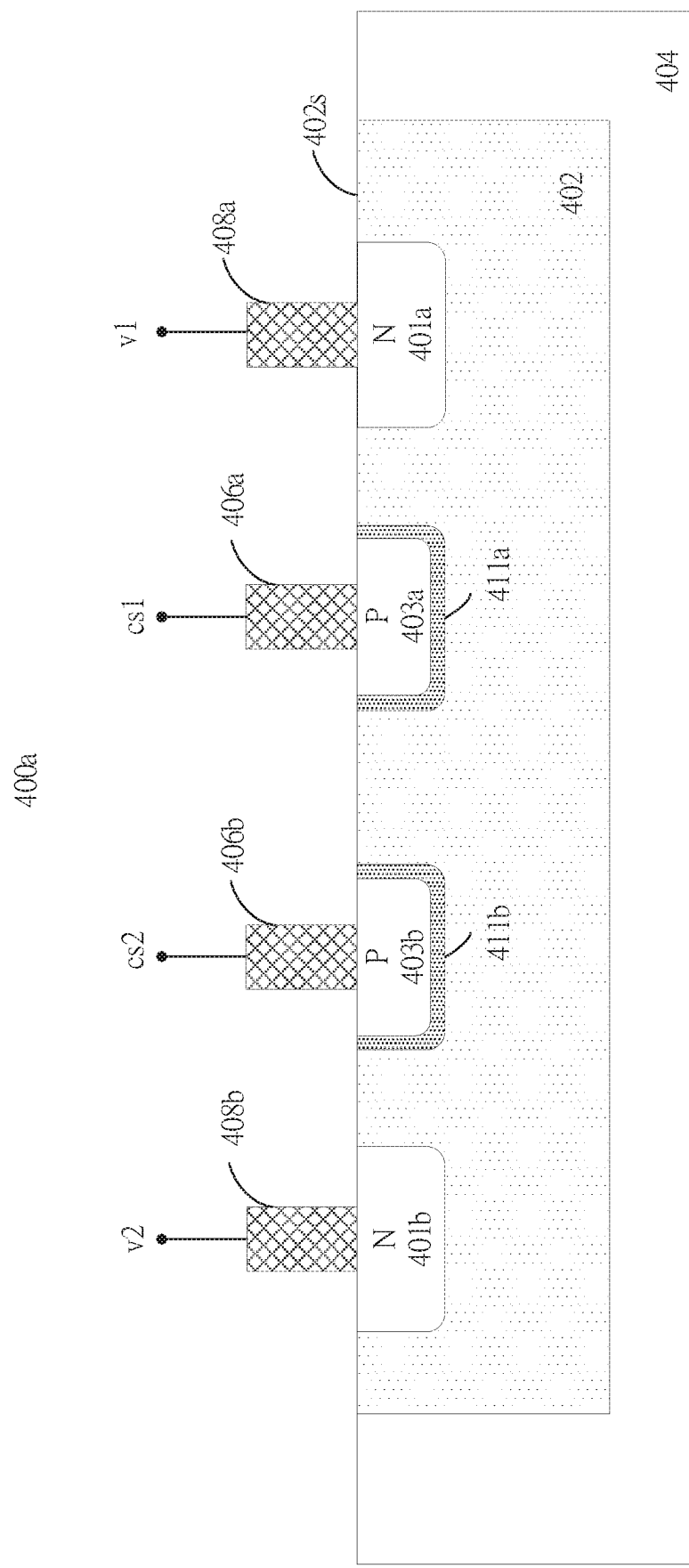
FIGS. 4A-4D illustrate cross-sectional views of a photo-detecting apparatus with a lower leakage current and a lower dark current, according to some embodiments.
Figure 4B:
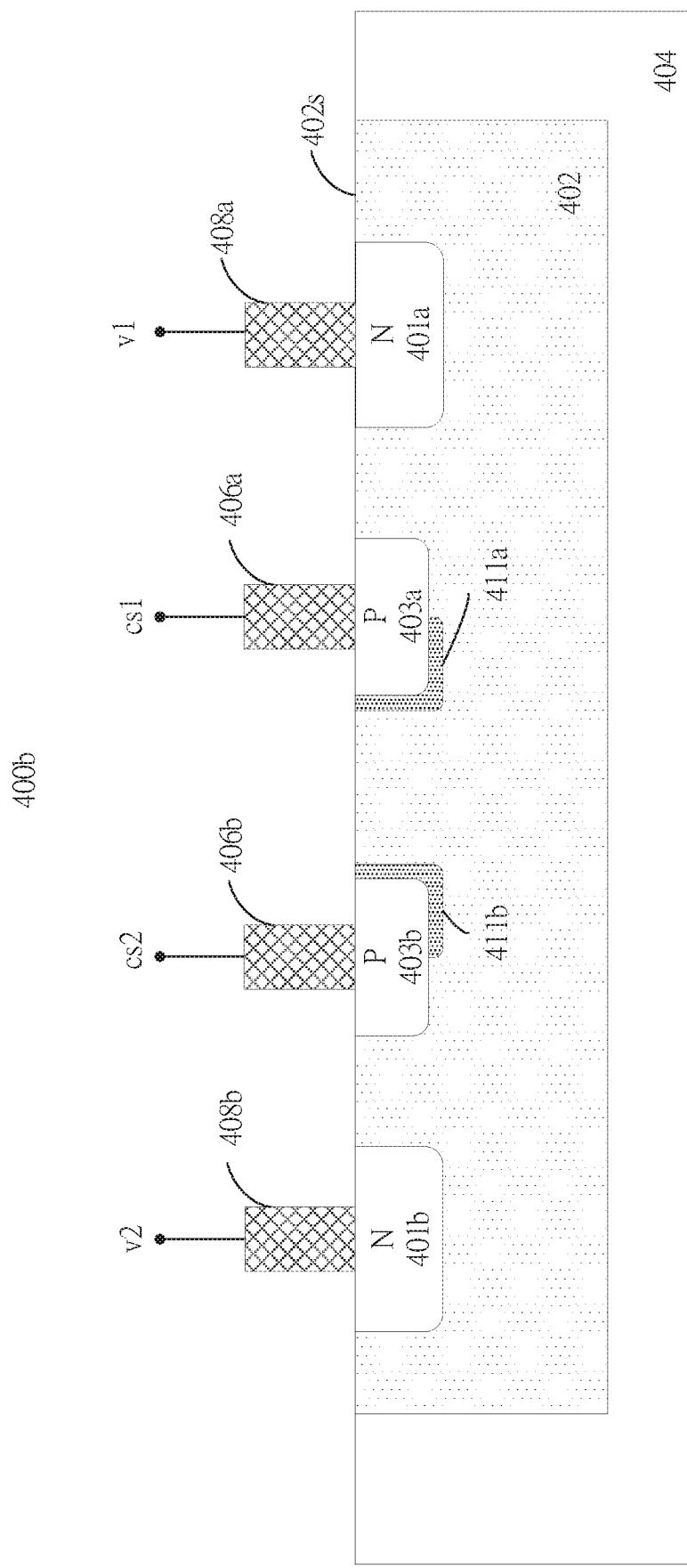

FIG. 4A illustrates a cross-sectional view of a photo-detecting apparatus with a lower leakage current and a lower dark current, according to some embodiments. The photo-detecting apparatus 400a includes control metal lines 406a, 406b and readout metal lines 408a, 408b. The control metal lines 406a, 406b and the readout metal lines 408a, 408b are electrically coupled to the surface 402s of the germanium-based light absorption material 402. The control metal lines 406a, 406b are respectively electrically coupled to the P-type regions 403a, 403b on the surface 402s, and the readout metal line 408a, 408b are respectively electrically coupled to the N-type regions 401a, 401b on the surface 402s. The operation of the apparatus in FIG. 4A is similar to the embodiments disclosed above. The embodiment of FIG. 4A adds N-wells 411a, 411b fully surrounding the P-type regions 403a, 403b. This may have the effect of reducing the leakage current between P-type regions 403a, 403b. In an alternative embodiment, the N-wells 411a, 411b can be added partially surrounding the P-type regions 403a, 403b as shown in FIG. 4B. This also has the effect of reducing the leakage current between P-type regions 403a, 403b.

Figure 4C:
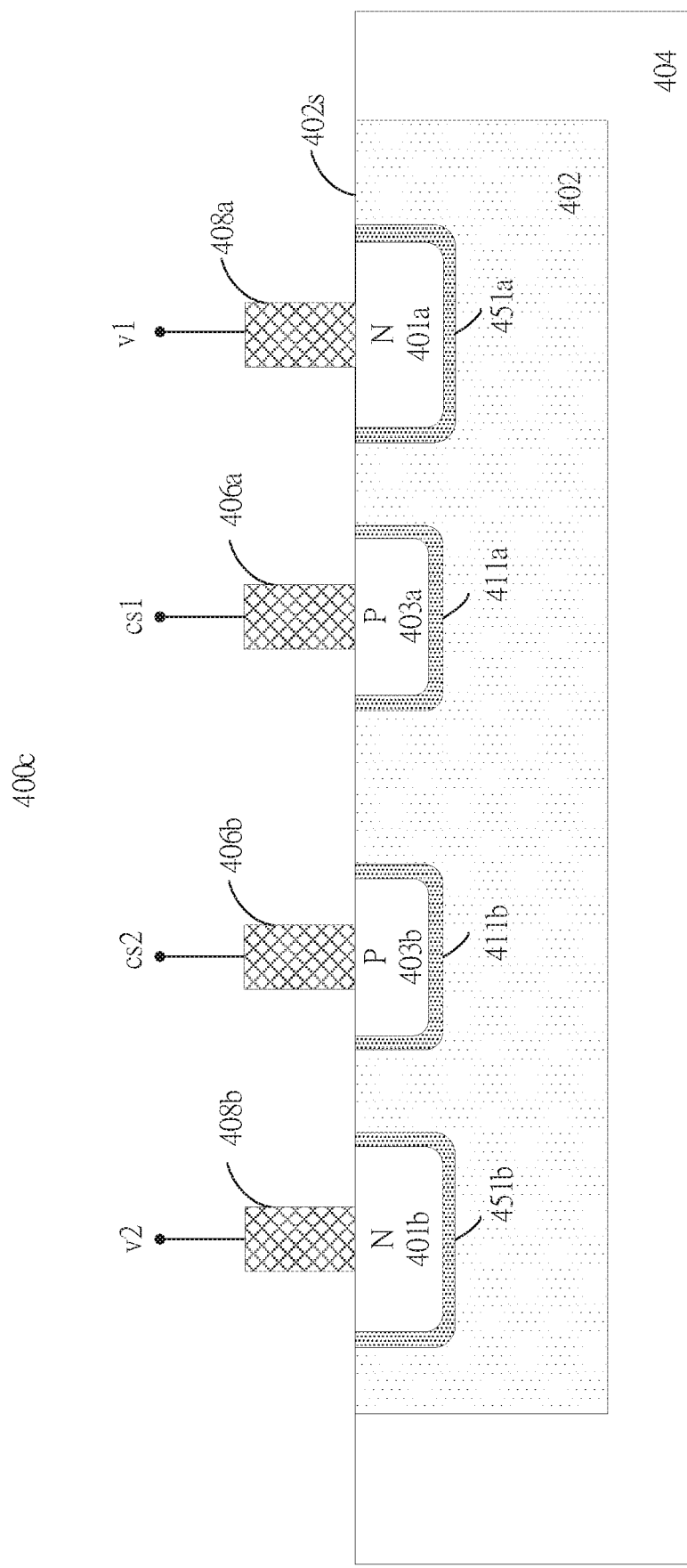
Figure 4D:
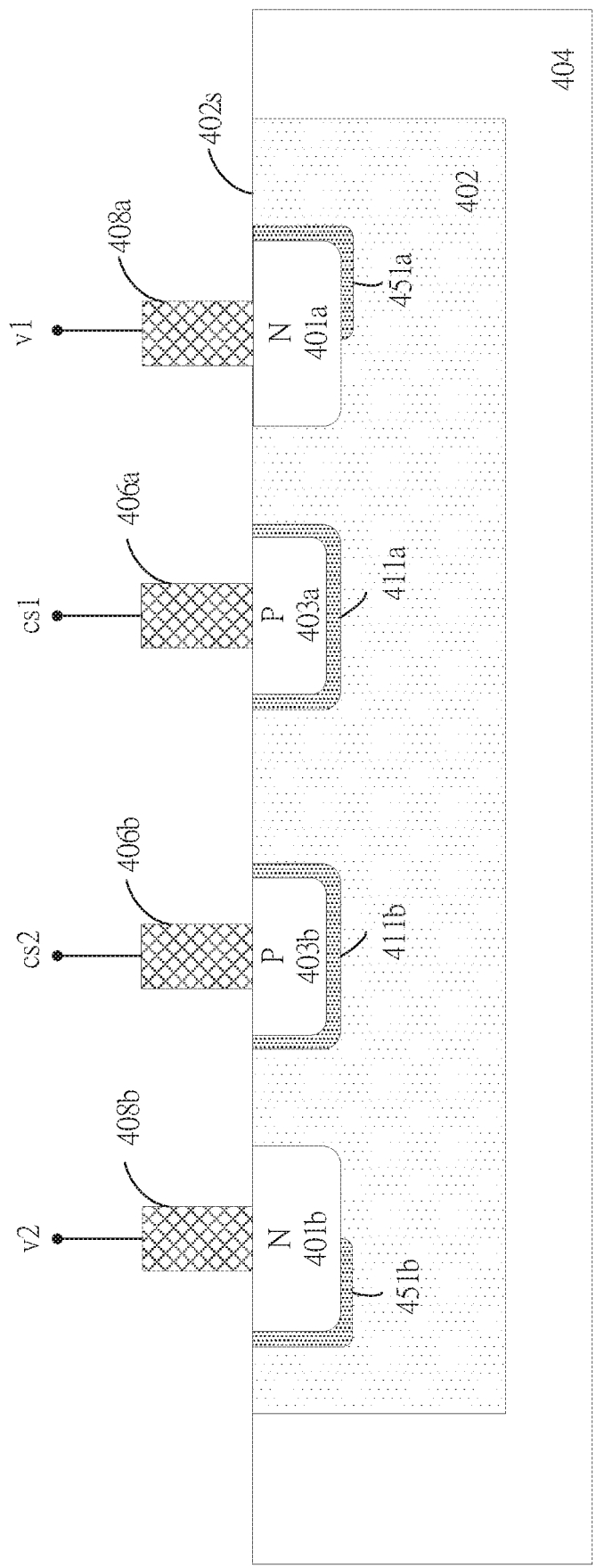

Further to the embodiments illustrated in FIG. 4A and FIG. 4B, P-wells may be added. The embodiment of FIG. 4C adds P-wells 451a, 451b fully surrounding the N-type regions 401a, 401b. This may have the effect of reducing the dark currents occurred at N-type regions 401a, 401b. In an alternative embodiment, the P-wells 451a, 451b can be added partially surrounding the N-type regions 401a, 401b as shown in FIG. 4D. This also has the effect of reducing the dark currents occurred at N-type regions 401a, 401b.

The embodiments illustrated in FIGS. 4A-4D apply N-wells and P-wells to reduce the leakage current and dark current, respectively. The person skilled in the art can change or modify the patterns of the N-wells 411a, 411b and/or P-wells 451a, 451b depending on the design requirements. For example, the N-well 411a can be designed fully surrounding the P-type regions 403a in an asymmetrical way (e.g., the left-hand side width of the N-well 411a is wider than the right-hand side width of the N-well 411a). Similarly, N-well 411b can also be designed fully surrounding the P-type regions 403b in an asymmetrical way (e.g., the right-hand side width of the N-well 411b is wider than the left-hand side width of the N-well 411b). Similar or modified implementations may also be applied to P-wells 451a, 451b.

Figure 5:
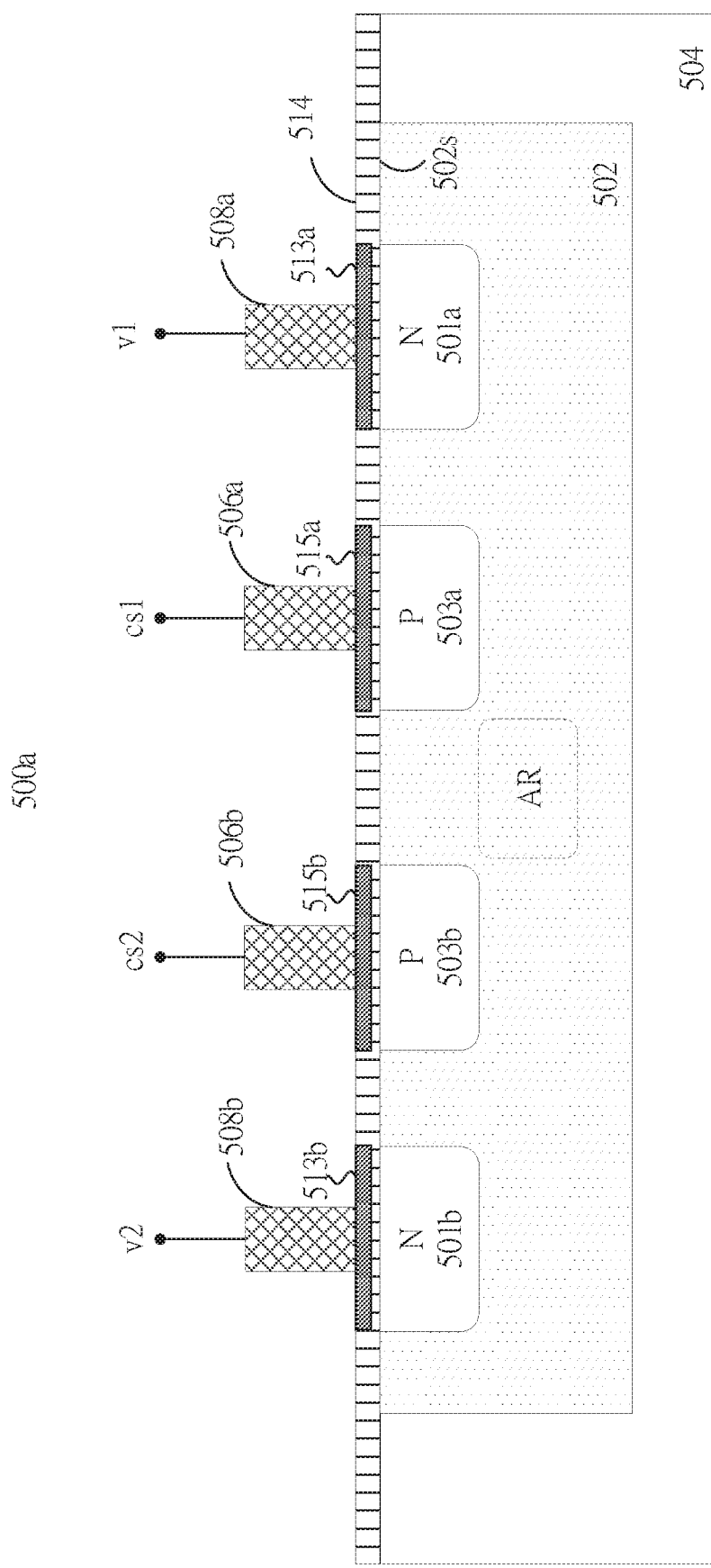
FIG. 5 illustrates a cross-sectional view of a photo-detecting apparatus with passivation layer, according to some embodiments.

FIG. 5 illustrates a cross-sectional view of a photo-detecting apparatus with passivation layer, according to some embodiments. The photo-detecting apparatus 500a includes control metal lines 506a, 506b and readout metal lines 508a, 508b. The control metal lines 506a, 506b and the readout metal lines 508a, 508b are electrically coupled to the surface 502s of the germanium-based light absorption material 502. The control metal lines 506a, 506b are respectively electrically coupled to the P-type regions 503a, 503b on the surface 502s, and the readout metal lines 508a, 508b are respectively electrically coupled to the N-type regions 501a, 501b on the surface 502s. The embodiment of FIG. 5 adds a passivation layer 514 (e.g., amorphous-silicon (a-Si), GeOx, Al$_2$O$_3$, SiO2) over the surface 502s, adds a silicide (e.g., NiSi$_2$, CoSi$_2$) 513a at the connection between the readout metal line 508a and the N-type region 501a, adds a silicide 513b at the connection between the readout metal line 508b and the N-type region 501b, adds a silicide 515a at the connection between the control metal line 506a and the P-type region 503a, and adds a silicide 515b at the connection between the control metal line 506b and the P-type region 503b.

In accordance with this embodiment, forming the passivation layer 514 over the germanium-based light absorption material 502 can terminate the dangling bonds on the surface 502s and so reduce the dark currents. On the other hand, adding the silicide (e.g., NiSi$_2$, CoSi$_2$) can also reduce the contact or junction resistance between the metal and semiconductor, which reduces the voltage drop and reduces power consumption accordingly.

Figure 6A:
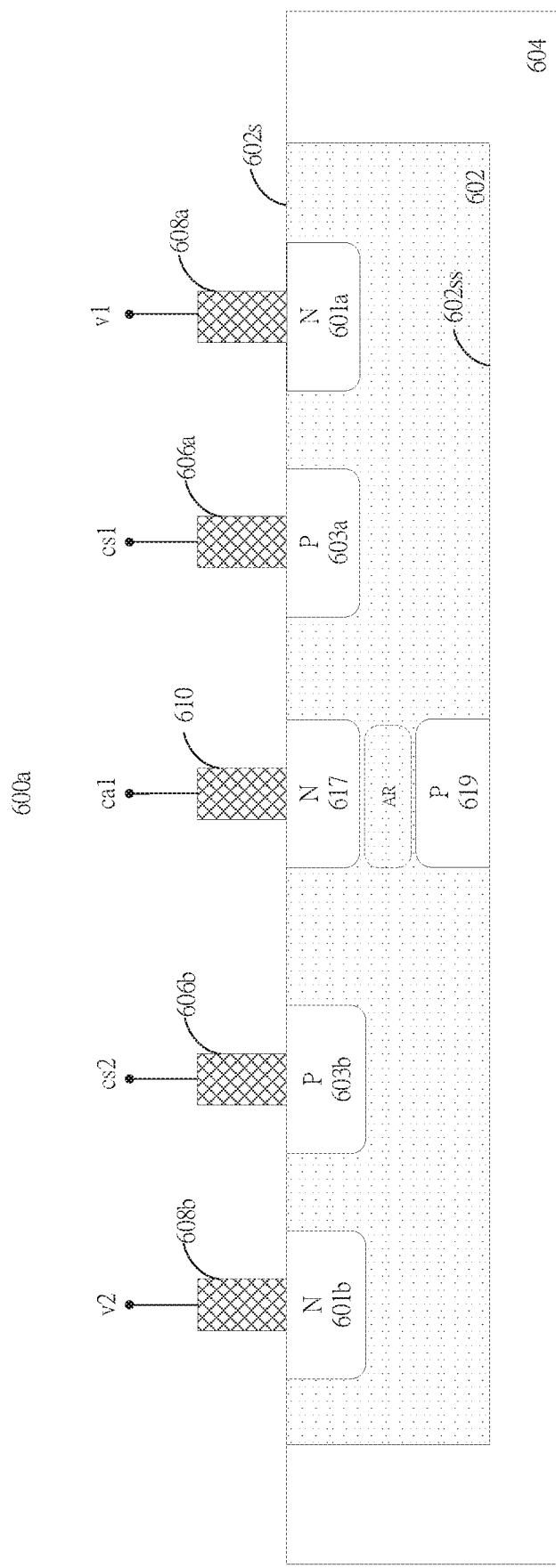
FIGS. 6A-6C illustrate cross-sectional views of a photo-detecting apparatus with boosted charge transfer speed, according to some embodiments.

FIG. 6A illustrates a cross-sectional view of a photo-detecting apparatus with boosted charge transfer speed, according to some embodiments. The photo-detecting apparatus 600a includes control metal lines 606a, 606b and readout metal lines 608a, 608b. The control metal lines 606a, 606b and the readout metal lines 608a, 608b are electrically coupled to the surface 602s of the germanium-based light absorption material 602. The control metal lines 606a, 606b are respectively electrically coupled to the P-type regions 603a, 603b on the surface 602s, and the readout metal line 608a, 608b are respectively electrically coupled to the N-type regions 601a, 601b on the surface 602s. The embodiment of FIG. 6A adds an N-type region 617 on the surface 602s and a P-type region 619 on the surface 602ss. The N-type region 617 and P-type region 619 are formed substantially on the center of the germanium-based light absorption material 602, which is a location that the optical signal IL may pass through. Due to the fact that the N-type region 617 and P-type region 619 are collectively formed as a PN-junction, there are built-in vertical electrical fields established between N-type region 617 and P-type region 619, which may assist separating the electron-hole pairs generated by the absorbed photons, where the electrons tends to move toward the N-type region 617 and the holes tends to move toward the P-type region 619. The N-type region 617 is operated to collect the electrons and the P-type region 619 is operated to collect the holes. The electrons stored in the N-type region 617 may be moved to N-type region 601a or N-type region 601b according to the control signals cs1, cs2. Notably, the metal line 610 can be floating or be biased by a bias voltage ca1 depending on the operation of photo-detecting apparatus 600a. In one implementation, doping concentration of the N-type regions 601a, 601b are higher than a doping concentration of the N-type region 617.

Figure 6B:
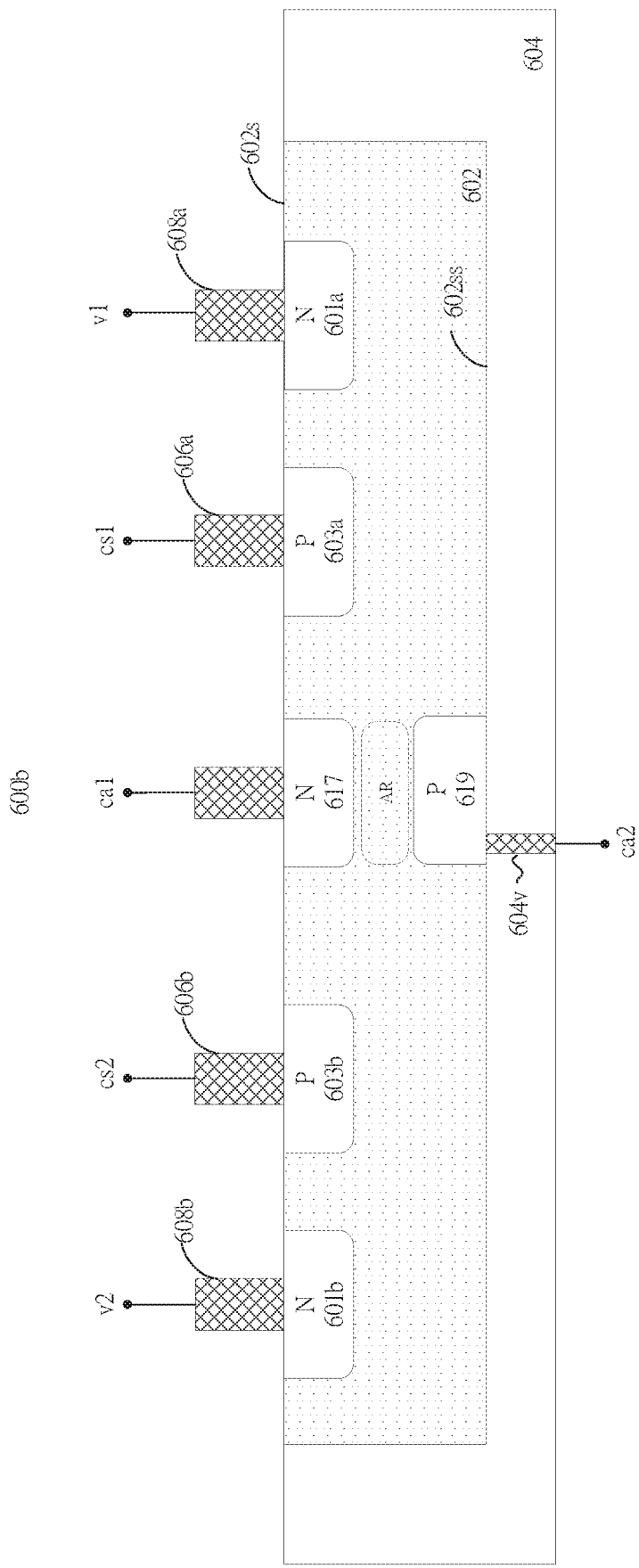

FIG. 6B illustrates a cross-sectional view of a photo-detecting apparatus with boosted charge transfer speed, according to some embodiments. This embodiment is similar to the photo-detecting apparatus 600a. The difference is that the P-type region 619 can be biased though a silicon via 604v, in which the holes collected in the P-type region 619 can be discharged through the silicon via 604v, which is biased by a bias voltage ca2 thereon.

Figure 6C:
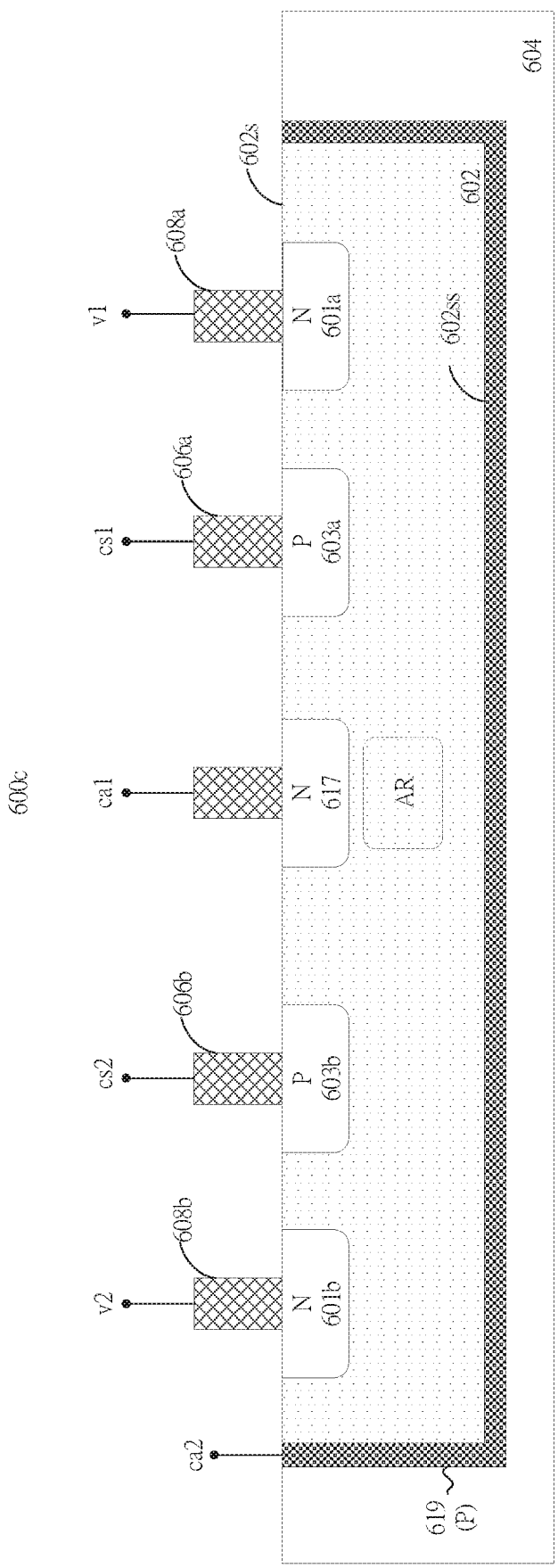

FIG. 6C illustrates a cross-sectional view of a photo-detecting apparatus with boosted charge transfer speed, according to some embodiments. The embodiment of FIG. 6C is similar to the photo-detecting apparatus 600b. The difference is that a P-type region 619 is formed as a U-shape or a well-shape underneath and surrounding the germanium-based light absorption material 602. Also, this P-type region 619 is electrically coupled to a bias voltage ca2. Therefore, the photo-generated holes can be collected and discharged by the P-type region 619.

Figure 7A:
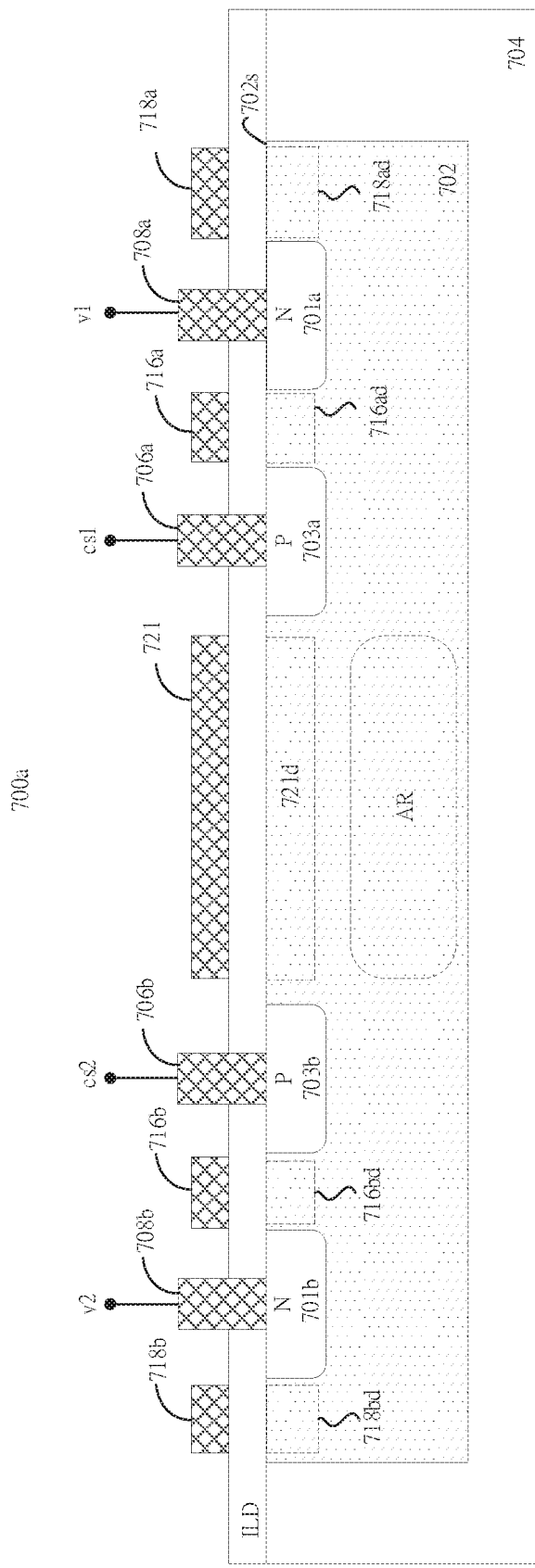
FIGS. 7A-7B illustrate cross-sectional views of a photo-detecting apparatus with surface depletion mode, according to some embodiments.

FIG. 7A illustrates a cross-sectional view of a photo-detecting apparatus with surface depletion mode, according to some embodiments. The photo-detecting apparatus 700a includes control metal lines 706a, 706b and readout metal lines 708a, 708b. The control metal lines 706a, 706b and the readout metal lines 708a, 708b are electrically coupled to the surface 702s of the germanium-based light absorption material 702. The control metal lines 706a, 706b are respectively electrically coupled to the P-type regions 703a, 703b on the surface 702s, and the readout metal line 708a, 708b are respectively electrically coupled to the N-type regions 701a, 701b on the surface 702s. This embodiment forms an interlayer dielectric ILD on the surface 702s and forms metals 721, 716a, 716b, 718a, 718b on the interlayer dielectric ILD. These metals 721, 716a, 716b, 718a, 718b can be biased to generate the depletion regions 721d, 716ad, 716bd, 718ad, 718bd. The biases applied on the metals 721, 716a, 716b, 718a, 718b can be different or the same, or have some of the metals 721, 716a, 716b, 718a, 718b floating.

The depletion region 712d can reduce the dark current between the P-type region 703a and the P-type region 703b. The depletion region 716ad can reduce the dark current between the P-type region 703a and the N-type region 701a. The depletion region 716bd can reduce the dark current between the P-type region 703b and the N-type region 701b. The depletion region 718a can reduce the dark current between N-type region 701a and another pixel (Not shown in FIG. 7A). The depletion region 718b can reduce the dark current between N-type region 701b and another pixel (Not shown in FIG. 7A). Therefore, by forming these surface depletion regions, the power consumption and the noise generation can be reduced.

As mentioned, the metals 721, 716a, 716b, 718a, 718b can be biased to generate the depletion regions 721d, 716ad, 716bd, 718ad, and 718bd. In other applications, the metals 721, 716a, 716b, 718a, 718b can be biased to make the corresponding regions 721d, 716ad, 716bd, 718ad, 718bd into accumulation or inversion, other than depletion.

In addition to the leakage reduction, the metals 721, 716a, 716b, 718a, 718b can reflect the residual optical signal IL into the germanium-based light absorption material 702 so as to be converted into electron-hole pairs accordingly. These metals 721, 716a, 716b, 718a, 718b serve like a mirror reflecting the light not being completely absorbed and converted by the germanium-based light absorption material 702 back to the germanium-based light absorption material 702 for absorption again. This would increase the overall absorption efficiency and therefore increase the system performance.

Figure 7B:
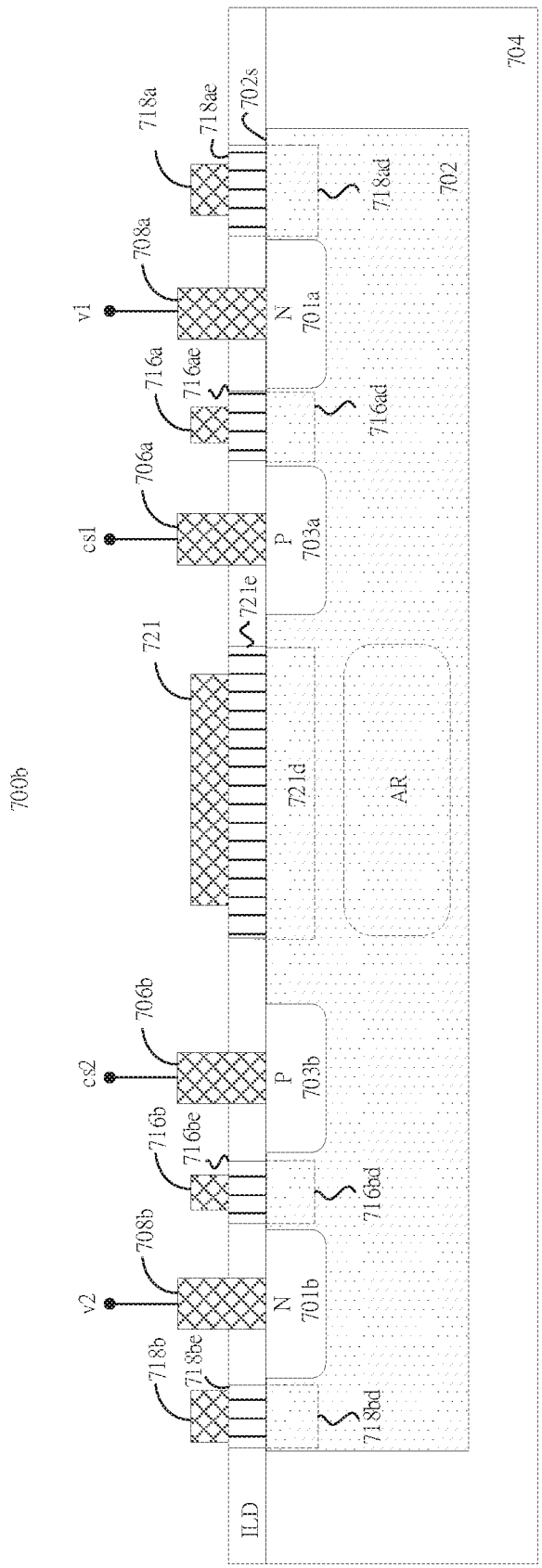

Furthermore, an alternative embodiment of the present disclosure is illustrated in FIG. 7B. Compared to FIG. 7A, this embodiment adds polarized dielectrics 721e, 716ae, 716be, 718ae, 718be (e.g., $HfO_2$) as shown in FIG. 7B. Since there are dipole existing in the polarized dielectrics 721c, 716ae, 716be, 718ae, 718be, the depletion/accumulation/inversion regions 721d, 716ad, 716bd, 718ad, 718bd may be generated without biasing or biasing the metals 721, 716a, 716b, 718a, 718b at a small bias.

Figure 7C:
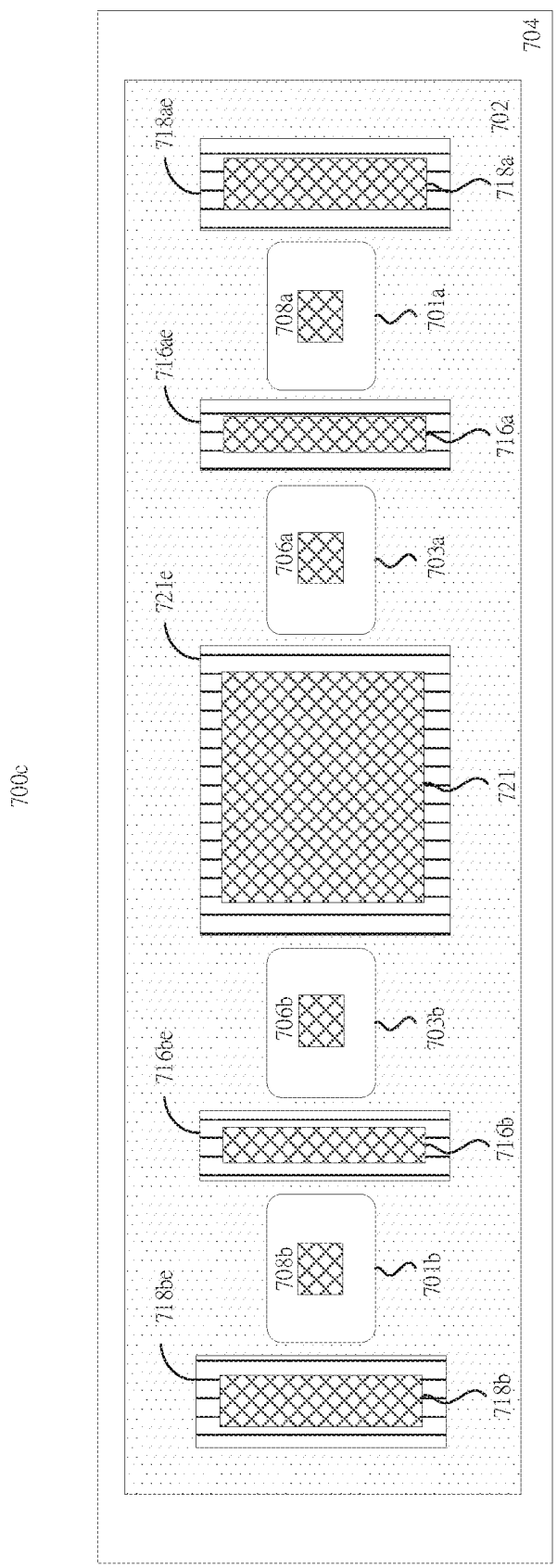
FIGS. 7C-7D illustrate planar views of a photo-detecting apparatus with surface depletion mode, according to some embodiments.
Figure 7D:
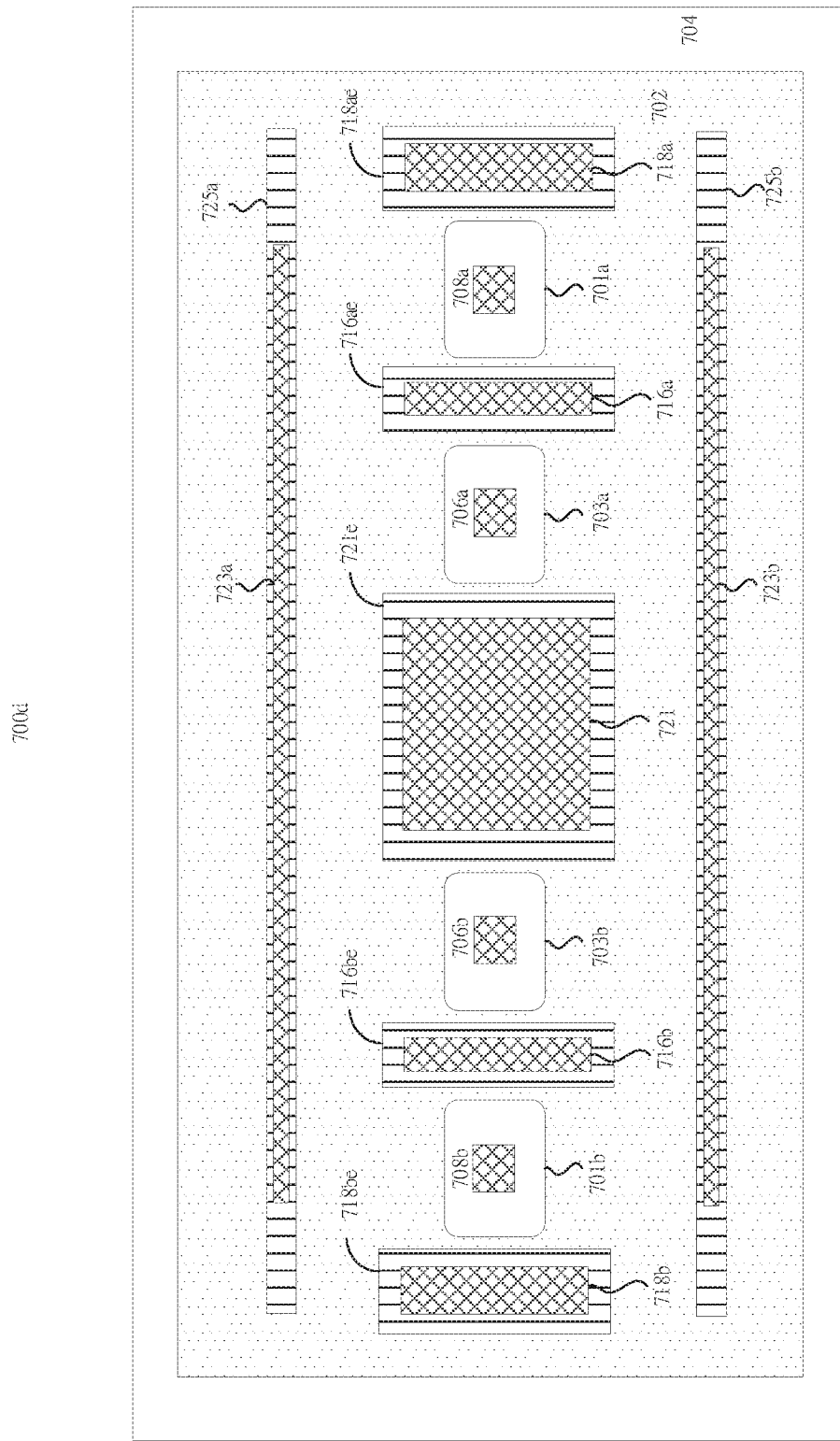

FIG. 7C illustrates a planar view of the photo-detecting apparatus 700B. It is noted that the metals 721, 716a, 716b, 718a, 718b and the polarized dielectrics 721c, 716ae, 716be, 718ae, 718be can be formed optionally. The device implementer can design a photo-detecting apparatus to include these elements or not based on different scenarios. Furthermore, in addition to adding the metals and polarized dielectrics in vertical direction as shown in FIG. 7C, there is also an alternative embodiment as shown in FIG. 7D, in which the metals 723a, 723b, and polarized dielectrics 725a, 725b are added in the horizontal direction.

Figure 8A:
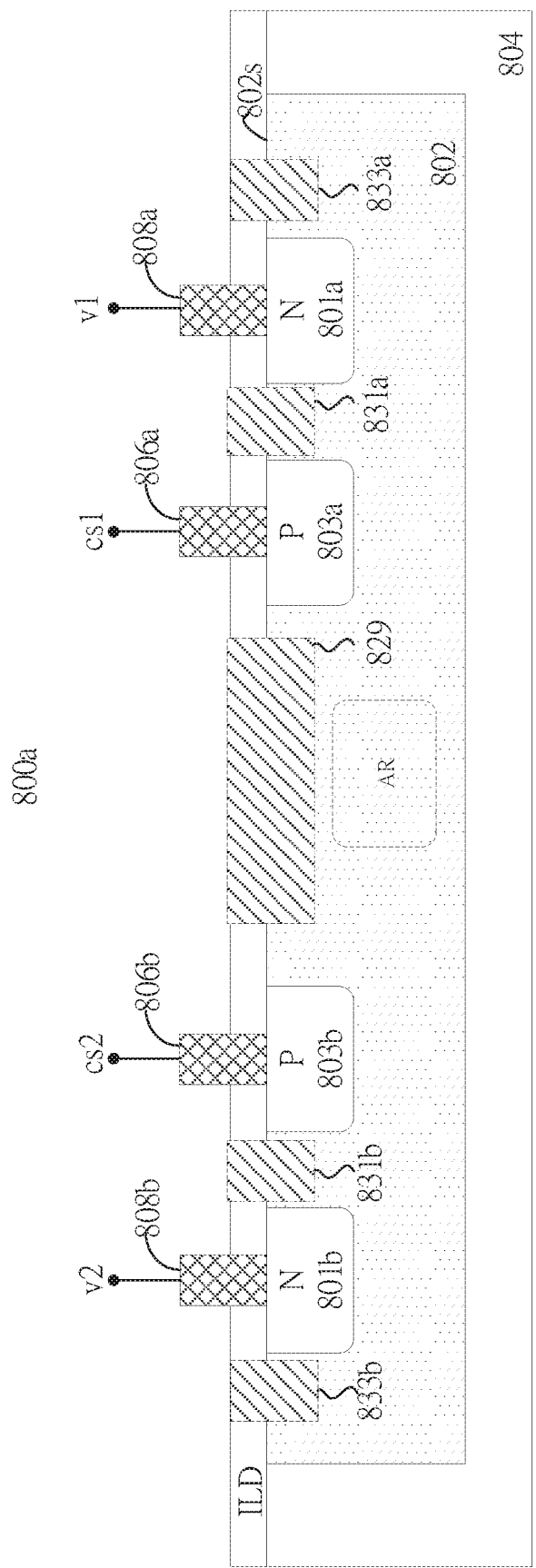
FIG. 8A illustrates a cross-sectional view of a photo-detecting apparatus with surface ion implantation, according to some embodiments.

FIG. 8A illustrates a cross-sectional view of a photo-detecting apparatus with surface ion implantation, according to some embodiments. The photo-detecting apparatus 800a includes control metal lines 806a, 806b and readout metal lines 808a, 808b. The control metal lines 806a, 806b and the readout metal lines 808a, 808b are electrically coupled to the surface 802s of the germanium-based light absorption material 802. The control metal lines 806a, 806b are respectively electrically coupled to the P-type regions 803a, 803b on the surface 802s, and the readout metal lines 808a, 808b are respectively electrically coupled to the N-type regions 801a, 801b on the surface 802s. In order to have a high surface resistance for a suppression of the surface leakage current, this embodiment utilizes neutral ion implantation as a surface treatment. As shown in this figure, the ion-processed regions 829, 831a, 831b, 833a, 833b are ion implanted (e.g., Si, Ge, C, H2), in which accelerated ions collide with the substance and make damage to the atomic periodicity or the crystalline structure in the area of implantation. The lattice damage such as atomic vacancies and interstitials breaks the periodic potential seen by electron envelope function, so the electrons/holes gain higher probability being scattered. This effect results into a lower mobility and hence a higher resistance.

Figure 8B:
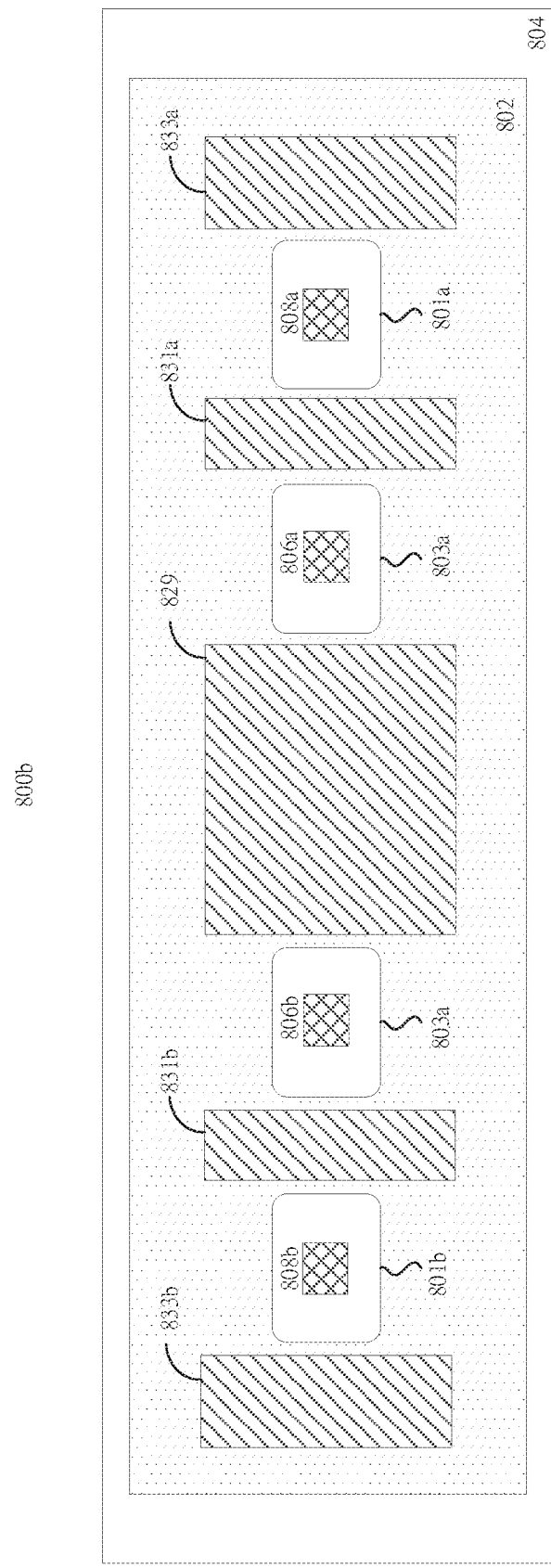
FIG. 8B illustrates a planar view of a photo-detecting apparatus with surface ion implantation, according to some embodiments.

FIG. 8B illustrates a planar view of a photo-detecting apparatus 800a with surface ion implantation, according to some embodiments. As shown in the figure, the ion-processed regions 829, 831a, 831b, 833a, 833b are vertically formed between the doped areas 801a, 801b, 803a, 803b. In some implementations, the ion-processed region(s) can be formed in other place(s), so the present embodiment is a reference rather than a limit.

Figure 9A:
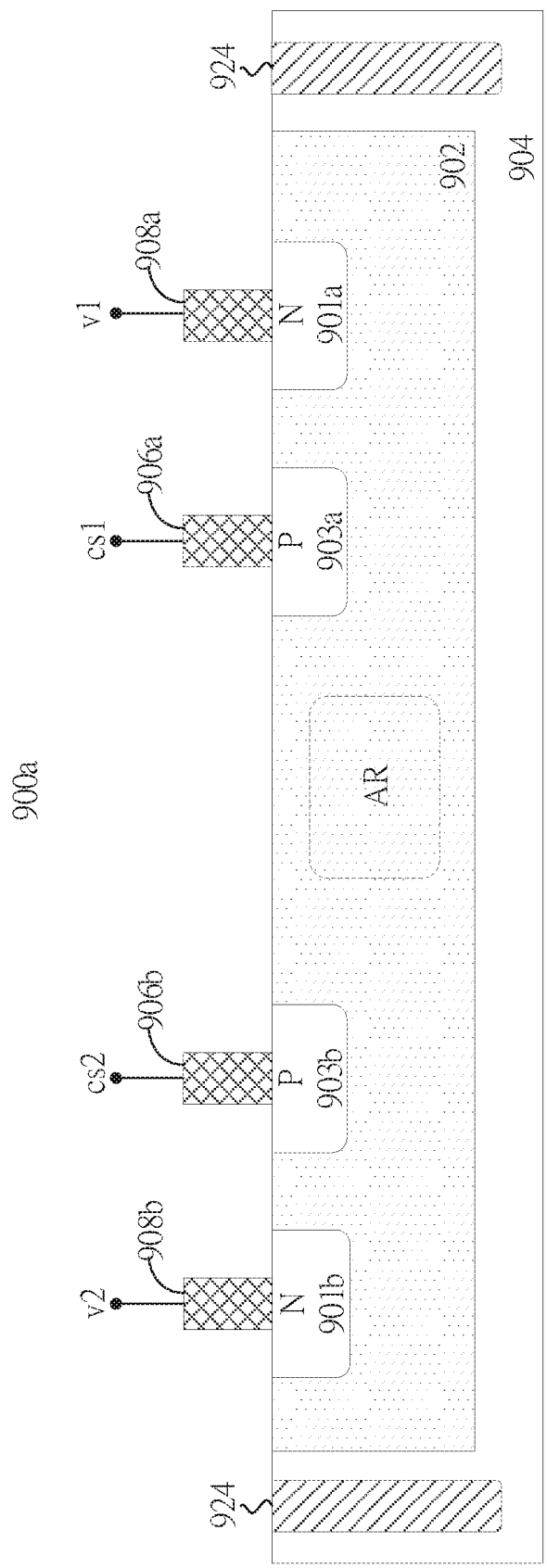
FIG. 9A illustrates a cross-sectional view of a photo-detecting apparatus with pixel to pixel isolation, according to some embodiments.

FIG. 9A illustrates a cross-sectional view of a photo-detecting apparatus with pixel to pixel isolation. The photo-detecting apparatus 900a includes control metal lines 906a, 906b and readout metal lines 908a, 908b. The control metal lines 906a, 906b and the readout metal lines 908a, 908b are electrically coupled to the surface 902s of the germanium-based light absorption material 902. The control metal lines 906a, 906b are respectively electrically coupled to the P-type regions 903a, 903b on the surface 902s, and the readout metal line 908a, 908b are respectively electrically coupled to the N-type regions 901a, 901b on the surface 902s. This embodiment includes an isolation region 924, which is formed as a ring surrounding the germanium-based light absorption material 902. In one implantation, the isolation region 924 is an N-type region. It depends on the types of the germanium-based light absorption material 902, the semiconductor substrate 904, and other factors, and the isolation region 924 may be implemented by a P-type region. With this isolation region 924, the photo-detecting apparatus 900a has the effect of reducing the cross-talk signals and/or powers to neighbor devices.

Figure 9B:
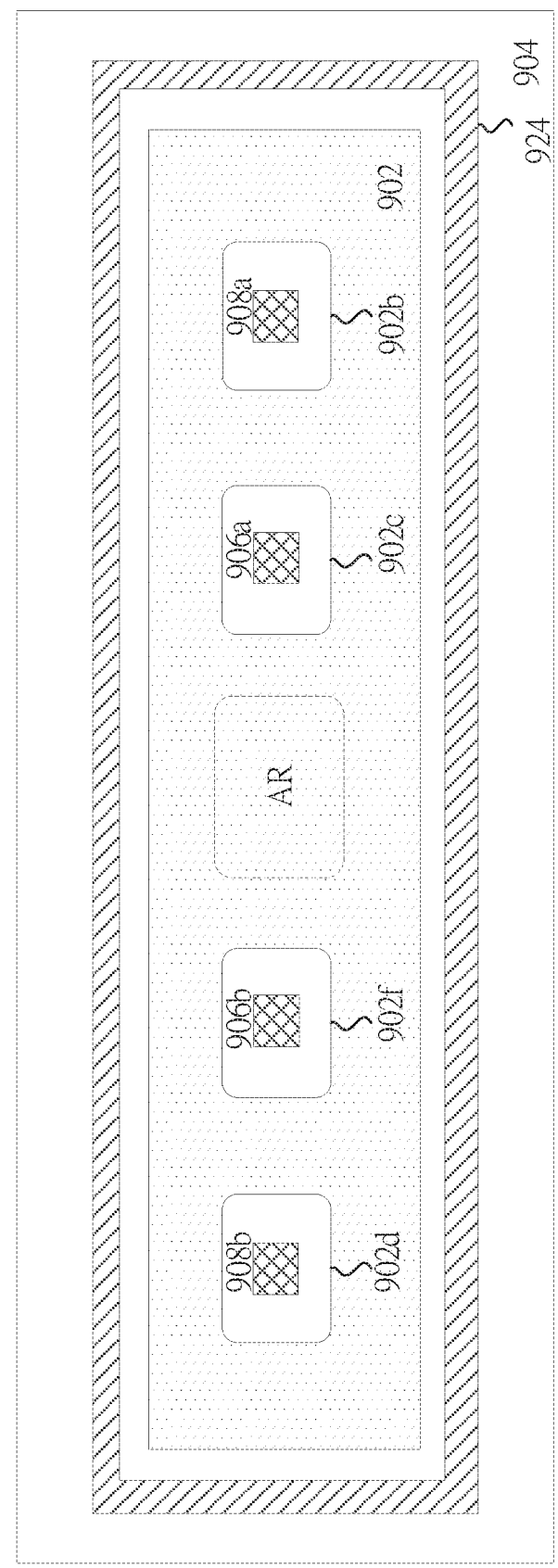
FIG. 9B illustrates a planar view of a photo-detecting apparatus with pixel to pixel isolation, according to some embodiments.

FIG. 9B illustrates a planar view of the photo-detecting apparatus 900a with pixel to pixel isolation. As shown in the figure, the isolation region 924 forms an entire ring. In other implementations, the isolation region 924 may be fragmented or discontinued.

Figure 9C:
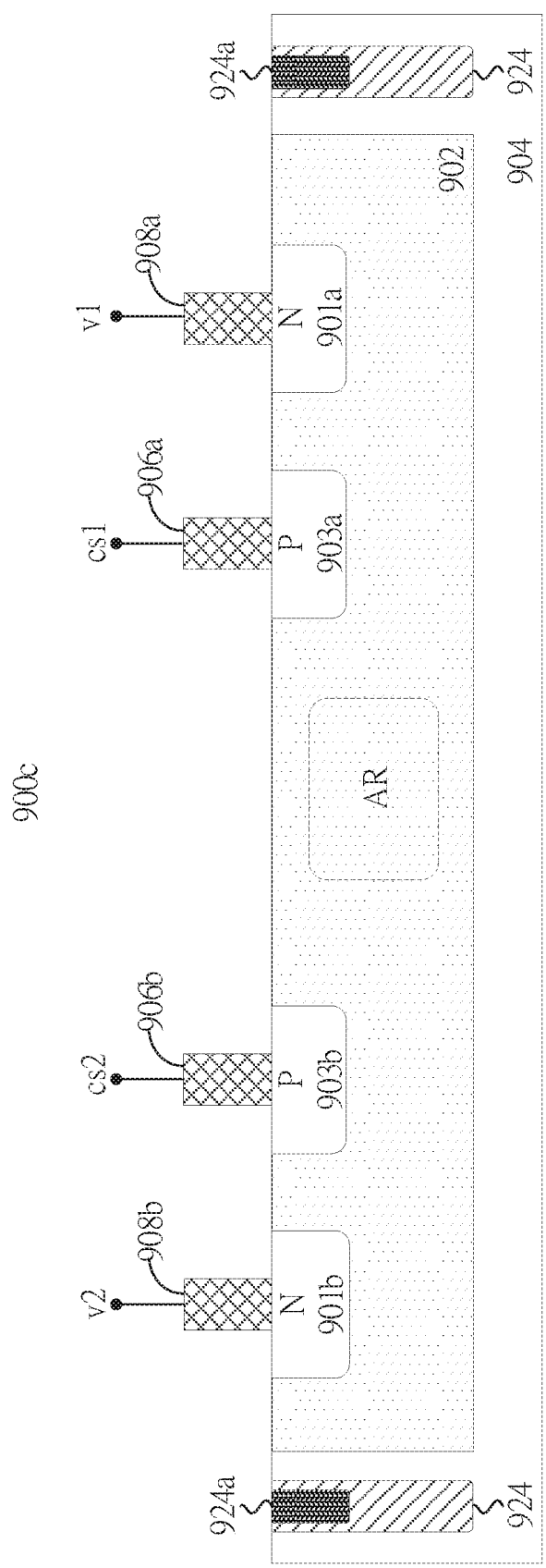
FIGS. 9C-9E illustrate cross-sectional views of a photo-detecting apparatus with pixel to pixel isolation, according to some embodiments.

FIG. 9C illustrates a cross-sectional view of a photo-detecting apparatus with pixel to pixel isolation. The photo-detecting apparatus 900c forms an additional narrow and shallow isolation region 924a inside isolation region 924. The doping concentration of the isolation region 924 and the doping concentration of the isolation region 924a are different. This may be applied to inhibit the crosstalk through surface conduction paths.

Figure 9D:
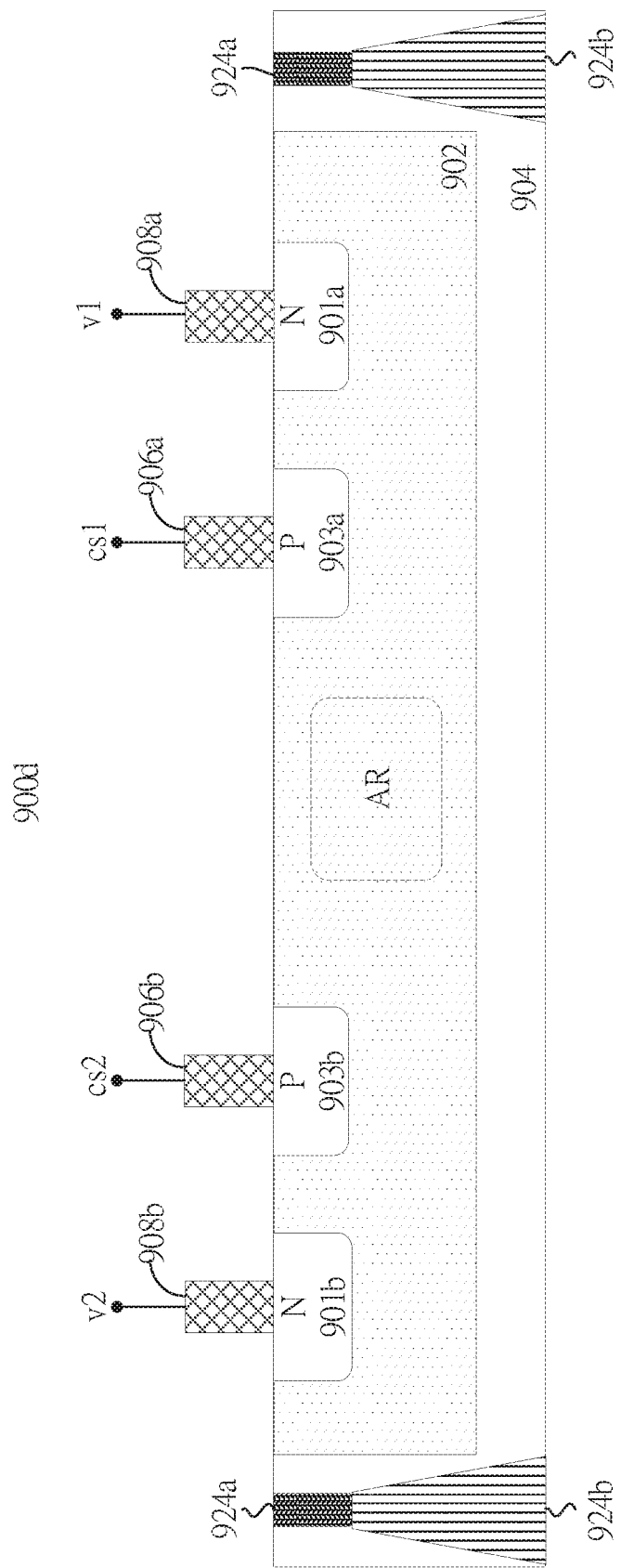

FIG. 9D illustrates a cross-sectional view of a photo-detecting apparatus with pixel to pixel isolation. The photo-detecting apparatus 900d forms an additional trench isolation region 924b extending from the isolation region 924a to the bottom surface of the semiconductor substrate 904. The trench isolation region 924b may be an oxide trench, in which block the electrical path between the germanium-based light absorption material 902 and adjacent devices.

Figure 9E:
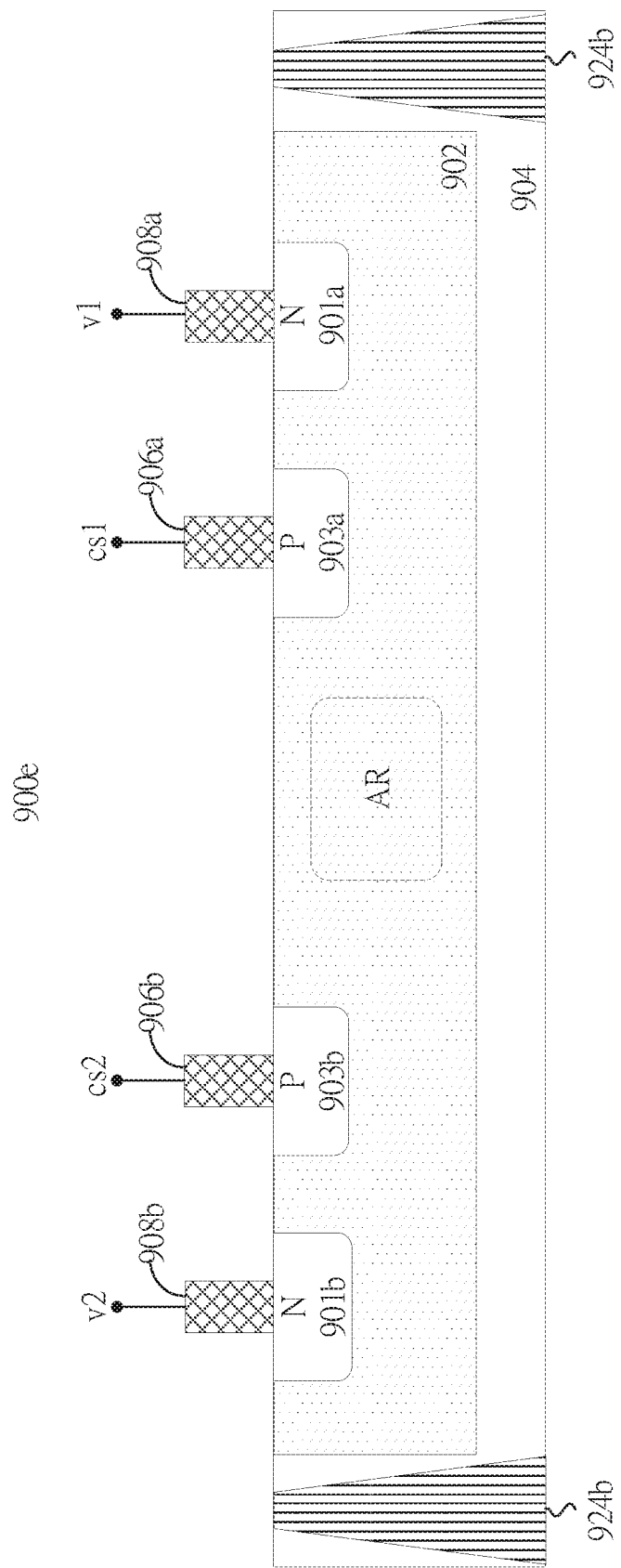

FIG. 9E illustrates a cross-sectional view of a photo-detecting apparatus with pixel to pixel isolation. The photo-detecting apparatus 900e forms a trench isolation region 924b extending from the top surface of the semiconductor substrate 904 to the bottom surface of the semiconductor substrate 904. The trench isolation region 924a may be an oxide trench, which blocks the electrical path between the germanium-based light absorption material 902 and adjacent devices.

Figure 10A:
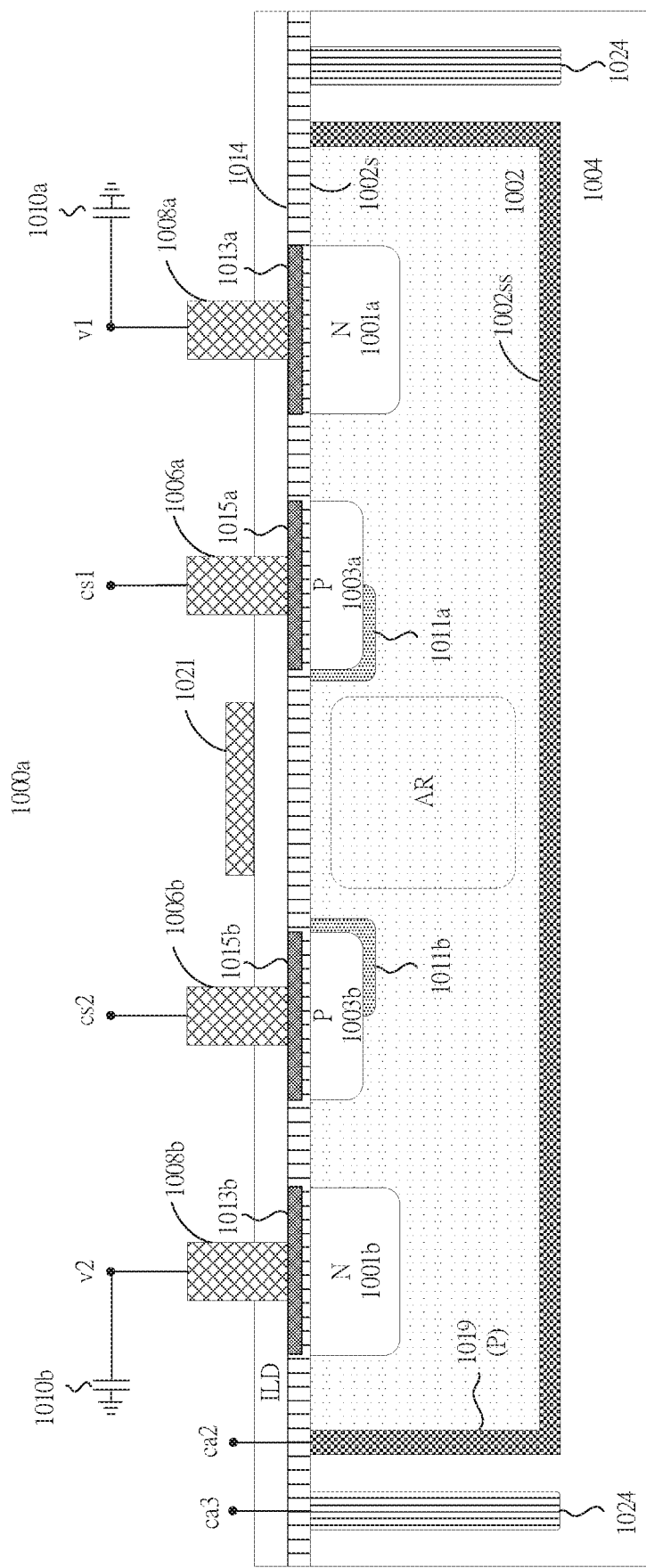
FIGS. 10A-10D illustrate cross-sectional views of a photo-detecting apparatus, according to some embodiments.

FIG. 10A illustrates a cross-sectional view of a photo-detecting apparatus, according to some embodiments. The embodiment of FIG. 10A includes and combines elements from the above embodiments. The photo-detecting apparatus 1000a includes control metal lines 1006a, 1006b and readout metal lines 1008a, 1008b. The control metal lines 1006a, 1006b and the readout metal lines 1008a, 1008b are electrically coupled to the surface 1002s of the germanium-based light absorption material 1002. The control metal lines 1006a, 1006b are respectively electrically coupled to the P-type regions 1003a, 1003b on the surface 1002s. The readout metal lines 1008a, 1008b are respectively electrically coupled to the N-type regions 1001a, 1001b on the surface 1002s. Similarly, the photo-detecting apparatus 1000a is able to obtain a distance information by the optical signal IL. Specifically, when the optical signal IL is incoming to the absorbed region AR, it will be converted into electron-hole pairs and then separated by the electrical field generated between the P-type regions 1003a, 1003b. The electrons may move toward either N-type region 1001a or N-type region 1001b according to the control signals cs1, cs2. In some implementations, the control signals cs1 and cs2 are differential voltage signals. In some implementations, one of the control signals cs1 and cs2 is a constant voltage signal (e.g., 0.5 v) and the other control signal is a time-varying voltage signal (e.g., sinusoid signal, clock signal or pulse signal; in-between 0V and 1V). Due to a distance existing between the photo-detecting apparatus 1000a and the target object (not shown in FIG. 10A), the optical signal IL has a phase delay with respect to the transmitted light transmitted by a transmitter (not shown in FIG. 10A). The transmitted light is modulated by a modulation signal and the electron-hole pairs are demodulated through the control metal lines 1006a and 1006b by another modulation signal. The electrons or the holes stored in the capacitor 1010a and capacitor 1010b will be varied according to the distance. Therefore, the photo-detecting apparatus 1000a can obtain the distance information based on the voltage v1 on the capacitor 1010a and the voltage v2 on the capacitor 1010b. According to one embodiment, the distance information can be derived based on calculations with voltage v1 and voltage v2 as input variables. For one example, in a pulse time-of-flight configuration, voltage ratios related to voltage v1 and voltage v2 are used as input variables. In another example, in a continuous-wave time-of-flight configuration, in-phase and quadrature voltages related voltage v1 and voltage v2 are used as input variables.

In addition to detecting the distance, this photo-detecting apparatus 1000a includes a different depth design for N-type regions 1001a, 1001b and P-type regions 1003a, 1003b, and also adds N-well 1011a, 1011b, which may reduce the leakage current between the P-type region 1003a and the P-type region 1003b. Second, the photo-detecting apparatus 1000a includes a well-shape P-type region 1019 covering the germanium-based light absorption material 1002, which may collect and discharge the holes through the bias voltage ca2. Third, the photo-detecting apparatus 1000a includes the passivation layer 1014 and inter-layer dielectric ILD to process the surface 1002s to the defects existing on the surface 1002s. Fourth, the photo-detecting apparatus 1000a includes the metal 1021, which may or may not be biased to generate the accumulation, inversion, or depletion on the surface 1002s. Moreover, the metal 1021 can be used as a mirror to reflect the residual optical signal IL back into the germanium-based light absorption material 1002 to be converted to electron-hole pairs. Fifth, the photo-detecting apparatus 1000a adds silicides 1013a, 1013b, 1015a, 1015b to reduce the voltage drop. Sixth, the photo-detecting apparatus 1000a can add the isolation region 1024, either implemented by doping materials or insulating oxides. The isolation region 1024 may be electrically coupled to a bias voltage ca3. In some implementations, the isolation region 1024 and the P-type region 1019 may be electrically coupled together by a metal layer, and the metal layer is left floated or being electrically coupled to a voltage source.

Figure 10B:
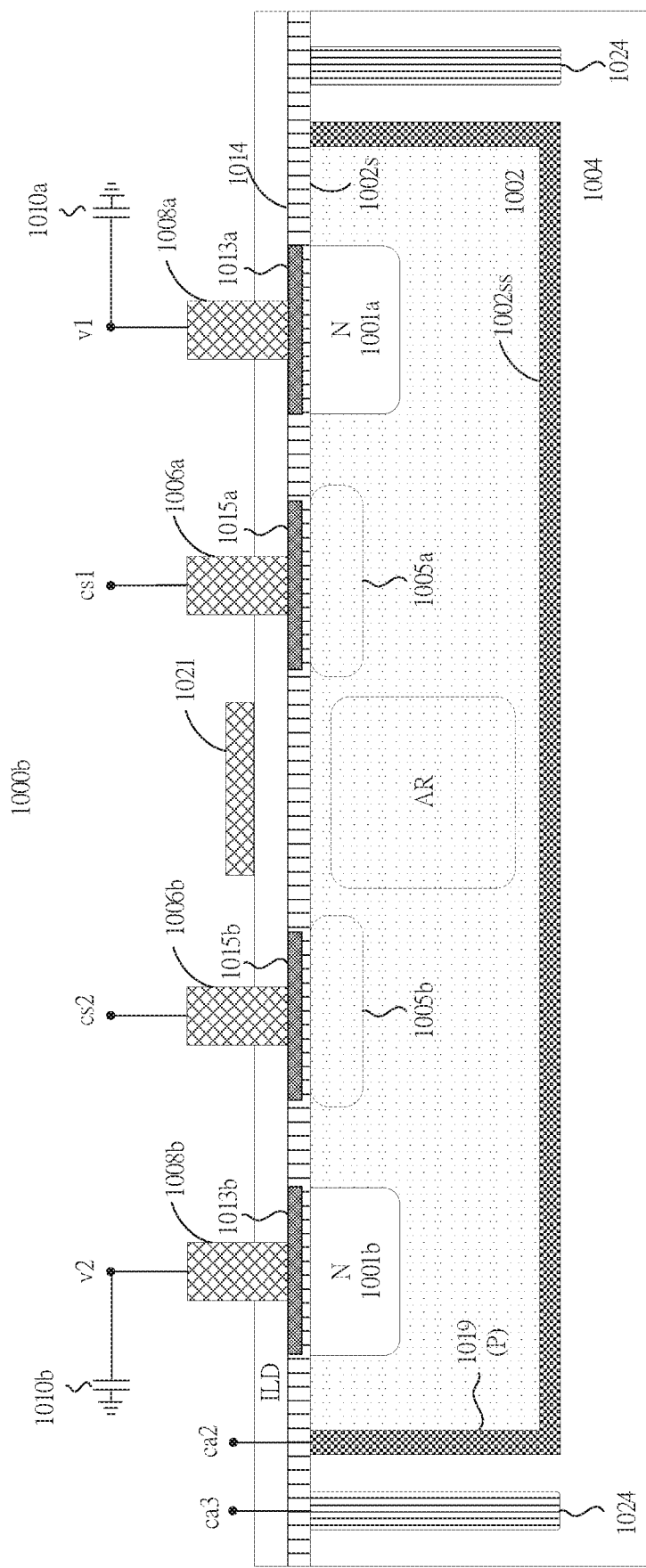

FIG. 10B illustrates a cross-sectional view of a photo-detecting apparatus, according to some embodiments. The structure of the photo-detecting apparatus 1000b is similar to the photo-detecting apparatus 1000a. The difference is that the control metal lines 1006a, 1006b in FIG. 10B are electrically coupled to the un-doped regions 1005a, 1005b.

Figure 10C:
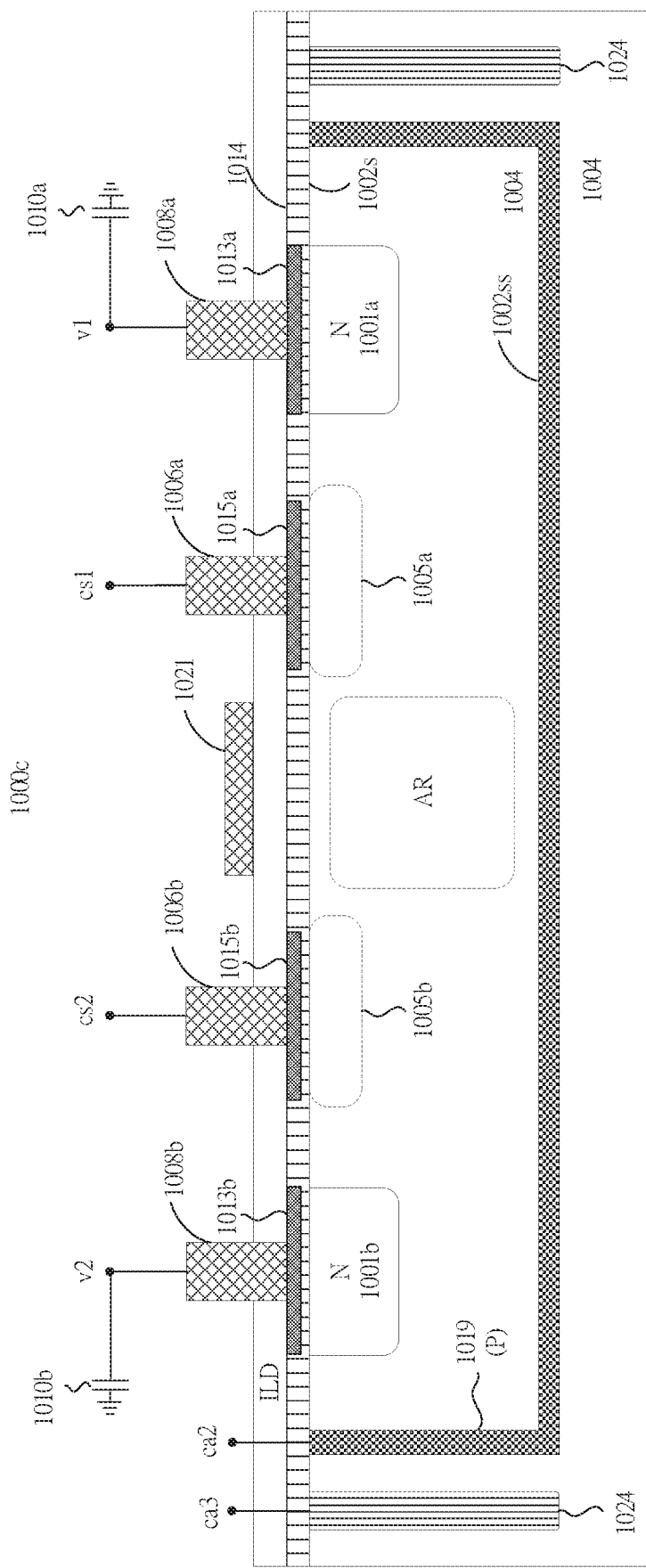
Figure 10D:
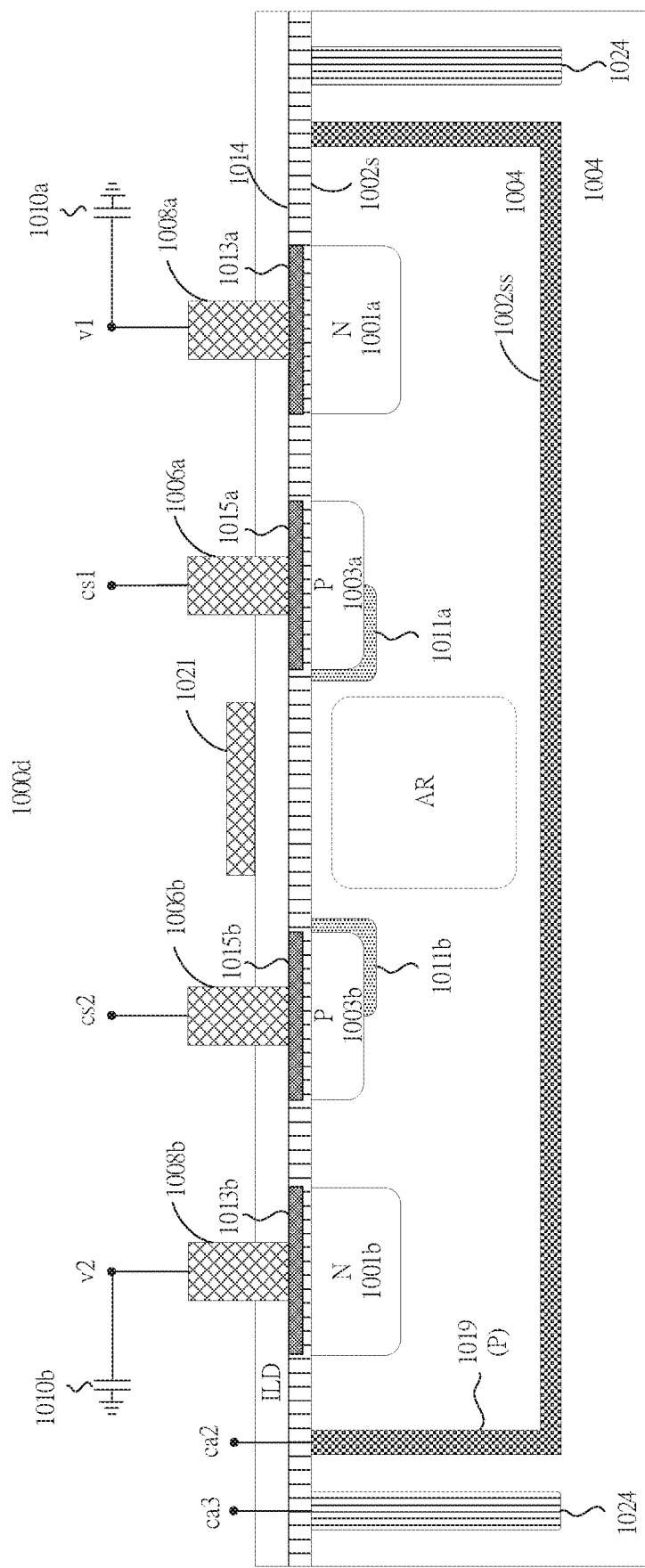

Furthermore, although the above-mentioned embodiments use a germanium-based light absorption material 1002 to absorb the optical signal IL, one embodiment without germanium-based light absorption material 1002 may be implemented. As shown in FIG. 10C, photo-detecting apparatus 1000c can use the semiconductor substrate 1004 as the light absorption material. In some implementations, the semiconductor substrate 1004 can be silicon, silicon-germanium, germanium, or III-V compounds. Besides, P-type regions 1003a, 1003b and N-wells 1011a, 1011b may be added on the surface 1002s of the semiconductor substrate 1004, as the embodiment illustrated in FIG. 10D.

The photo-detecting apparatuses 1000a, 1000b, 1000c and 1000d are illustrated to show the possible combinations from embodiments (FIG. 1A to FIG. 9E) disclosed above. It is understood that the device implementer can arbitrarily combine two or more above embodiments to implement other photo-detecting apparatus(s) and numerous combinations may be implemented.

It is noted that the doping concentrations for the doped regions shown in the embodiments can be properly designed. Take the embodiment of FIG. 10A as an example, the doping concentrations of the N-type regions 1001a, 1001b and the doping concentrations of the P-type regions 1003a, 1003b could be different. In one implementation, the P-type regions 1003a, 1003b are lightly doped and N-type regions 1001a, 1001b are highly doped. In general, the doping concentration for the lightly doping may range from $10^{16}/cm^3$ or less to $10^{18}/cm^3$, and the doping concentration for the highly doping may range from $10^{18}/cm^3$ to $10^{20}/cm^3$ or more. Through the doping concentration adjustment, the Schottky contacts can be formed between the control metal lines 1006a, 1006b and the P-type regions 1003a, 1003b respectively; and the Ohmic contacts can be formed between the readout metal lines 1008a, 1008b and N-type regions 1001a, 1001b respectively. In this scenario, the resistances between control metal lines 1006a, 1006b and the P-type regions 1003a, 1003b are higher than the resistances between readout metal lines 1008a, 1008b and the N-type regions 1001a, 1001b.

On the other hands, the doping type for those doped regions can also be implemented in different ways. Take the embodiment of FIG. 10A as an example, The P-type regions 1003a, 1003b can be replaced by N-type if the regions 1003a, 1003b are doped with N-type dopants. Similarly, the N-type regions 1001a, 1001b can be replaced by P-type if the regions 1001a, 1001b are doped with P-type dopants. Therefore, it is possible to implement an embodiment that the doped regions 1001a, 1001b, 1003a and 1003b all are doped with same type dopants.

Figure 11A:
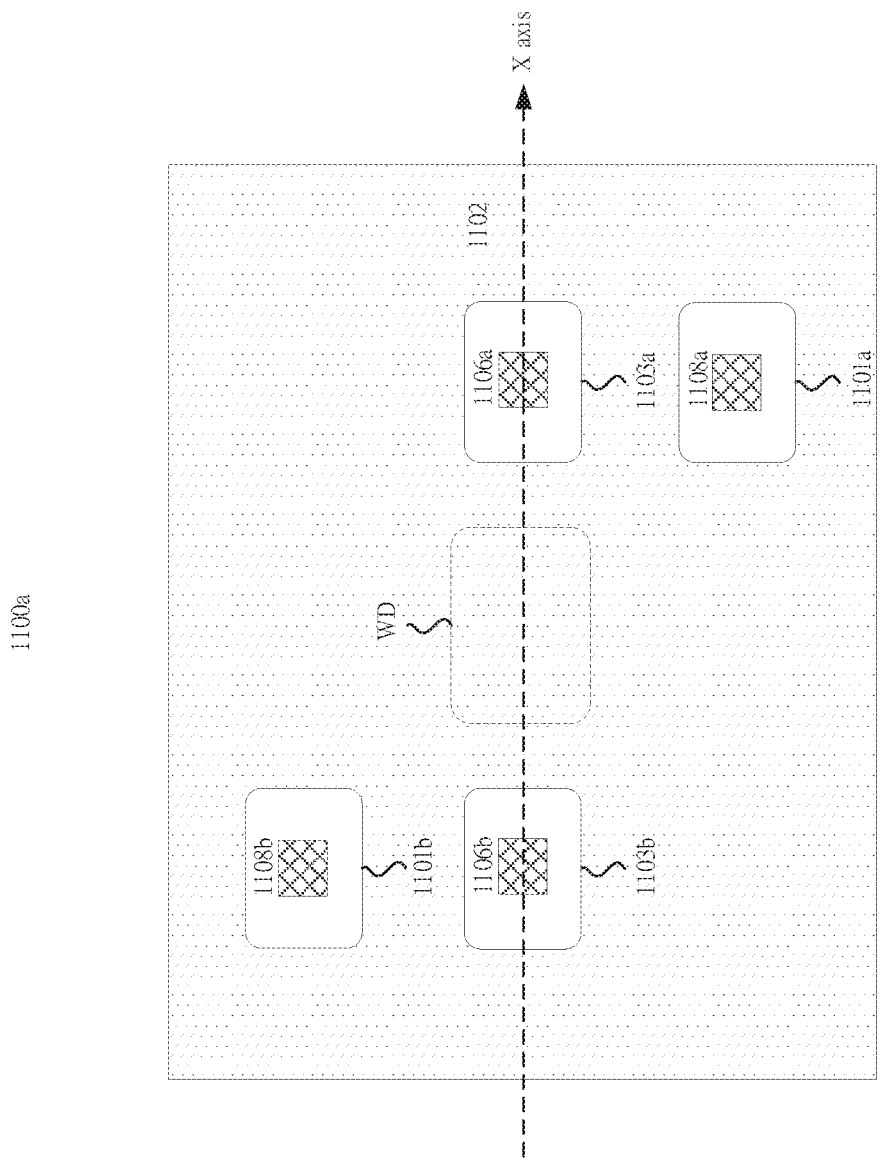
FIGS. 11A-11E illustrate planar views of a photo-detecting apparatus with chip size miniaturization, according to some embodiments.

Please refer to FIG. 11A, which illustrates a planar view of a photo-detecting apparatus, according to some embodiments. The photo-detecting apparatus 1100a includes the layout positions for control metal lines 1106a, 1106b, readout metal lines 1108a, 1108b, N-type regions 1001a, 1001b and P-type regions 1003a, 1003b on the germanium-based light absorption material 1102. In this embodiment, the control metal lines 1106a, 1106b are positioned on the axis X axis, however, readout metal lines 1108a, 1108b are not positioned on the axis X axis. In this embodiment, the four terminals are not on the same axis, which may reduce the area of the photo-detecting apparatus 1100a. The geometric relations between each element are shown in FIG. 11A.

Figure 11B:
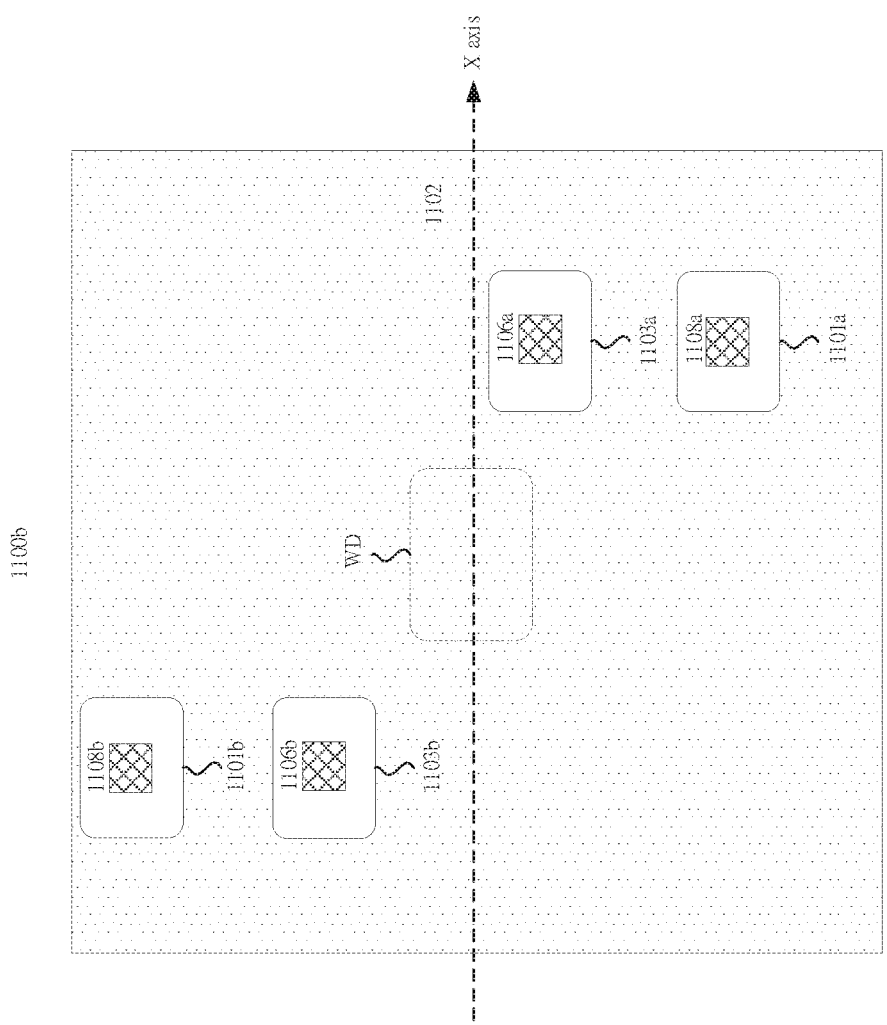

FIG. 11B illustrates a planar view of a photo-detecting apparatus, according to some embodiments. Compared to FIG. 11A, the control metal lines 1106a, 1106b are not positioned on the axis X axis, but respectively aligned with readout metal lines 1108a, 1108b in the direction perpendicular to the axis X axis. Similarly, the geometric relations between each element are shown in FIG. 11B.

Figure 11C:
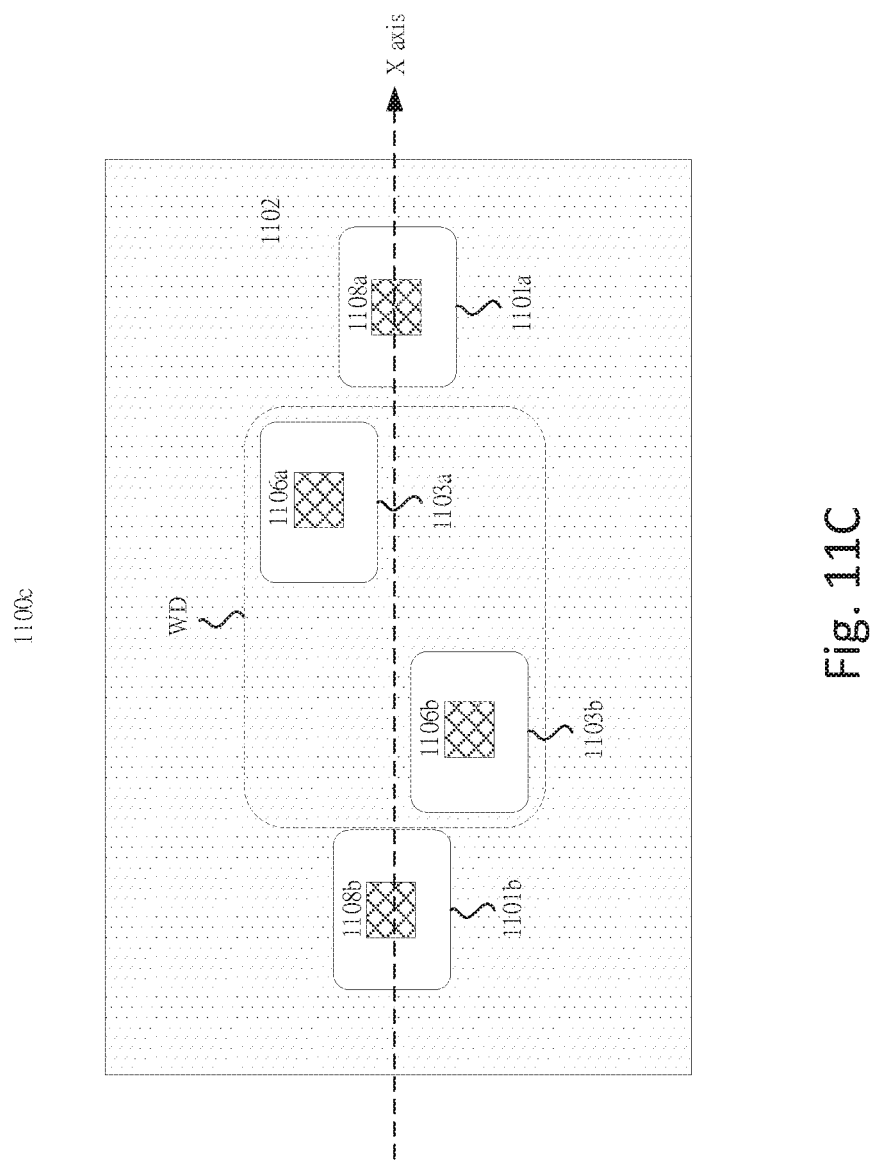

FIG. 11C illustrates a planar view of a photo-detecting apparatus, according to some embodiments. The control metal lines 1106a, 1106b are formed above the absorbed region AR and opposing each other in a diagonal direction in the optical window WD. The readout metal lines 1108a, 1108b are formed on the axis X axis.

Figure 11D:
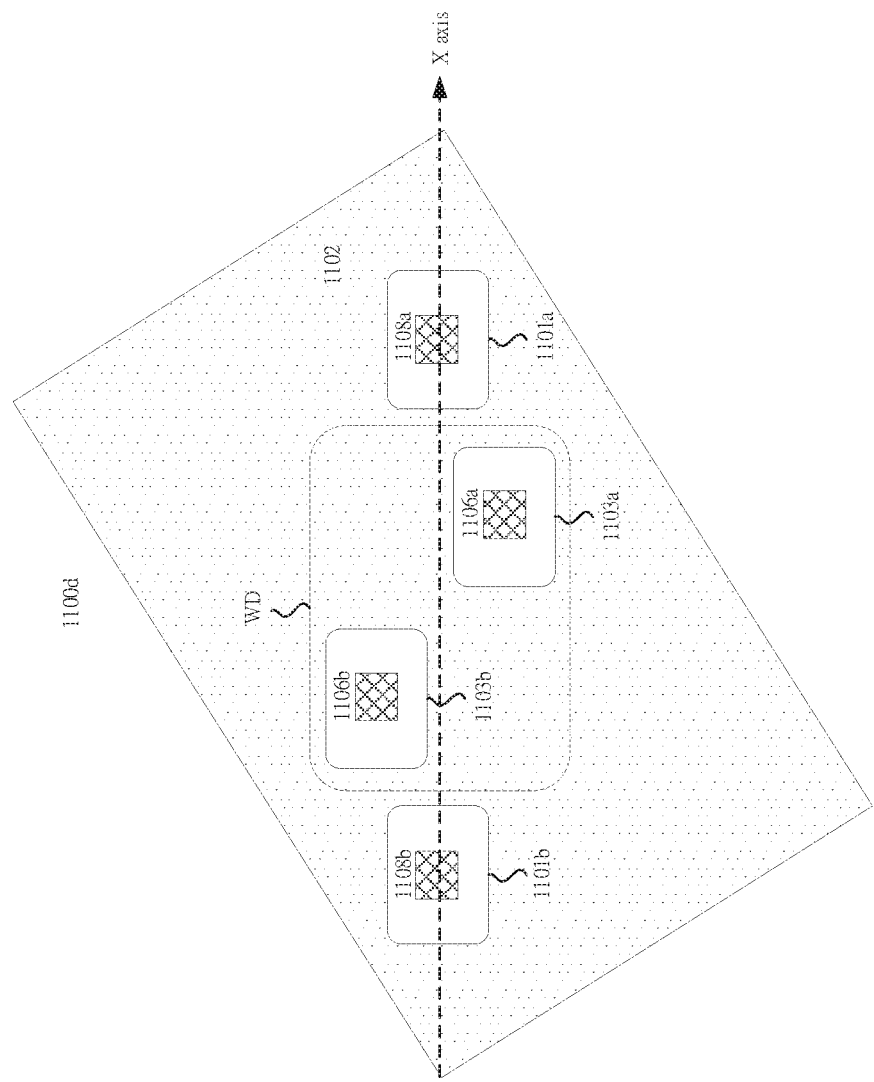

FIG. 11D illustrates a planar view of a photo-detecting apparatus, according to some embodiments. The photo-detecting apparatus in FIG. 11D is similar to that in FIG. 11C, but the germanium-based light absorption material 1102 is rotated so that the axis X axis is in a diagonal direction in the germanium-based light absorption material 1102. It may also reduce the overall area of the photo-detecting apparatus.

Figure 11E:
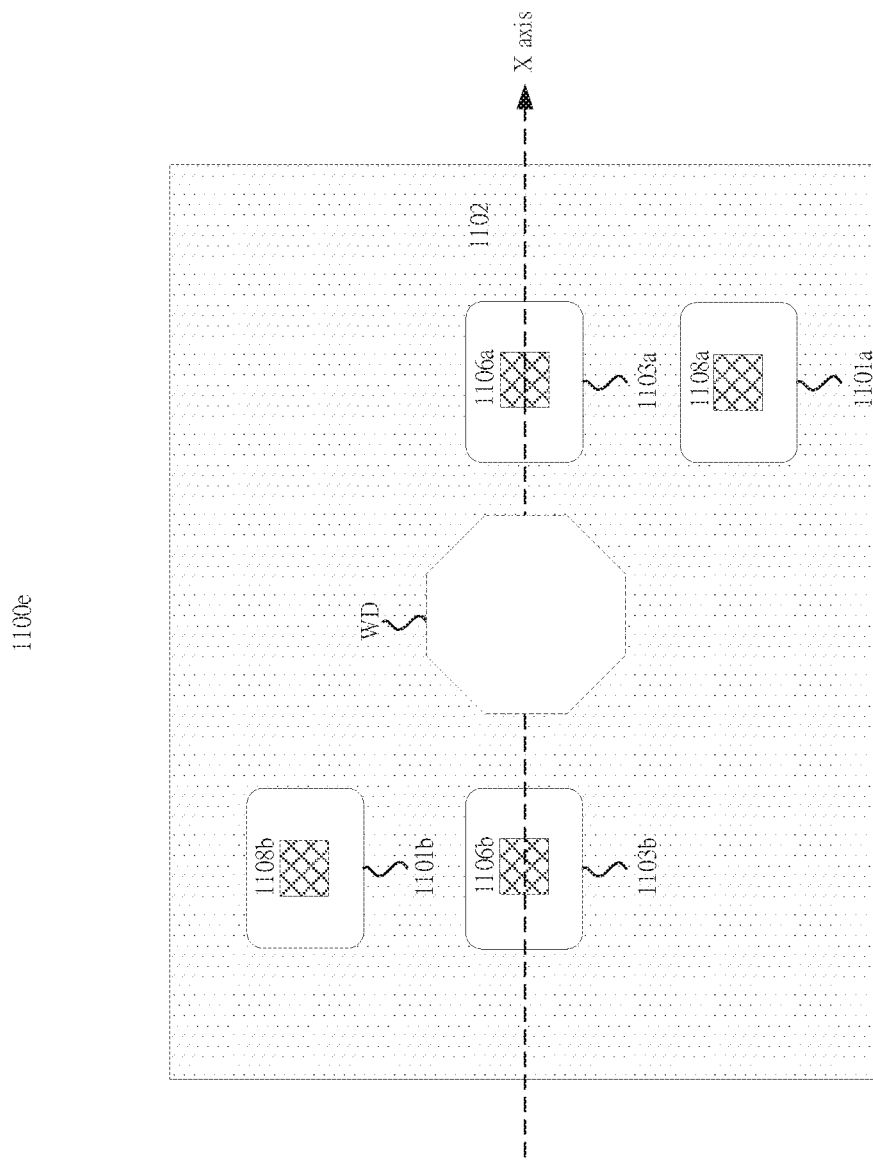

FIG. 11E illustrates a planar view of a photo-detecting apparatus, according to some embodiments. The difference between this embodiment and previous embodiments is the optical window WD can be designed as an Octagon. It can also be designed as other shapes (e.g. circle and hexagon etc.).

FIG. 11A-FIG. 11D illustrates some embodiments by adjusting the layout positions for control metal lines 1106a, 1106b, readout metal lines 1108a, 1108b, N-type regions 1001a, 1001b, and P-type regions 1003a, 1003b. The implementer can also design different geometric relations for these elements to reduce or minimize the chip area. These alternative embodiments are illustrated as a reference, not a limit.

The photo-detecting apparatuses described above use a single photodetector as an embodiment, which is for single-pixel applications. The photo-detecting apparatuses described below are the embodiments for multiple-pixel applications (e.g., image pixel array or image sensor).

In some implementations, the photo-detecting apparatus can be designed to receive the same or different optical signals, e.g., with the same or different wavelengths, with the same or multiple modulations, or being operated at different time frames.

Figure 12A:
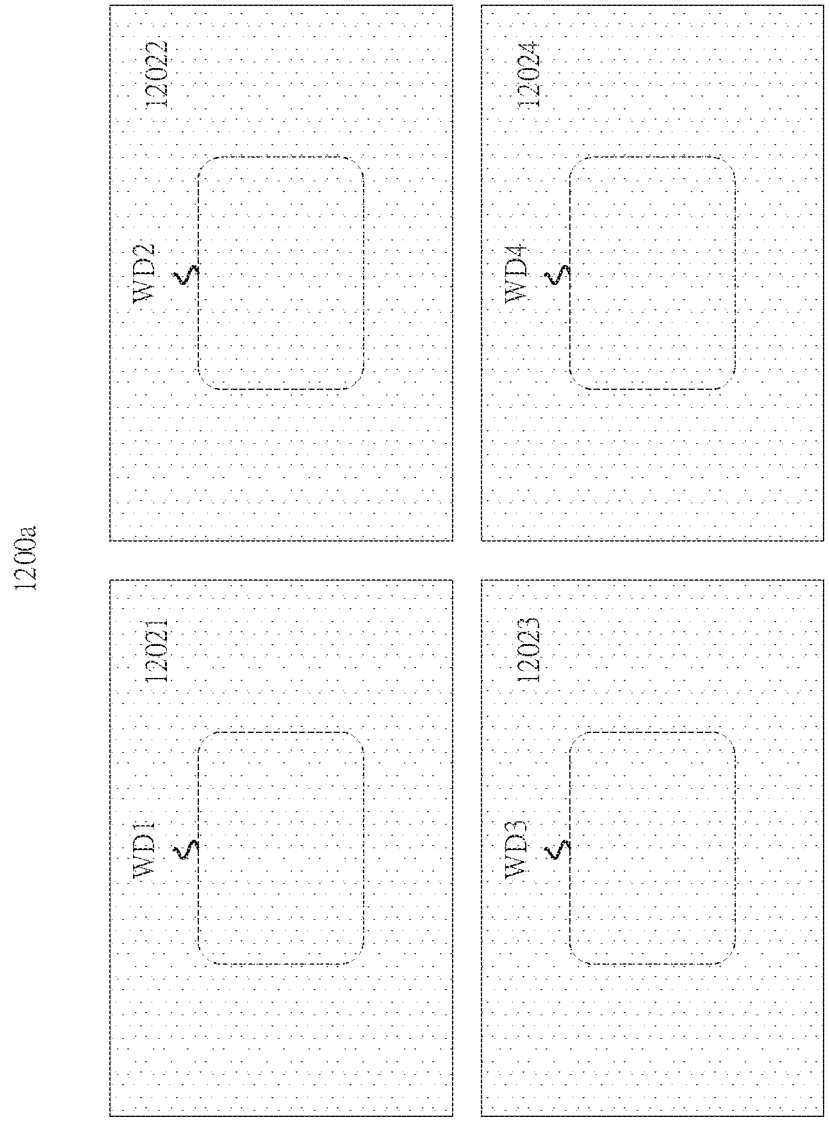
FIGS. 12A-12B illustrate planar views of array configurations of a photo-detecting apparatus, according to some embodiments.

Please refer to FIG. 12A. The photo-detecting apparatus 1200a comprises a pixel array, which includes four pixels 12021, 12022, 12023, 12024 as an example. Each pixel is a photodetector in accordance with the embodiments described herein. In one embodiment, optical signal IL that contains optical wavelength $\lambda_1$ is received by the pixels 12021, 12024 in this array, and optical signal IL that contains optical wavelength $\lambda_2$ is received by pixels 12022, 12023 in this array. In an alternative embodiment, there is only one optical wavelength $\lambda$ but having multiple modulation frequencies $f_{mod1}$ and $f_{mod2}$ (or more). For example, the pixels 12021, 12024 are applied with modulation frequency $f_{mod1}$ to demodulate this frequency component in the optical signal IL, and the pixels 12022, 12023 are applied with modulation frequency $f_{mod2}$ to demodulate this frequency component in the optical signal IL. In an alternative embodiment, similarly, there is only one optical wavelength $\lambda$ but having multiple modulation frequencies $f_{mod1}$ and $f_{mod2}$ (or more). However, at time $t_1$, the pixels in the array are driven by modulation frequency $f_{mod1}$ to demodulate this frequency component in the optical signal, while at another time $t_2$, the pixels in the array are driven by modulation frequency $f_{mod2}$ to demodulate this frequency component in the optical signal IL, and thus the pixel array 1200a is operated under time multiplexing mode.

In an alternative embodiment, optical wavelengths $\lambda_1$ and $\lambda_2$ are respectively modulated by $f_{mod1}$ and $f_{mod2}$, and then collected by pixel array 1200a. At time $t_1$, the pixel array 1200a is operated at $f_{mod1}$ to demodulate the optical signal in $\lambda_1$; while at time $t_2$, the pixel array 1200a is operated at $f_{mod2}$ to demodulate the optical signal in $\lambda_2$. In an alternative embodiment, an optical signal IL with optical wavelength $\lambda_1$ and $\lambda_2$ is modulated by $f_{mod1}$ and $f_{mod2}$, respectively, and the pixels 12021, 12024 are driven by $f_{mod1}$ while the pixels 12022, 12023 are driven by $f_{mod2}$ to demodulate the incoming modulated optical signal IL simultaneously. Those of skills in the art will readily recognize that other combinations of optical wavelength, modulation scheme and time division may be implemented.

Figure 12B:
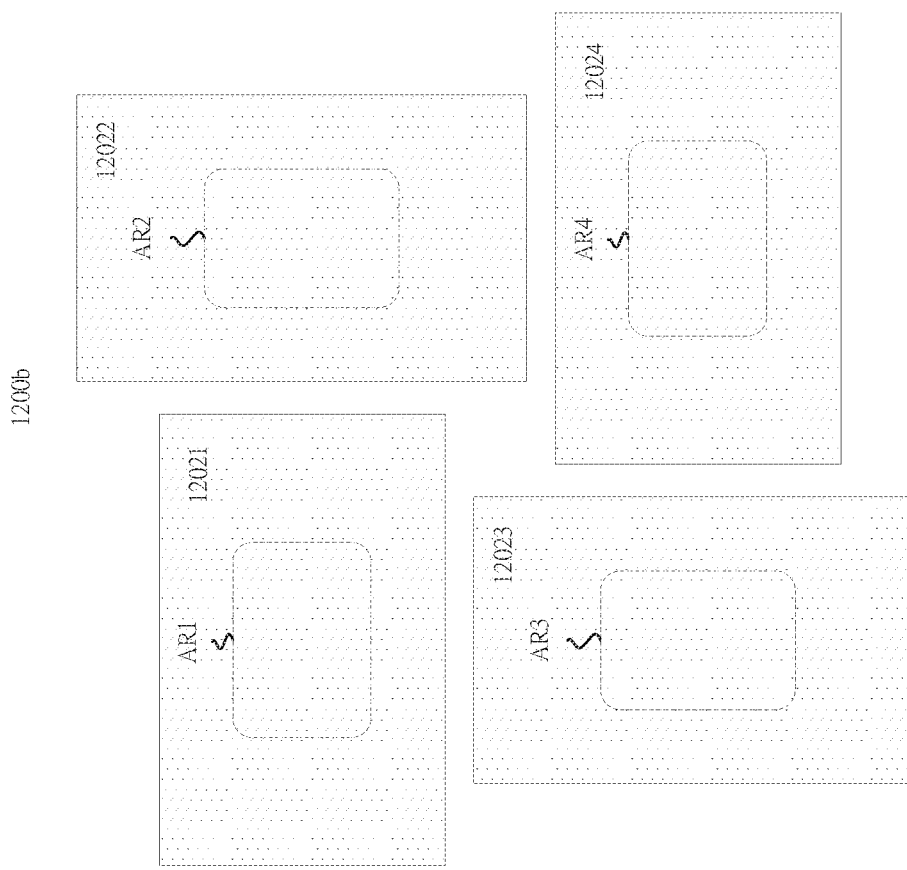

Please refer to FIG. 12B. The photo-detecting apparatus 1200b includes four pixels 12021, 12022, 12023, 12024. Each pixel is a photodetector and may use the embodiments disclosed above. In addition to the layout shown in FIG. 12A, the pixels 12021, 12022, 12023, 12024 can be arranged in a staggered layout as shown in FIG. 12B, in which the width and length of each pixel are placed in directions perpendicular to the width and length of the adjacent pixels.

Figure 13A:
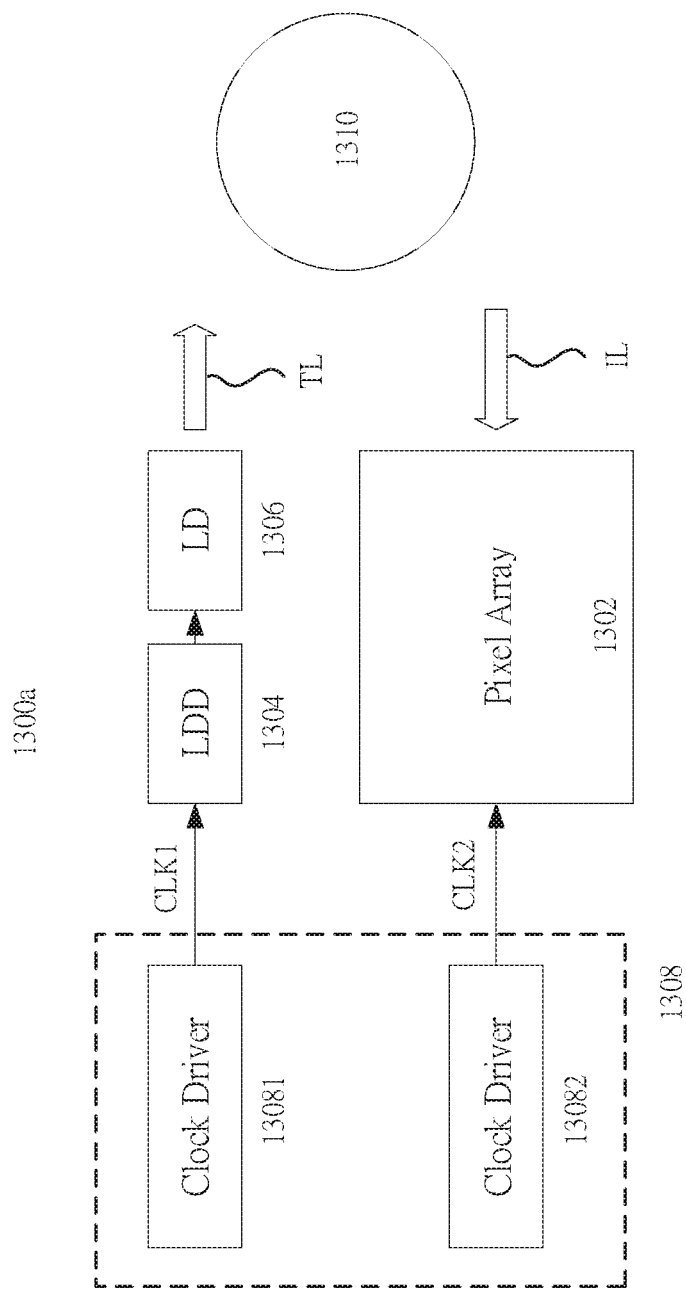
FIG. 13A-13E illustrate blocks and timing diagrams of a photo-detecting apparatus using modulation schemes with phase changes, according to some embodiments.

FIG. 13A illustrates a block diagram of a photo-detecting apparatus 1300a using modulation schemes with phase changes, according to some embodiments. The photo-detecting apparatus 1300a is an indirect time-of-flight based depth image sensor capable of detecting a distance information with the targeted object 1310. The photo-detecting apparatus 1300a includes a pixel array 1302, laser diode driver 1304, laser diode 1306, and clock driving circuit 1308 including clock drivers 13081, 13082. The pixel array 1302 includes a plurality of photodetectors in accordance with the embodiments disclosed herein. In general, the sensor chip generates and sends out the clock signals for 1) modulating the transmitted optical signal by the laser diode driver 1304 and 2) demodulating the received/absorbed optical signal by the pixel array 1302. To obtain the depth information, all photodetectors in an entire pixel array are demodulated by referencing the same clock, which changes to possible four quadrature phases, e.g., 0°, 90°, 180° and 270°, in a temporal sequence and there is no phase change at the transmitter side. However, in this embodiment, the 4-quadrature phase changes are implemented at the transmitter side, and there is no phase change at the receiving side, as explained in the following.

Figure 13B:
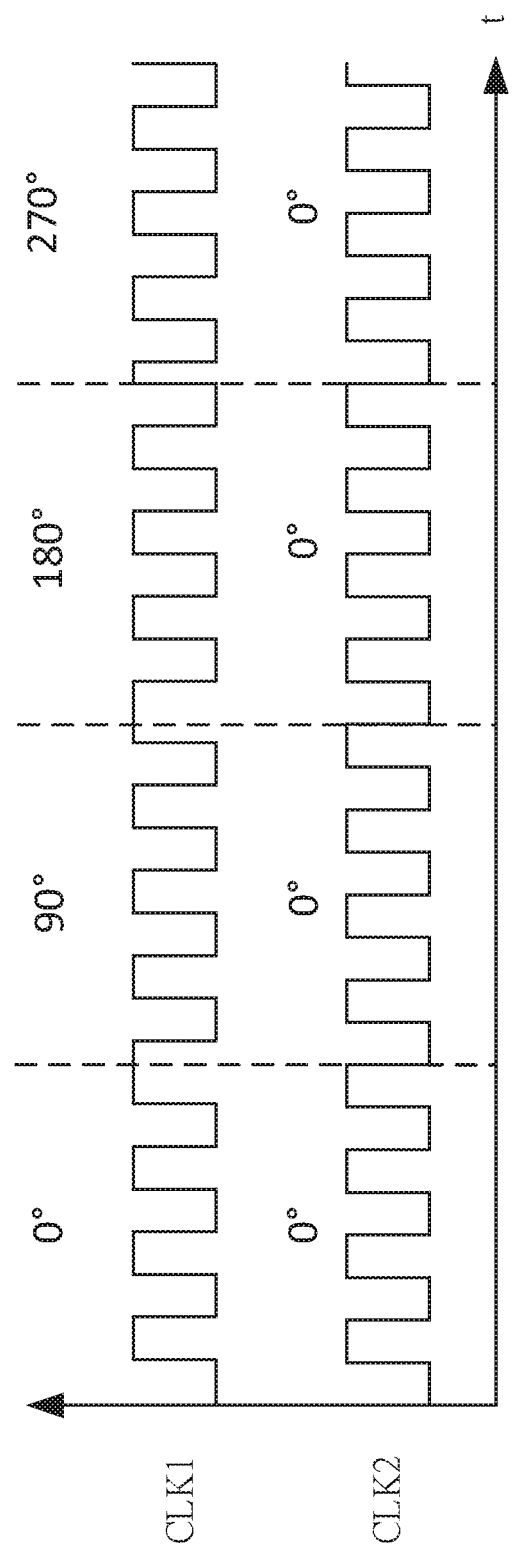

Please refer to FIG. 13B, which depicts a timing diagram of the clock signals CLK1, CLK2 generated by clock drivers 13081, 13082, respectively. The clock signal CLK1 is a modulation signal with 4-quadrature phase changes, e.g., 0°, 90°, 180° and 270°, and clock signal CLK2 is a demodulation signal without phase change. Specifically, the clock signal CLK1 drives the laser diode diver 1304 so that the laser diode 1306 can generate the modulated transmitted light TL. The clock signal CLK2 and its reversed signal CLK2' (not shown in FIG. 13B) are used as the control signal cs1 and control signal cs2 (shown in the above embodiments), respectively, for demodulation. In other words, the control signal cs1 and control signal cs2 in this embodiment are differential signals. This embodiment may avoid the possible temporal coherence inherent in an image sensor due to parasitic resistance-capacitance induced memory effects.

Figure 13C:
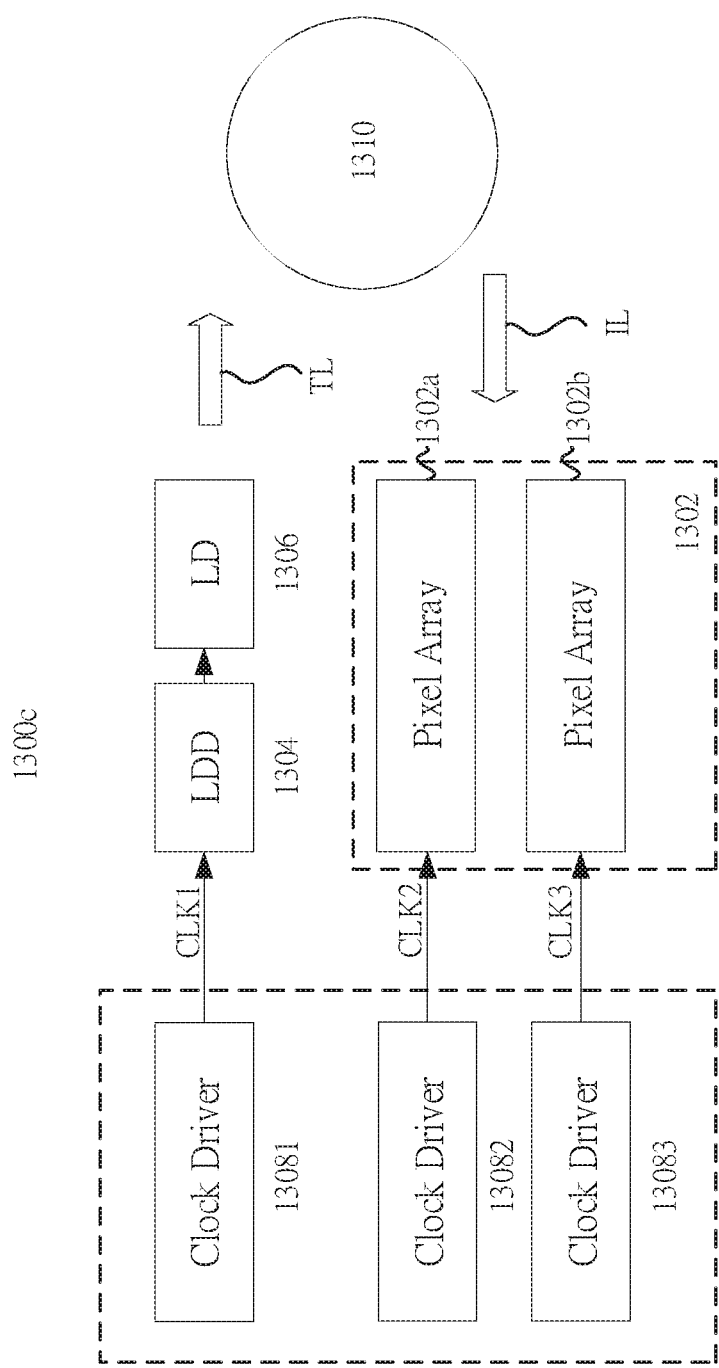
Figure 13D:
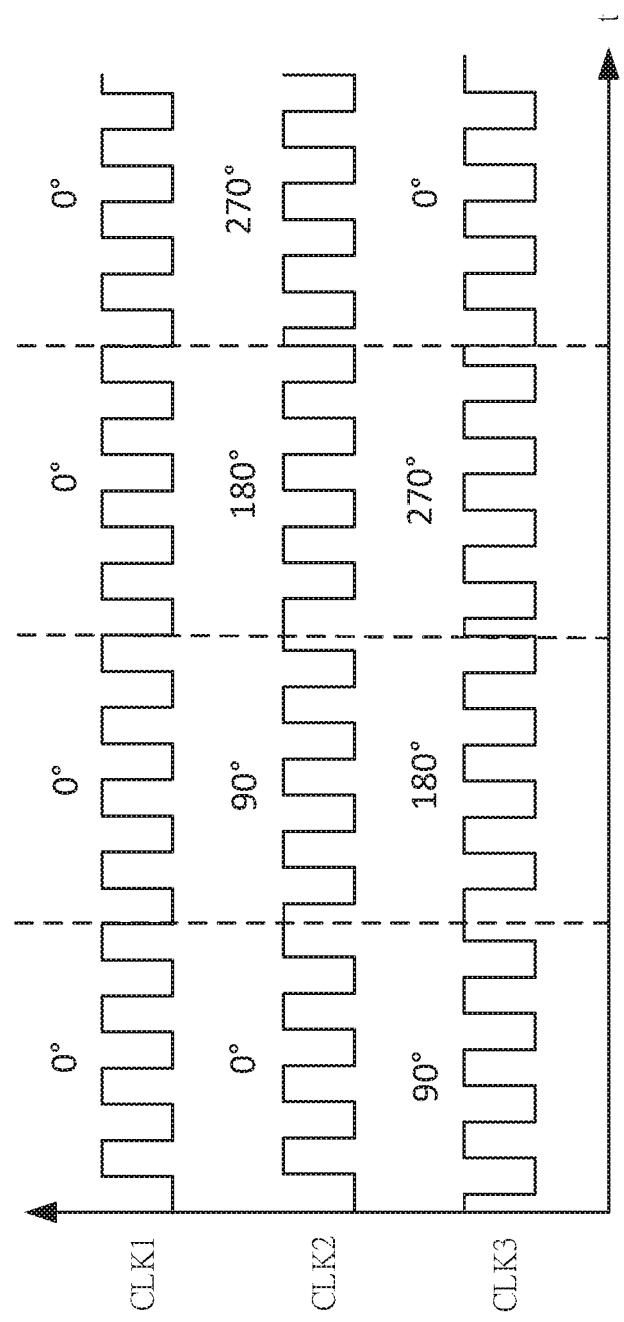

Please refer to FIG. 13C and FIG. 13D. Compared to the FIG. 13A, the photo-detecting apparatus 1300c uses two demodulation schemes at the receiving side. The pixel array 1302 includes two portions, the first pixel array 1302a and the second pixel array 1302b. The first demodulation scheme applied to the first pixel array 1302a and the second demodulation scheme applied to the second pixel array 1302b are different in temporal sequence. For example, the first pixel array 1302a is applied with the first demodulation scheme, in which the phase changes in temporal sequence are 0°, 90°, 180° and 270°. The second pixel array 1302a is applied with the second demodulation scheme, in which the phase changes in temporal sequence are 90°, 180°, 270° and 0°. The net effect is the phase changes in the first pixel array 1302a are in phase quadrature to the phase changes in the second pixel array 1302b, while there are no phase changes at the transmitting side. This operation may reduce the max instantaneous current drawn from the power supply if the demodulation waveform is not an ideal square wave.

Figure 13E:
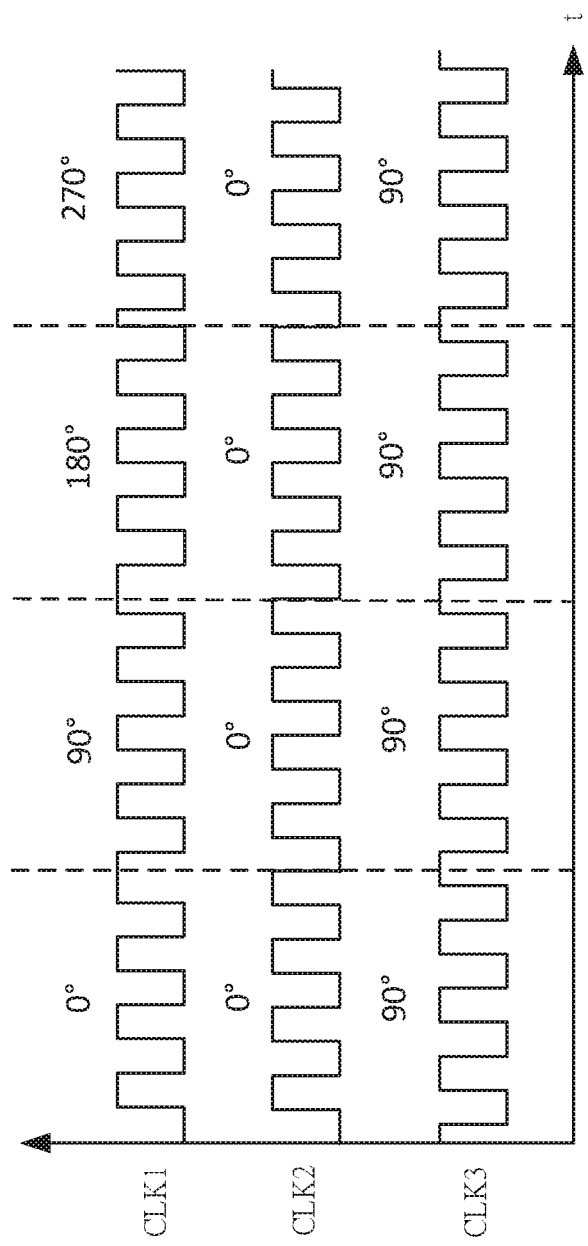

Please refer to FIG. 13E, which shows a modulation scheme using the photo-detecting apparatus 1300c. Compared to FIG. 13D, this embodiment applies phase changes to the transmitting side, but does not apply phase changes to the two different pixel arrays 1302a, 1302b at the receiving side, except setting two different constant phases to the two different pixel arrays 1302a, 1302b, and the two different constant phases are in phase quadrature to each other. For example, the modulation signal at the transmitting side is the clock signal CLK1, in which the phase changes in temporal sequence are 0°, 90°, 180°, and 270°. The demodulation signals at the receiving side are clock signals CLK2, CLK3. The clock signal CLK2 is used to demodulate the incident optical signal IL absorbed by pixel array 1302a, which has a constant phase of 0°. The clock signal CLK3 is used to demodulate the incident optical signal IL absorbed by pixel array 1302b, which has a constant phase of 90°.

Although the embodiments illustrated in FIG. 13A-13E use clock signals with a 50% duty cycle as the modulation and demodulation signals, in other possible implementations, the duty cycle can be different (e.g. 30% duty cycle). In some implementations, sinusoidal wave is used as the modulation and demodulation signals instead of square wave.

Figure 14:
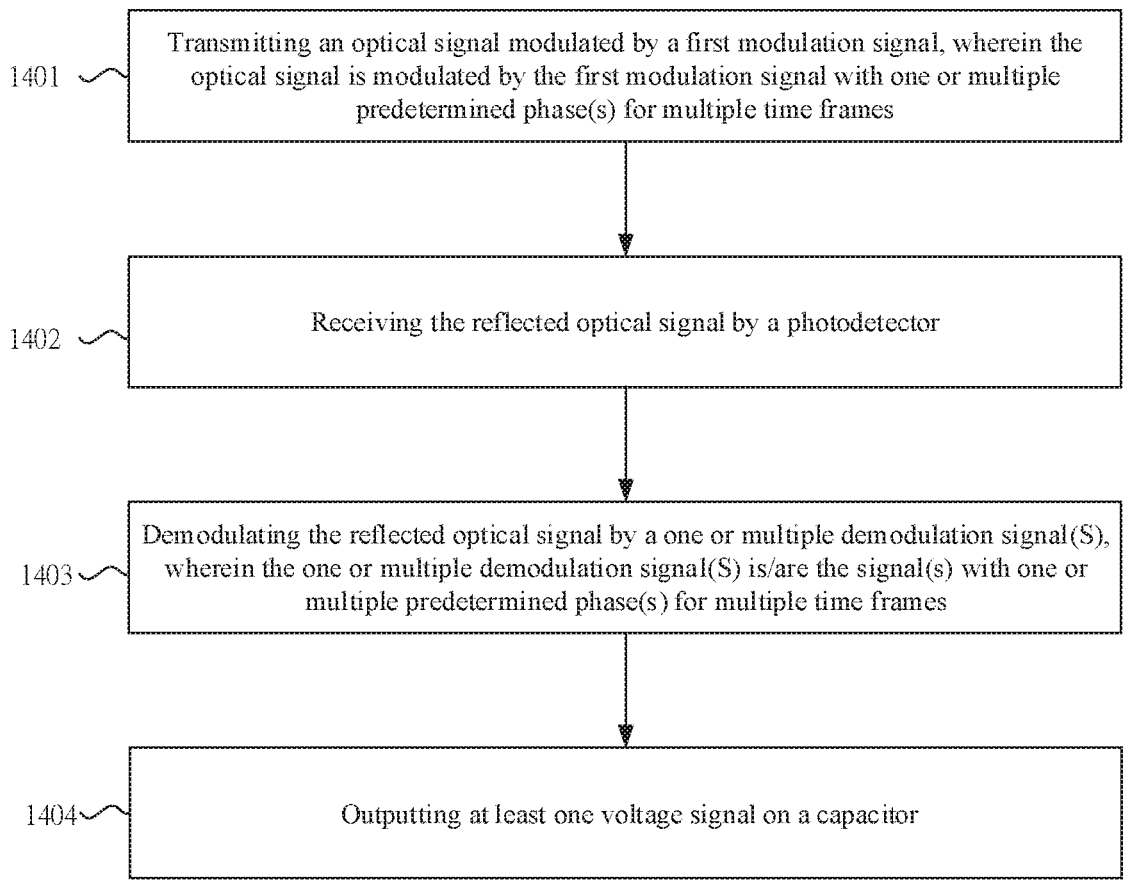
FIG. 14 illustrates a process for using the photo-detecting apparatus using modulation schemes with phase changes, according to some embodiments.

FIG. 14 illustrates a process for using the photo-detecting apparatus using modulation schemes with phase changes, according to some embodiments. Other entities perform some or all of the steps of the process in other embodiments. Likewise, embodiments may include different and/or additional steps, or perform the steps in different orders.

In the embodiment of FIG. 14, the photo-detecting method comprises step 1401: transmitting an optical signal modulated by a first modulation signal, wherein the optical signal is modulated by the first modulation signal with one or multiple predetermined phase(s) for multiple time frames; step 1402: receiving the reflected optical signal by a photodetector; step 1403: demodulating the reflected optical signal by one or multiple demodulation signal(s), wherein the one or multiple demodulation signal(s) is/are the signal(s) with one or multiple predetermined phase(s) for multiple time frames; and step 1404: outputting at least one voltage signal on a capacitor. In this method, the photodetector may use the embodiments mentioned in the present disclosure or its variants.

Figure 15A:
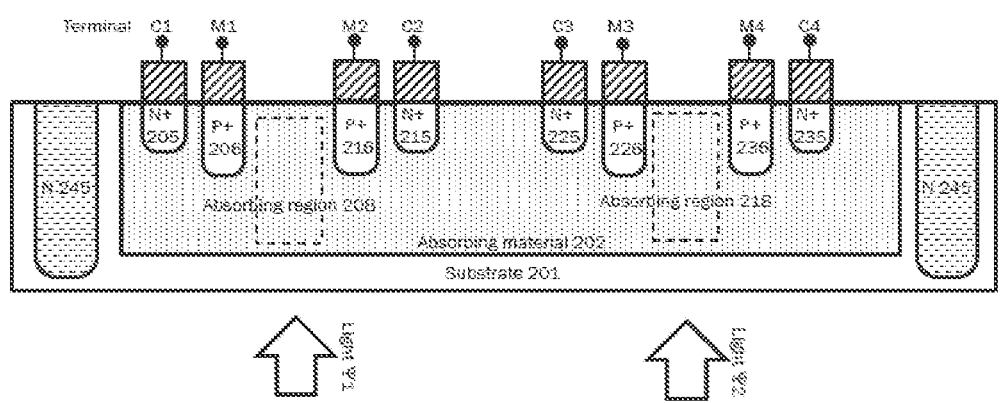
FIG. 15A illustrates a cross-sectional view of a photo-dectecting appparatus, according to some embodiments.

In some embodiments, a pixel isolation region, a pixel isolation region 924 described with reference to FIGS. 9A-E, is elminated in the x-direction, e.g. in a direction that is parallel to a surface of the substrate. By removing the pixel isolation region, the pixel size can be reduced. FIG. 15A illustrates a cross-sectional view of a photo-detecting apparatus, according to some embodiments, of an adjacent pixel structure.

As depicted in FIG. 15A, the photo-detecting apparatus includes a two adjacent pixel structure without isolation in an x-direction that is parallel to the surface of the apparatus. Light signal Ψ1 is focused to an abosrbing region 108, e.g., absorbing region 208 in FIG. 15A, where the generated photocurrent will then flow into all electrodes 205, 206, 216, 215. In other words, photo-generated electrons from the absorption region 208 due to light signal Ψ1 will be collected by N+ terminals 205, 215 as well as N+ terminals 225, 235. In some embodiments, the photo-generated electrons generated in the absorption region 208 due to light Ψ1 are primarily collected by the N+ terminals 205, 215, and secondarily collected by the N+ terminals 225, 235.

Similarly, a Ψ2 light signal is incident on absorbing region 218, where the generated photocurrent will be collected by the N+ terminals 225, 235 and 205, 215. In some embodiments, the photo-generated electrons from the absorption region 218 are primarily collected by the N+0 terminals 225, 235, and secondarily collected by the N+ terminals 205, 215.

In some embodiments, the N+ terminals 215, 225 are biased to provide a depletion region, thereby reducing a number of photo-generated electrons generated in the absorption region 208 due to the Ψ1 light signal that are collected by the N+ terminals 225, 235.

Figure 15B:
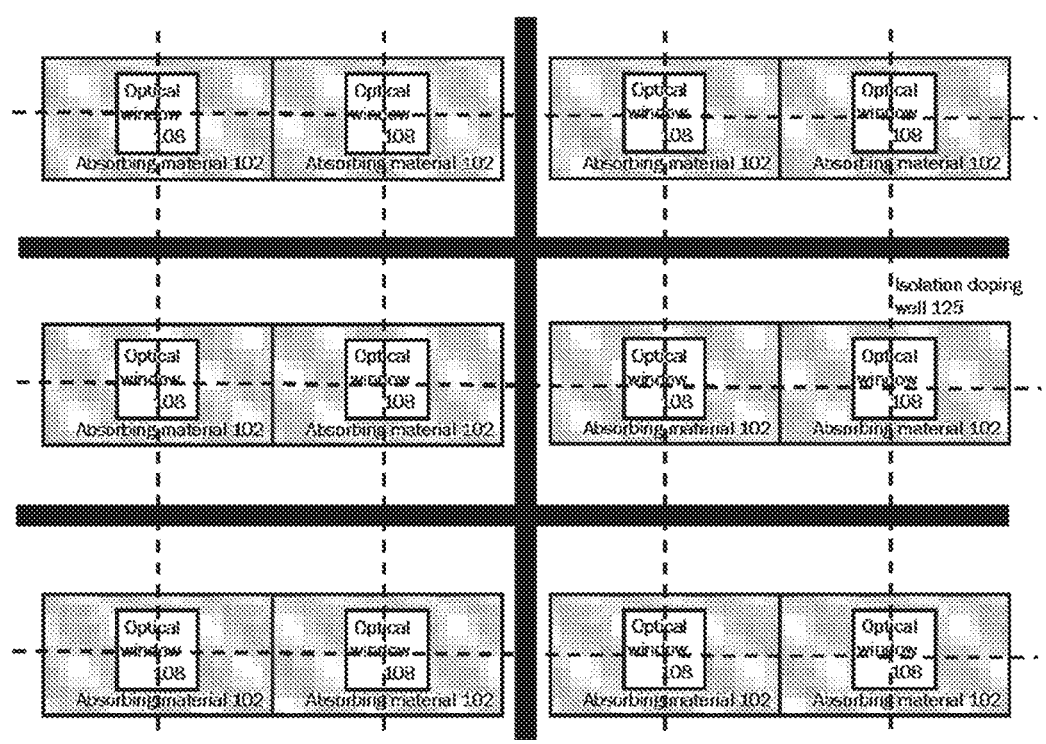
FIG. 15B illustrates a planar view of a photo-detecting apparatus, according to some embodiments.

FIG. 15B illustrates a planar view of a photo-detecting apparatus, according to some embodiments. In the Structure depicted in FIG. 15B, the two pixel example depicted in FIG. 15A is along a horizontal line in the plane of the apparatus.

In some embodiments, the system described above with reference to FIGS. 15A and 15B can be generalized to multiple pixels because the system is mathematically linear. For example, the proposed algorithm can be generalized to multiple pixels (>3 pixels) in a horizontal line.

Figure 15C:
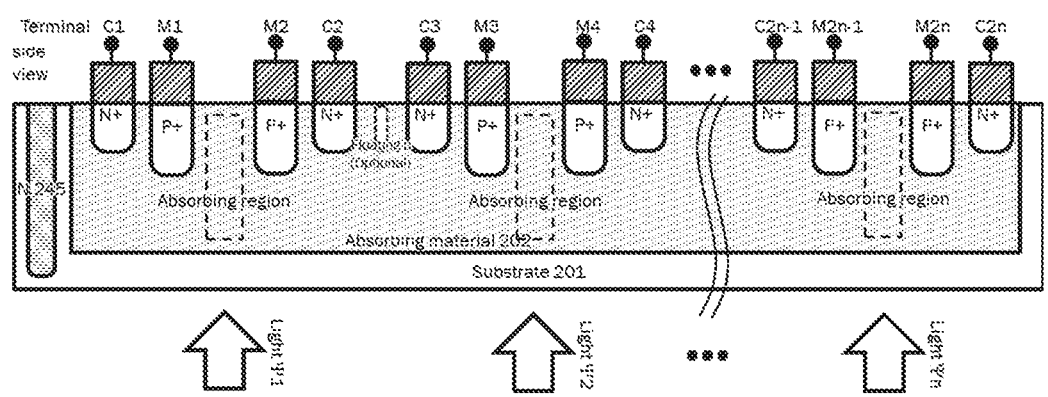
FIG. 15C illustrates a cross-sectional view of a photo-detecting apparatus, according to come embodiments.

FIG. 15C illustrates a cross-sectional view of a photo-detecting apparatus, according to some embodiments. FIG. 15C depicts a structure of n-pixel without isolation between pixels arranged in a line. Light signals, e.g., light signals Ψ1, Ψ2, Ψn, enter the respective absorbing regions via an arrayed window to prevent light that is shining outside the absorbing window from being absorbed. Optionally, in some embodiments, a floating p region may be inserted in the photo-detecting apparatus between C2 and C3 to reduce crosstalk between pixels.

Figure 15D:
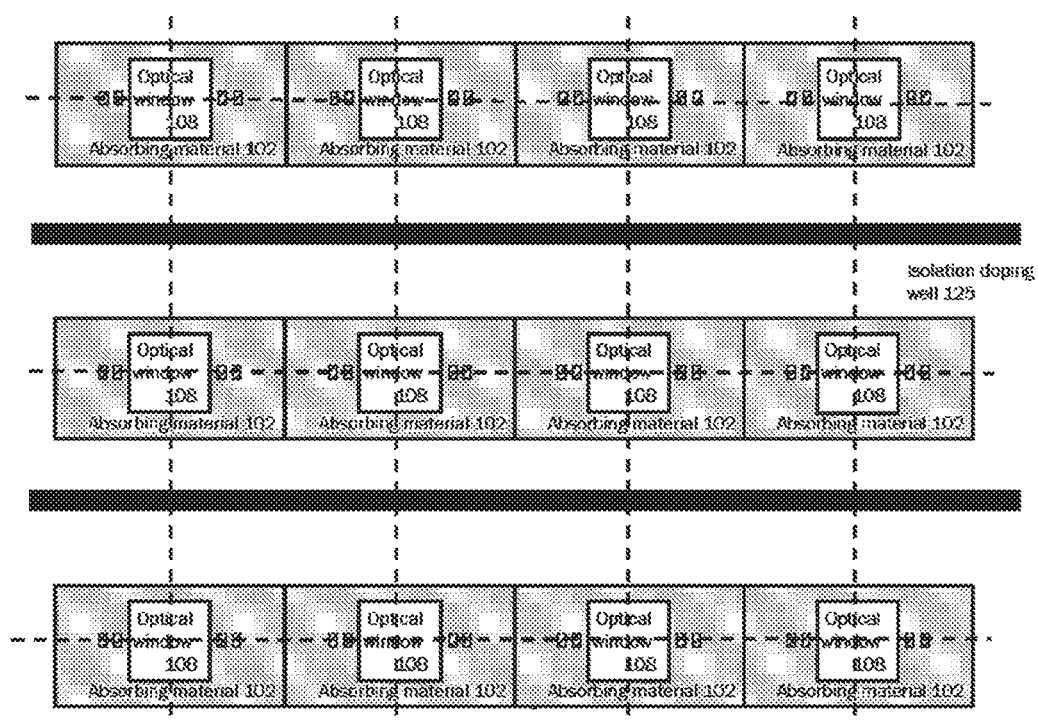
FIG. 15D-15E illustrate planar views of a photo-detecting apparatus, according to some embodiments.
Figure 15E:
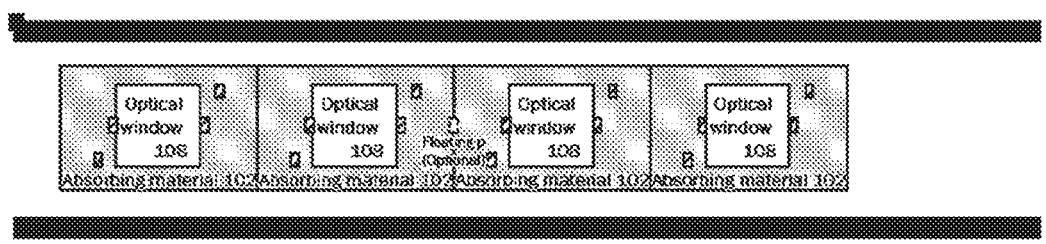

FIGS. 15D-15E illustrate planar views of a photo-detecting apparatus, according to some embodiments. An arrayed layout is shown in FIG. 15D and is an alternative layout to the arrayed layout depicted in FIG. 15B that may reduce more area occupied by the array than the layout shown in FIG. 15B. As depicted in FIG. 15D, the terminals, e.g. C1, M1, C2 from FIG. 15C, are in a same horizontal line.

FIG. 15E is an alternative structure design to FIG. 15D. Here only on line of the array is shown. In this design, the collecting terminals C1 and C2, e.g., terminal C1 and C2 from FIG. 15C, can be shifted in a lateral (y) direction (with respect to the plane of the substrate)and terminals M1 and M2, e.g., terminals M1 and M2 from FIG. 15C, can be moved closer to or into the absorbing region, e.g., closer to or into the optical window 108. This design increases an effective distance between terminals C2 and C3, as compared to FIG. 15D, such that crosstalk between terminals C2 and C3 can be reduced. In some embodiments, the staggered layout of the N+ terminals results in that some of the N+ are not completely blocked by a respective depletion regin and thus the generated photocurrent will be collected by more neighborign pixel terminals.

Additionally, a floating p doping region may be implanted to inhibit n-to-n type crosstalk, as described above with reference to FIG. 15D. As compared to FIG. 15D, the layout depicted in FIG. 15E includes additional space in an x-direction, e.g., parallel to the substrate, to place the floating p region.

Similarly, as described above with the reference to FIGS. 15A, 15B, the apparatuses of FIGS. 15C-15E can be generalized, e.g., using device symmetry assuptions, to an array of pixels including more than 4-pixel units. For example, a full staggered 2n x 2n array can be contemplated without including isolation between pixels. Moreover, device symmetry assumptions can be utilized to calibrate fabrication non-ideality of the array. For example, device shifts or light incident angle tilt between terminals C1 and C2 can be averaged during a modulation scheme, e.g., as described with reference to FIGS. 13A-E, where the alternative phases of 0° and 180° degrees are in phase (e.g., for a square wave). Similarlt, two or n-merged pixels in an n-pixel array can follow a same calibration.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

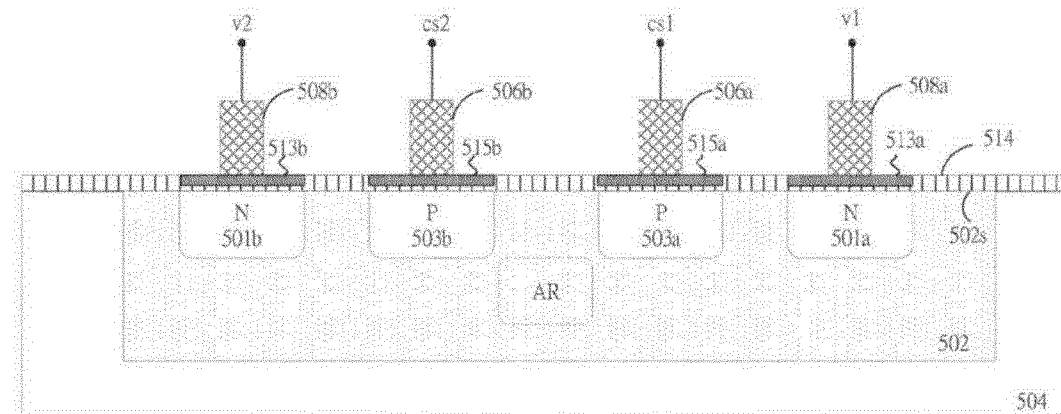

What is claimed is:

1. A photo-detecting apparatus, comprising:
 a semiconductor substrate;
 a first germanium-based light absorption material supported by the semiconductor substrate and configured to absorb a first optical signal having a first wavelength greater than 800 nm;
  a first metal line electrically coupled to a first region of the first germanium-based light absorption material; and
 a second metal line electrically coupled to a second region of the first germanium-based light absorption material,
 a third metal line coupled to a third region of the first germanium-based light absorption material; and
 a fourth metal line coupled to a fourth region of the first germanium-based light absorption material,
 wherein the first region is un-doped or doped with a first type of dopants, the second region is doped with a second type of dopants, and the first metal line is configured to control an amount of a first type of photo-generated carriers generated inside the first germanium-based light absorption material to be collected by the second region; and
 wherein the third region is un-doped or doped with the first type of dopants, and the fourth region is doped with the second type of dopants, and wherein the third metal line is configured to control the amount of the first type of photogenerated carriers generated inside the first germanium-based light absorption material to be collected by the fourth region; and
  wherein a depth of the first region extending from a first surface of the first germanium- based light absorption material is less than a depth of the second region extending from the first surface of the first germanium-based light absorption material.

2. The photo-detecting apparatus of claim 1, wherein a depth of the first region extending from a first surface of the first germanium-based light absorption material is less than a depth of the second region extending from the first surface of the first germanium-based light absorption material.

3. The photo-detecting apparatus of claim 1, comprising a fifth region formed on a second surface opposite to a first surface of the first germanium-based light absorption material in which the first, second, third and fourth regions are formed, wherein the fifth region is doped with the second type of dopants.

4. The photo-detecting apparatus of claim 1, wherein the first germanium-based light absorption material is doped with the second type of dopants.

5. The photo-detecting apparatus of claim 1, wherein the first region doped with the first type of dopants is lightly doped.

6. The photo-detecting apparatus of claim 1, wherein a doping concentration of the first type of dopants is lower than a doping concentration of the second type of dopants.

7. The photo-detecting apparatus of claim 1, comprising a U-shape doped region with the first type of dopants arranged in the semiconductor substrate and next to the first germanium-based light absorption material.

8. The photo-detecting apparatus of claim 1, further comprising a dielectric layer embedded between the first germanium-based light absorption material and the semiconductor substrate.

9. The photo-detecting apparatus of claim 1, further comprising a well region with the second type of dopants partially or fully surrounding the first region.

10. The photo-detecting apparatus of claim 1, further comprising a well region with a first type of dopants partially or fully surrounding the second region.

11. The photo-detecting apparatus of claim 1, further comprising a passivation layer formed on a first surface of the first germanium-based light absorption material.

12. The photo-detecting apparatus of claim 11, comprising a metal plate formed above the passivation layer and arranged at a position being able to reflect the first optical signal.

13. The photo-detecting apparatus of claim 1, comprising an isolation region partially or fully surrounding the first germanium-based light absorption material.

14. The photo-detecting apparatus of claim 1, wherein a first silicide is formed between first metal line and the first germanium-based light absorption material, and wherein a second silicide is formed between the second metal line and the first germanium-based light absorption material.

15. The photo-detecting apparatus of claim 1, comprising:
 a second germanium-based light absorption material supported by the semiconductor substrate, wherein:
  the first germanium-based light absorption material, from a top view, forms a first rectangle with a first length and a first width;
  the second germanium-based light absorption material, from the top view, forms a second rectangle with a second length and a second width; and
  a direction of the first length and a direction of the second length are perpendicular to each other.

16. The photo-detecting apparatus of claim 1, comprising:
 a second germanium-based light absorption material supported by the semiconductor substrate,
 wherein the second germanium-based light absorption material is configured to absorb a second optical signal with a second wavelength, and wherein the second wavelength is different from the first wavelength.

17. The photo-detecting apparatus of claim 1, comprising:
 a second germanium-based light absorption material supported by the semiconductor substrate,
 wherein the second germanium-based light absorption material is configured to absorb a second optical signal, the first optical signal is applied with a first modulation signal, the second optical signal is applied with a second modulation signal, and the first modulation and the second modulation are different.

18. The photo-detecting apparatus of claim 1, comprising:
a laser coupled to a laser driver for transmitting an optical signal,
wherein the optical signal is modulated by a first modulation signal with multiple predetermined phases for multiple time frames, the first optical signal is the optical signal reflected from an object, and the first optical signal, absorbed by the first germanium-based light absorption material, is demodulated by a second modulation signal with a first single predetermined phase for the multiple time frames.

19. The photo-detecting apparatus of claim 18, comprising:
a second germanium-based light absorption material supported by the semiconductor substrate,
wherein the first optical signal, absorbed by the second germanium-based light absorption material, is demodulated by the second modulation signal with a second single predetermined phase for the multiple time frames; and the second single predetermined phase is in phase quadrature to the first single predetermined phase.

* * * * *

UNITED STATES PATENT AND TRADEMARK OFFICE
CERTIFICATE OF CORRECTION

PATENT NO. : 10,777,692 B2
APPLICATION NO. : 16/282881
DATED : September 15, 2020
INVENTOR(S) : Cheng et al.

It is certified that error appears in the above-identified patent and that said Letters Patent is hereby corrected as shown below:

On the Title Page

Column 2, item [57], delete "19 Claims," and insert -- 18 Claims, -- as shown on the attached Title Page, therefor.

In the Claims

Column 21, Line 25, delete Claims 1-19, and insert Claims 1-18 as follows:
-- 1. A photo-detecting apparatus, comprising:
a semiconductor substrate;
a first germanium-based light absorption material supported by the semiconductor substrate and configured to absorb a first optical signal having a first wavelength greater than 800 nm;
    a first metal line electrically coupled to a first region of the first germanium-based light absorption material; and
a second metal line electrically coupled to a second region of the first germanium-based light absorption material,
a third metal line coupled to a third region of the first germanium-based light absorption material; and
a fourth metal line coupled to a fourth region of the first germanium-based light absorption material;
wherein the first region is un-doped or doped with a first type of dopants, the second region is doped with a second type of dopants, and the first metal line is configured to control an amount of a first type of photo-generated carriers generated inside the first germanium-based light absorption material to be collected by the second region; and
wherein the third region is un-doped or doped with the first type of dopants, and the fourth region is doped with the second type of dopants, and wherein the third metal line is configured to control the amount of the first type of photogenerated carriers generated inside the first germanium-based light absorption material to be collected by the fourth region; and
    wherein a depth of the first region extending from a first surface of the first germanium-based light absorption material is less than a depth of the second region extending from the first surface of the first germanium-based light absorption material.

Signed and Sealed this
Thirty-first Day of January, 2023

*Katherine Kelly Vidal*

Katherine Kelly Vidal
*Director of the United States Patent and Trademark Office*

2. The photo-detecting apparatus of claim 1, comprising a fifth region formed on a second surface opposite to a first surface of the first germanium-based light absorption material in which the first, second, third and fourth regions are formed, wherein the fifth region is doped with the second type of dopants.

3. The photo-detecting apparatus of claim 1, wherein the first germanium-based light absorption material is doped with the second type of dopants.

4. The photo-detecting apparatus of claim 1, wherein the first region doped with the first type of dopants is lightly doped.

5. The photo-detecting apparatus of claim 1, wherein a doping concentration of the first type of dopants is lower than a doping concentration of the second type of dopants.

6. The photo-detecting apparatus of claim 1, comprising a U-shape doped region with the first type of dopants arranged in the semiconductor substrate and next to the first germanium-based light absorption material.

7. The photo-detecting apparatus of claim 1, further comprising a dielectric layer embedded between the first germanium-based light absorption material and the semiconductor substrate.

8. The photo-detecting apparatus of claim 1, further comprising a well region with the second type of dopants partially or fully surrounding the first region.

9. The photo-detecting apparatus of claim 1, further comprising a well region with a first type of dopants partially or fully surrounding the second region.

10. The photo-detecting apparatus of claim 1, further comprising a passivation layer formed on a first surface of the first germanium-based light absorption material.

11. The photo-detecting apparatus of claim 10, comprising a metal plate formed above the passivation layer and arranged at a position being able to reflect the first optical signal.

12. The photo-detecting apparatus of claim 1, comprising an isolation region partially or fully surrounding the first germanium-based light absorption material.

13. The photo-detecting apparatus of claim 1, wherein a first silicide is formed between first metal line and the first germanium-based light absorption material, and wherein a second silicide is formed between the second metal line and the first germanium-based light absorption material.

14. The photo-detecting apparatus of claim 1, comprising:
a second germanium-based light absorption material supported by the semiconductor substrate, wherein:
the first germanium-based light absorption material, from a top view, forms a first rectangle with a first length and a first width;

the second germanium-based light absorption material, from the top view, forms a second rectangle with a second length and a second width; and
a direction of the first length and a direction of the second length are perpendicular to each other.

15. The photo-detecting apparatus of claim 1, comprising:
a second germanium-based light absorption material supported by the semiconductor substrate, wherein the second germanium-based light absorption material is configured to absorb a second optical signal with a second wavelength, and wherein the second wavelength is different from the first wavelength.

16. The photo-detecting apparatus of claim 1, comprising:
a second germanium-based light absorption material supported by the semiconductor substrate, wherein the second germanium-based light absorption material is configured to absorb a second optical signal, the first optical signal is applied with a first modulation signal, the second optical signal is applied with a second modulation signal, and the first modulation and the second modulation are different.

17. The photo-detecting apparatus of claim 1, comprising:
a laser coupled to a laser driver for transmitting an optical signal,
wherein the optical signal is modulated by a first modulation signal with multiple predetermined phases for multiple time frames, the first optical signal is the optical signal reflected from an object, and the first optical signal, absorbed by the first germanium-based light absorption material, is demodulated by a second modulation signal with a first single predetermined phase for the multiple time frames.

18. The photo-detecting apparatus of claim 17, comprising:
a second germanium-based light absorption material supported by the semiconductor substrate, wherein the first optical signal, absorbed by the second germanium-based light absorption material, is demodulated by the second modulation signal with a second single predetermined phase for the multiple time frames; and the second single predetermined phase is in phase quadrature to the first single predetermined phase. --.

CERTIFICATE OF CORRECTION (continued)

(12) United States Patent
Cheng et al.

(10) Patent No.: US 10,777,692 B2
(45) Date of Patent: Sep. 15, 2020

(54) PHOTO-DETECTING APPARATUS AND PHOTO-DETECTING METHOD THEREOF

(71) Applicant: Artilux, Inc., Menlo Park, CA (US)

(72) Inventors: Szu-Lin Cheng, Hsinchu (TW); Chien-Yu Chen, Zhubei (TW); Shu-Lu Chen, Zhubei (TW); Yun-Chung Na, Hsinchu (TW); Ming-Jay Yang, Zhubei (TW); Han-Din Liu, Sunnyvale, CA (US); Che-Fu Liang, Zhubei (TW)

(73) Assignee: Artilux, Inc., Menlo Park, CA (US)

(*) Notice: Subject to any disclaimer, the term of this patent is extended or adjusted under 35 U.S.C. 154(b) by 0 days.

(21) Appl. No.: 16/282,881

(22) Filed: Feb. 22, 2019

(65) Prior Publication Data
US 2019/0267498 A1   Aug. 29, 2019

Related U.S. Application Data

(60) Provisional application No. 62/776,995, filed on Dec. 7, 2018, provisional application No. 62/770,196, filed (Continued)

(51) Int. Cl.
*H01L 31/02* (2006.01)
*H01L 31/0352* (2006.01)
(Continued)

(52) U.S. Cl.
CPC .... *H01L 31/02024* (2013.01); *H01L 31/0284* (2013.01); *H01L 31/035254* (2013.01); (Continued)

(58) Field of Classification Search
CPC ......... H01L 31/0284; H01L 31/035254; H01L 27/15; H01L 31/103; H01L 31/108; (Continued)

(56) References Cited

U.S. PATENT DOCUMENTS 3,621,466 A  11/1971  Toshio
4,341,918 A   7/1982  Evans, Jr. et al.
(Continued)

FOREIGN PATENT DOCUMENTS

EP   2224319   9/2010
EP   2330637   6/2011
(Continued)

OTHER PUBLICATIONS

PCT International Preliminary Report on Patentability in International Appln. No. PCT/US2018/020262, dated Sep. 3, 2019, 11 pages.
(Continued)

*Primary Examiner* — Fernando L Toledo
*Assistant Examiner* — Adam S Bowen
(74) *Attorney, Agent, or Firm* — Fish & Richardson P.C.

(57) ABSTRACT

A photo-detecting apparatus includes a semiconductor substrate. A first germanium-based light absorption material is supported by the semiconductor substrate and configured to absorb a first optical signal having a first wavelength greater than 800 nm. A first metal line is electrically coupled to a first region of the first germanium-based light absorption material. A second metal line is electrically coupled to a second region of the first germanium-based light absorption material. The first region is un-doped or doped with a first type of dopants. The second region is doped with a second type of dopants. The first metal line is configured to control an amount of a first type of photo-generated carriers generated inside the first germanium-based light absorption material to be collected by the second region.

18 Claims, 57 Drawing Sheets